United States Patent
Jung et al.

(10) Patent No.: US 9,478,753 B2
(45) Date of Patent: Oct. 25, 2016

(54) COMPOUND FOR ORGANIC OPTOELECTRONIC DEVICE, ORGANIC LIGHT EMITTING DIODE INCLUDING THE SAME, AND DISPLAY DEVICE INCLUDING THE LIGHT EMITTING DIODE

(71) Applicants: Sung-Hyun Jung, Uiwang-si (KR); Dal-Ho Huh, Uiwang-si (KR); Dong-Wan Ryu, Uiwang-si (KR); Kyoung-Mi Lee, Uiwang-si (KR); Eui-Su Kang, Uiwang-si (KR); Mi-Young Chae, Uiwang-si (KR)

(72) Inventors: Sung-Hyun Jung, Uiwang-si (KR); Dal-Ho Huh, Uiwang-si (KR); Dong-Wan Ryu, Uiwang-si (KR); Kyoung-Mi Lee, Uiwang-si (KR); Eui-Su Kang, Uiwang-si (KR); Mi-Young Chae, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 372 days.

(21) Appl. No.: 14/072,871

(22) Filed: Nov. 6, 2013

(65) Prior Publication Data
US 2014/0070199 A1 Mar. 13, 2014

Related U.S. Application Data

(62) Division of application No. 13/212,484, filed on Aug. 18, 2011, now abandoned.

(30) Foreign Application Priority Data

Aug. 18, 2010 (KR) .................. 10-2010-0079778
Dec. 20, 2010 (KR) .................. 10-2010-0131038

(51) Int. Cl.
H01L 51/00 (2006.01)
H01L 51/50 (2006.01)
C09B 57/00 (2006.01)

(52) U.S. Cl.
CPC ............ H01L 51/006 (2013.01); C09B 57/00 (2013.01); C09B 57/008 (2013.01);
(Continued)

(58) Field of Classification Search
None
See application file for complete search history.

(56) References Cited

U.S. PATENT DOCUMENTS 8,106,391 B2 1/2012 Endo et al.
2005/0221124 A1 10/2005 Hwang et al.
(Continued)

FOREIGN PATENT DOCUMENTS

CN 1702065 A 11/2005
CN 101083308 A 12/2007
(Continued)

OTHER PUBLICATIONS

EP 11 17 7750—Extended EP Search Report issued Mar. 6, 2013.
(Continued)

*Primary Examiner* — J. L. Yang
(74) *Attorney, Agent, or Firm* — Lee & Morse, P.C.

(57) ABSTRACT

A compound for an organic optoelectronic device, an organic light emitting diode, and a display device including the organic light emitting diode, the compound being represented by the following Chemical Formula 1:

[Chemical Formula 1]

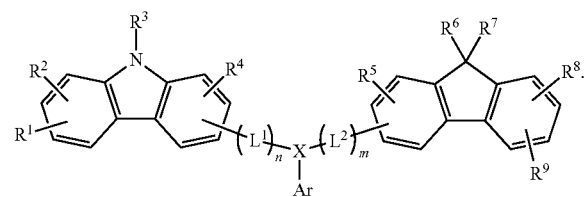

16 Claims, 5 Drawing Sheets

(52) U.S. Cl.
CPC .......... *H01L 51/0061* (2013.01); *H01L 51/50* (2013.01); *H01L 51/5048* (2013.01); *H01L 51/0054* (2013.01); *H01L 51/0072* (2013.01); *H01L 51/0073* (2013.01); *H01L 51/0074* (2013.01); *H01L 2251/308* (2013.01); *Y02E 10/549* (2013.01)

(56) References Cited

U.S. PATENT DOCUMENTS

| | | |
|---|---|---|
| 2006/0020136 A1 | 1/2006 | Hwang et al. |
| 2007/0231503 A1 | 10/2007 | Hwang et al. |
| 2008/0093988 A1* | 4/2008 | Tobise ............... H01L 51/5016 313/504 |
| 2008/0124572 A1 | 5/2008 | Mizuki et al. |
| 2010/0219404 A1 | 9/2010 | Endo et al. |
| 2011/0127495 A1 | 6/2011 | Hong et al. |
| 2012/0074395 A1* | 3/2012 | Yabunouchi ......... G07C 211/54 257/40 |
| 2013/0087776 A1 | 4/2013 | Lee et al. |

FOREIGN PATENT DOCUMENTS

| | | | |
|---|---|---|---|
| CN | 101535256 A | 9/2009 | |
| EP | 1 862 524 A1 | 12/2007 | |
| EP | 2 202 818 A1 | 6/2010 | |
| JP | 2004-345960 A | 12/2004 | |
| KR | 10-2005-0097670 A | 10/2005 | |
| KR | 10-0573137 B1 | 4/2006 | |
| KR | 10 2007-0114562 A | 12/2007 | |
| KR | 10-0846586 B | 7/2008 | |
| KR | 10-2009-0035729 A | 4/2009 | |
| KR | 10 2010-0070350 A | 6/2010 | |
| WO | WO 2009/061145 A1 | 5/2009 | |
| WO | WO 2010/114017 A1 * | 10/2010 | ............. H01L 51/50 |

OTHER PUBLICATIONS

Chinese Search Report and Action—Jul. 2, 2013.
USPTO Action mailed Jun. 11, 2014, in U.S. Appl. No. 13/691,872, wherein claims were provisionally rejected on the ground of nonstatutory double petenting over claimes of the captioned application.

* cited by examiner

COMPOUND FOR ORGANIC OPTOELECTRONIC DEVICE, ORGANIC LIGHT EMITTING DIODE INCLUDING THE SAME, AND DISPLAY DEVICE INCLUDING THE LIGHT EMITTING DIODE

CROSS REFERENCE TO RELATED APPLICATION

This is a divisional application based on pending application Ser. No. 13/212,484, filed Aug. 18, 2011, the entire contents of which is hereby incorporated by reference.

BACKGROUND

1. Field

Embodiments relate to a compound for an organic optoelectronic device, an organic light emitting diode including the same, and a display device including the light emitting diode.

2. Description of the Related Art

An organic optoelectronic device is, in a broad sense, a device for transforming photo-energy to electrical energy or a device for transforming electrical energy to photo-energy conversely.

An organic optoelectronic device may be classified as follows in accordance with its driving principles. One type of organic optoelectronic device is an electronic device driven as follows: excitons are generated in an organic material layer by photons introduced from an external light source to a device; the excitons are separated into electrons and holes; and the electrons and holes are respectively transferred to different electrodes and used as a current source (a voltage source).

Another type of organic optoelectronic device is an electronic device driven as follows: a voltage or a current is applied to at least two electrodes to inject holes and/or electrons into an organic material semiconductor positioned at an interface of the electrodes, and the device is driven by the injected electrons and holes.

For example, the organic optoelectronic device may include an organic light emitting diode (OLED), an organic solar cell, an organic photo-conductor drum, an organic transistor, an organic memory device, and the like. and may include a hole injecting or transporting material, an electron injecting or transporting material, or a light emitting material.

The organic light emitting diode (OLED) has recently drawn attention due to an increase in demand for a flat panel display. In general, organic light emission refers to transformation of electrical energy to photo-energy.

SUMMARY

Embodiments are directed to a compound for an organic optoelectronic device, an organic light emitting diode including the same, and a display device including the light emitting diode.

The embodiments may be realized by providing a compound for an organic optoelectronic device, the compound being represented by the following Chemical Formula 1:

[Chemical Formula 1]

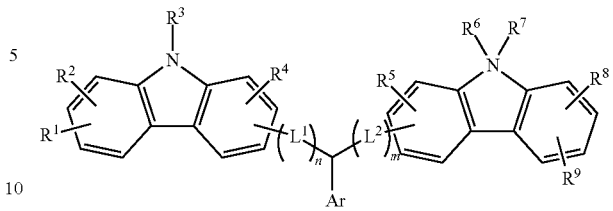

wherein, in Chemical Formula 1, Ar is a substituted or unsubstituted triphenylenyl group; a substituted or unsubstituted biphenylyl group; a substituted or unsubstituted dibenzofuranyl group; or a substituted or unsubstituted dibenzothiophenyl group, X is N, B, or P, $L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group or a substituted or unsubstituted C2 to C30 heteroarylene group, n and m are each independently integers of 0 to about 3, and $R^1$ to $R^9$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

The compound represented by Chemical Formula 1 may be represented by the following Chemical Formula 2:

[Chemical Formula 2]

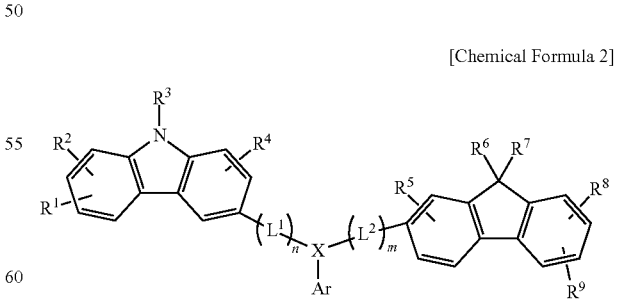

wherein, in Chemical Formula 2, Ar is a substituted or unsubstituted triphenylenyl group; a substituted or unsubstituted biphenylyl group; a substituted or unsubstituted dibenzofuranyl group; or a substituted or unsubstituted dibenzothiophenyl group, X is N, B, or P, $L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m are each independently integers of 0 to about 3, and $R^1$ to $R^9$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

X may be N.

The compound represented by Chemical Formula 1 may be represented by the following Chemical Formula 3:

[Chemical Formula 3]

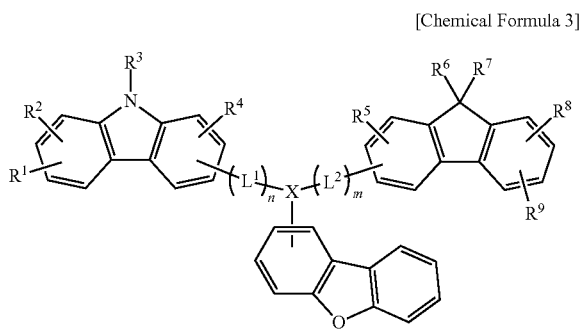

wherein, in Chemical Formula 3, X is N, B, or P, $L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m each independently integers of 0 to about 3, and $R^1$ to $R^9$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

The compound represented by Chemical Formula 1 is represented by the following Chemical Formula 4:

[Chemical Formula 4]

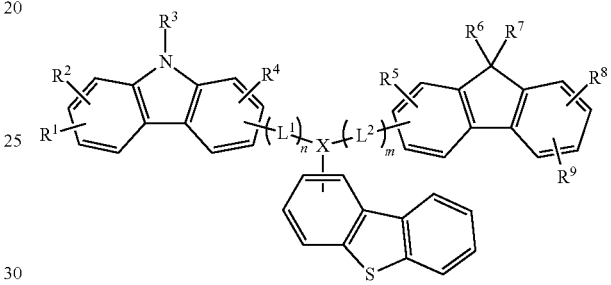

wherein, in Chemical Formula 4, X is N, B, or P, $L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m are each independently integers of 0 to about 3, and $R^1$ to $R^9$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

The compound represented by Chemical Formula 1 may be represented by the following Chemical Formula 5:

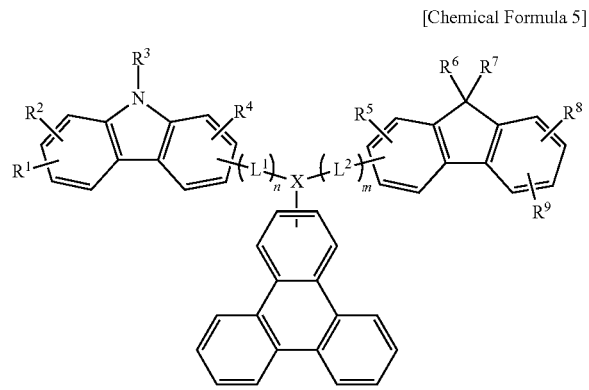

[Chemical Formula 5]

The compound represented by Chemical Formula 1 may be represented by the following Chemical Formula 6:

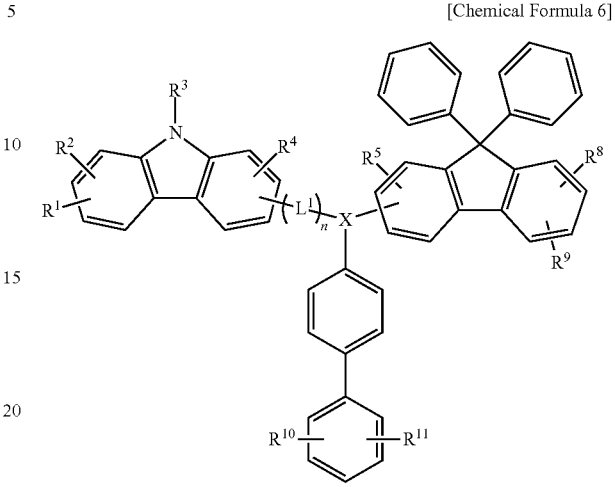

[Chemical Formula 6]

wherein, in Chemical Formula 5, X is N, B, or P, $L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m are each independently integers of 0 to about 3, and $R^1$ to $R^9$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

wherein, in Chemical Formula 6, X is N, B, or P, $L^1$ is a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n is an integer of 0 to about 3, and $R^1$ to $R^5$ and $R^8$ to $R^{11}$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

The compound represented by Chemical Formula 1 may be represented by the following Chemical Formula A-1, A-10, A-19, A-28, A-37, A-46, A-55, A-56, A-61, A-66, A-67, A-76, A-77, A-86, or A-87:

A-1
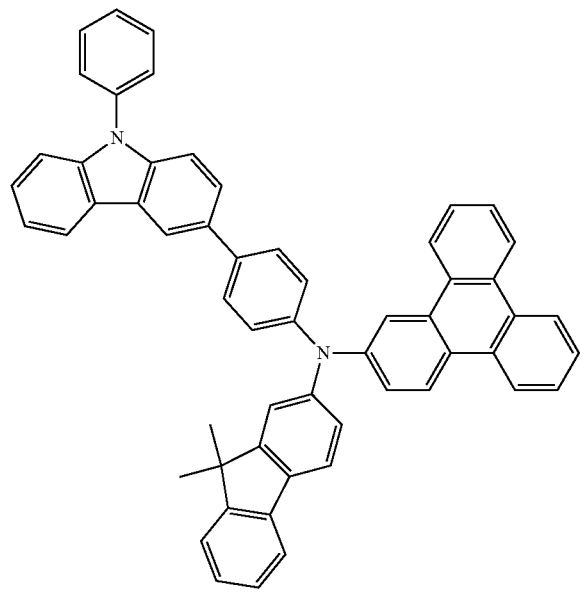
A-19
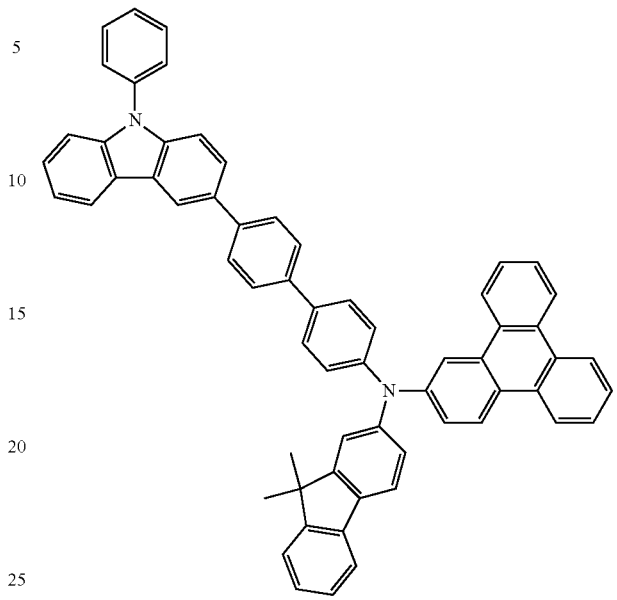
A-10
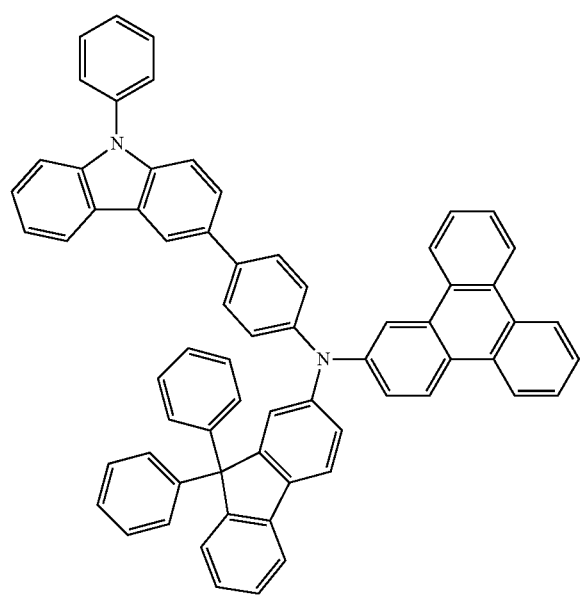
A-28
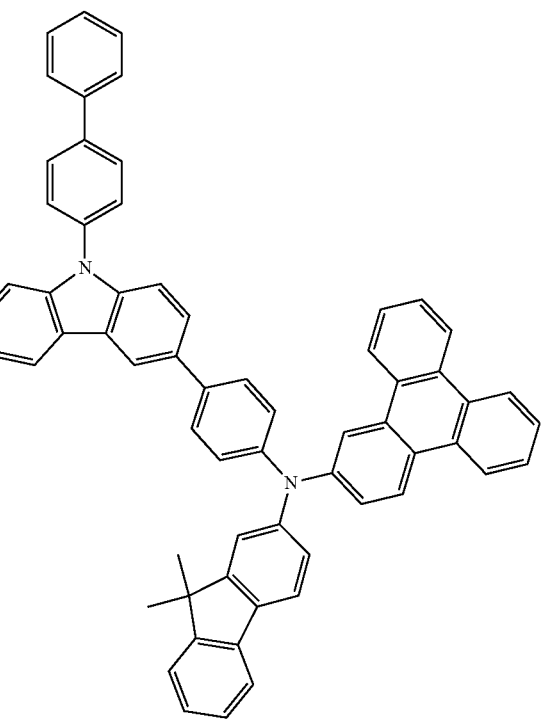

A-37
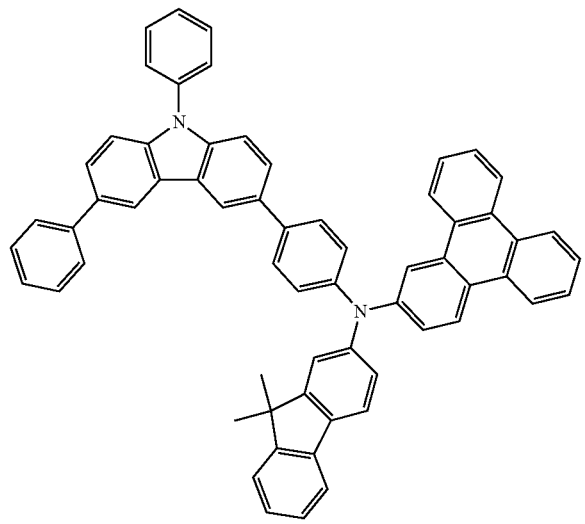
A-56
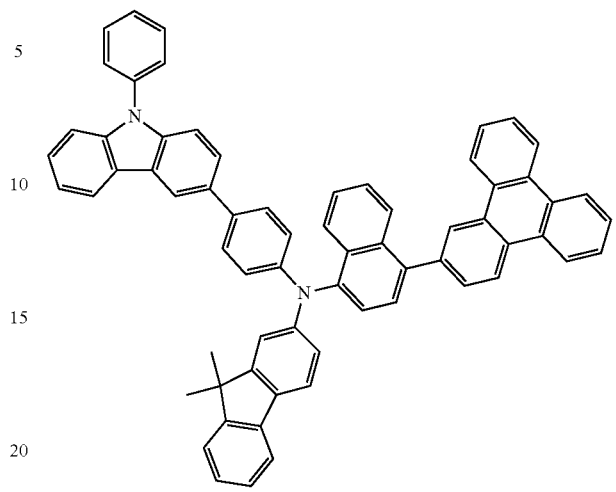
A-46
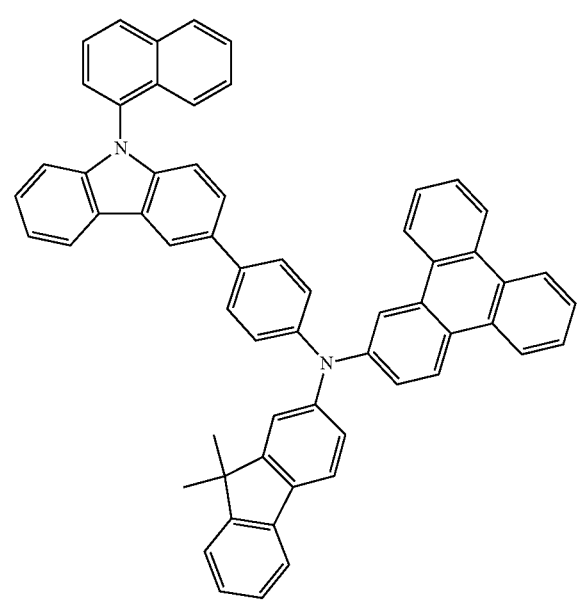
A-61
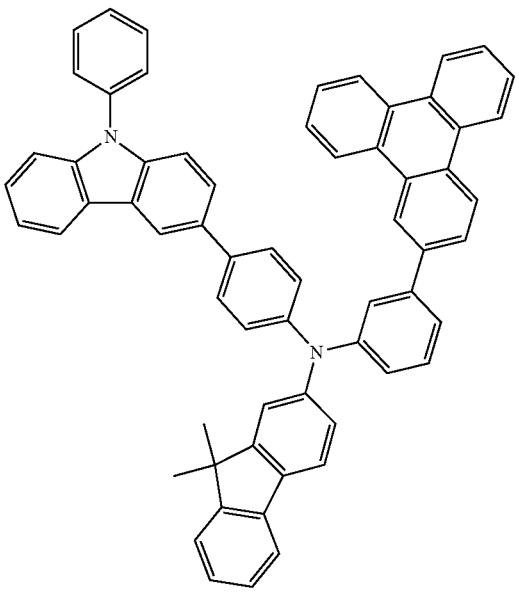
A-55
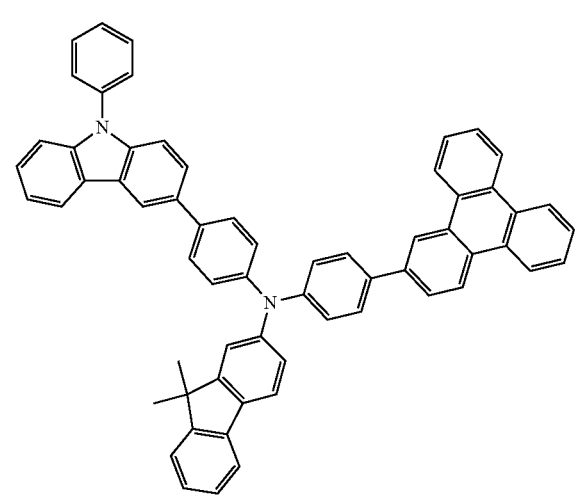

A-66
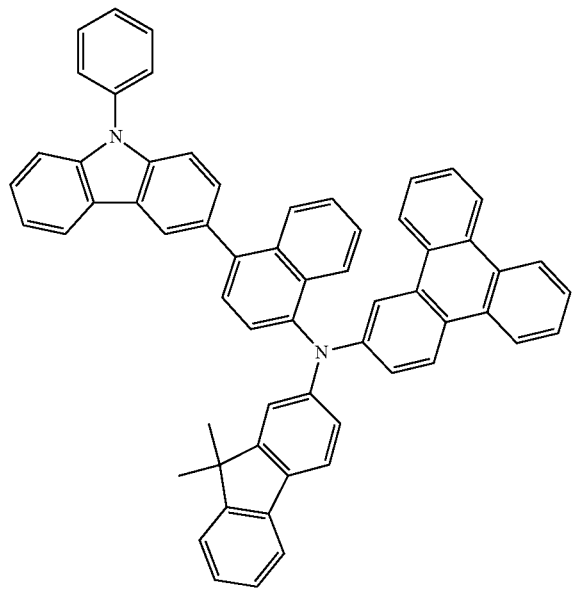
A-67
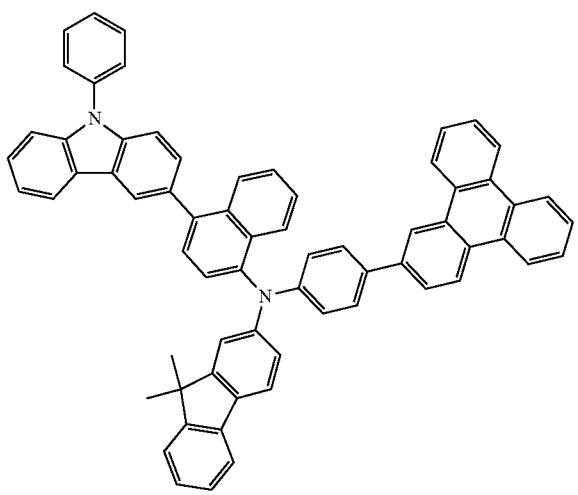
A-76
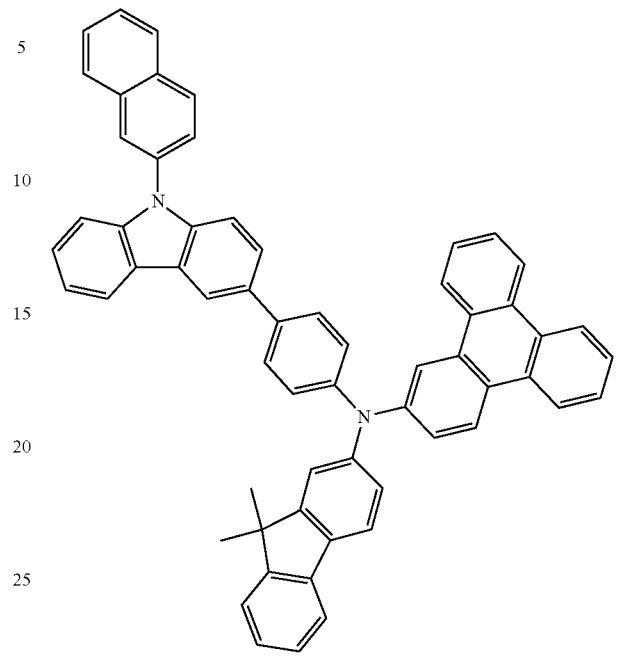
A-77
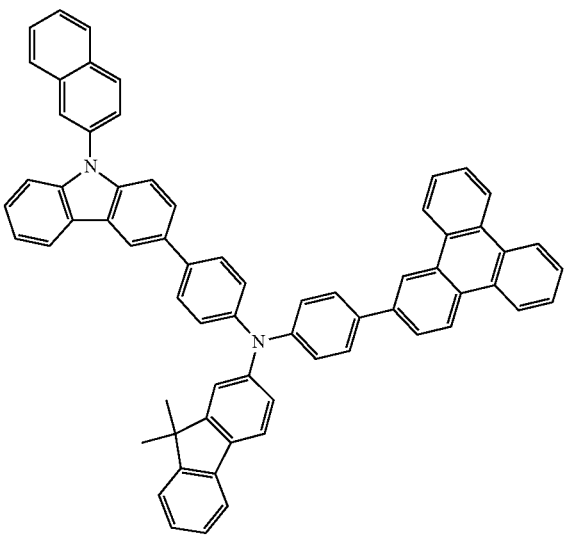

-continued
A-86
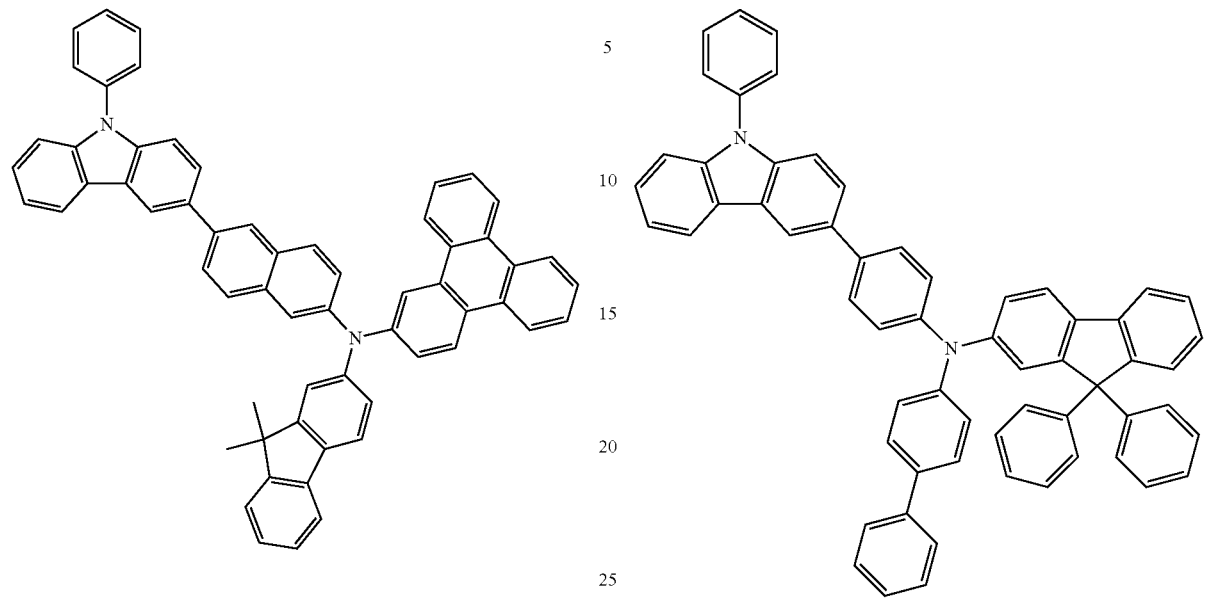
[Chemical Formula B-1]
A-87
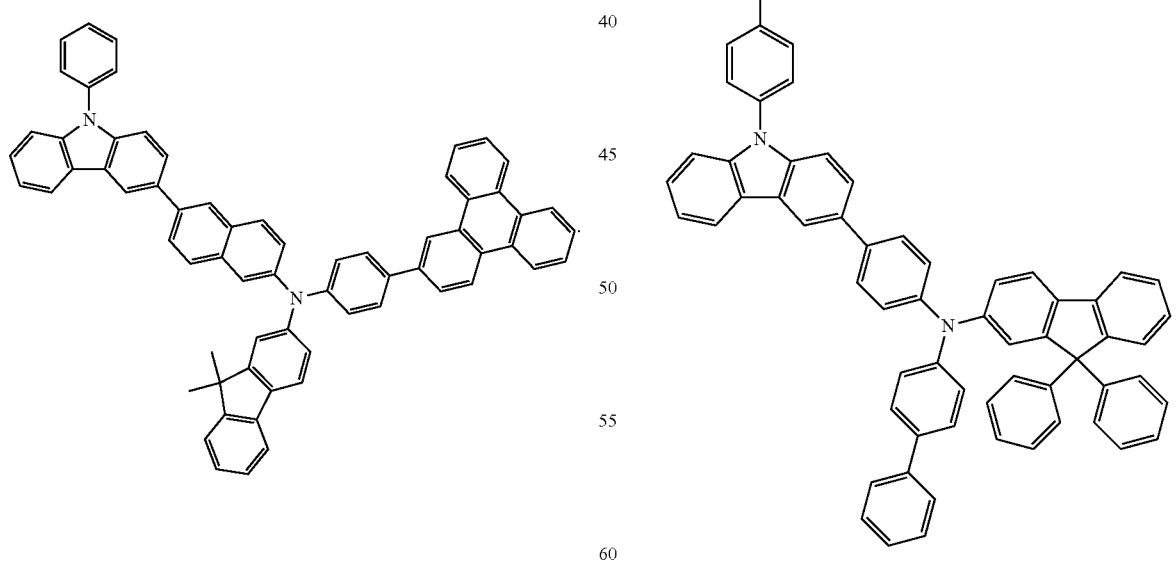
[Chemical Formula B-2]
The compound represented by Chemical Formula 1 may be represented by one of the following Chemical Formulae B-1 to B-6:

-continued
[Chemical Formula B-3]
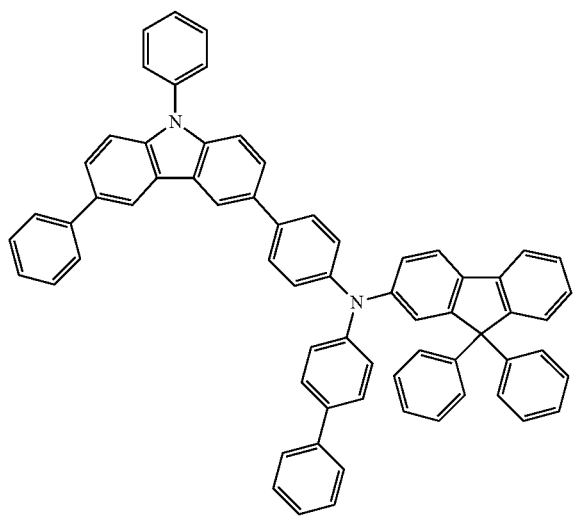
[Chemical Formula B-5]
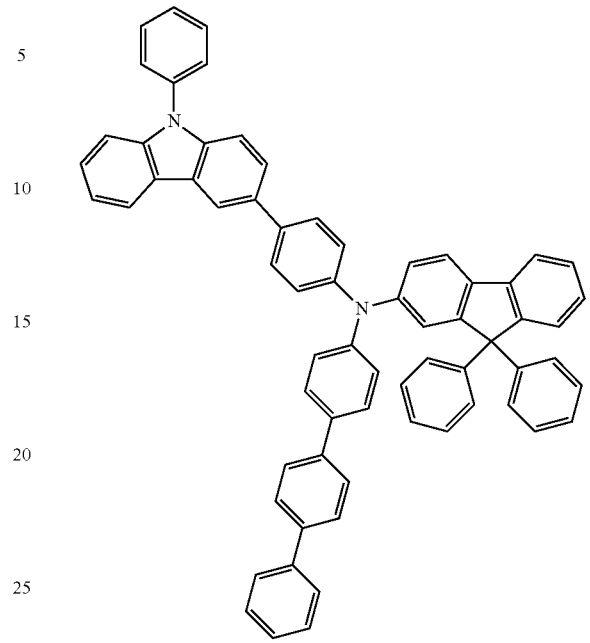
[Chemical Formula B-4]
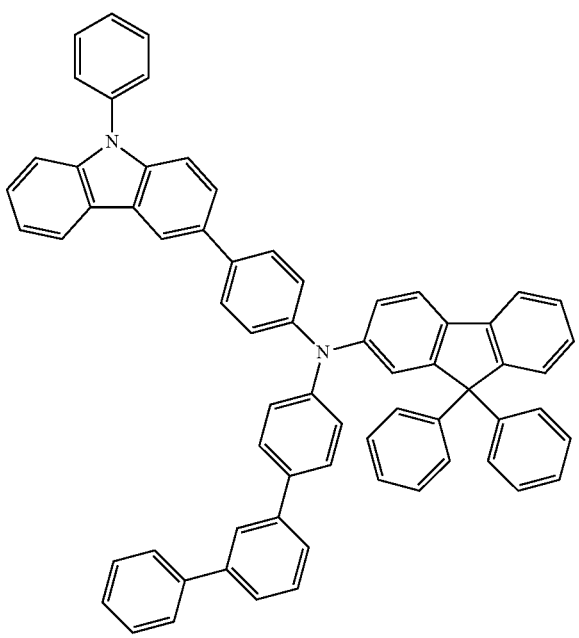
[Chemical Formula B-6]
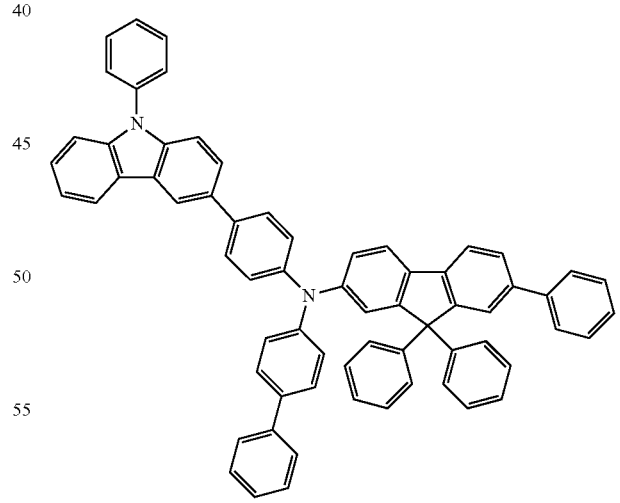
The compound represented by Chemical Formula 1 is represented by the following Chemical Formula A-2, A-4, A-6, A-8, A-11, A-13, A-15, A-17, A-20, A-22, A-24, A-26, A-29, A-31, A-33, A-35, A-38, A-40, A-42, A-44, A-47, A-49, A-51, A-53, A-57, A-59, A-62, A-64, A-69, A-71, A-72, A-74, A-79, A-81, A-82, A-84, A-89, A-91, A-92, or A-94.

A-2
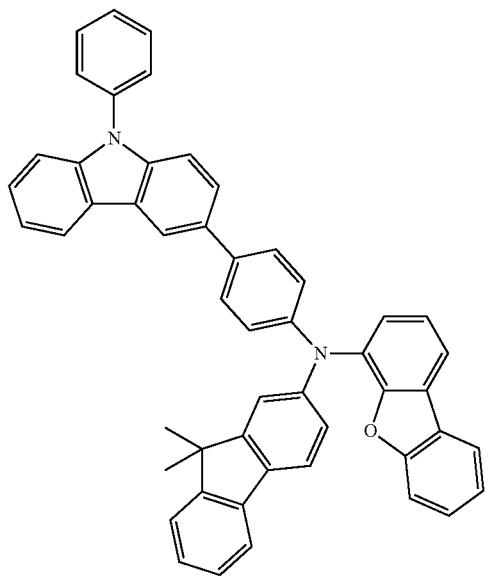
A-6
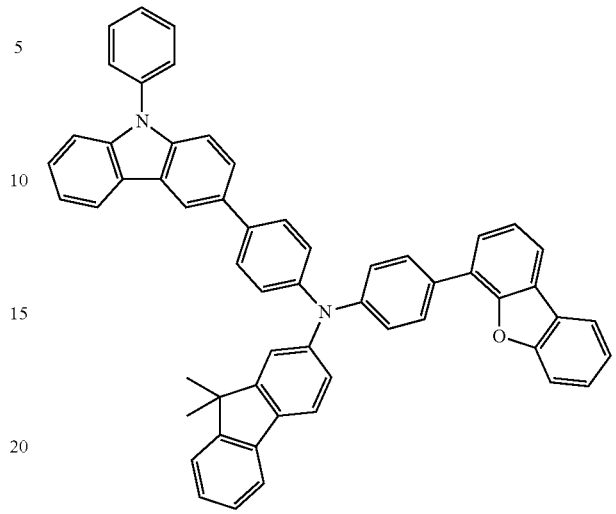
A-8
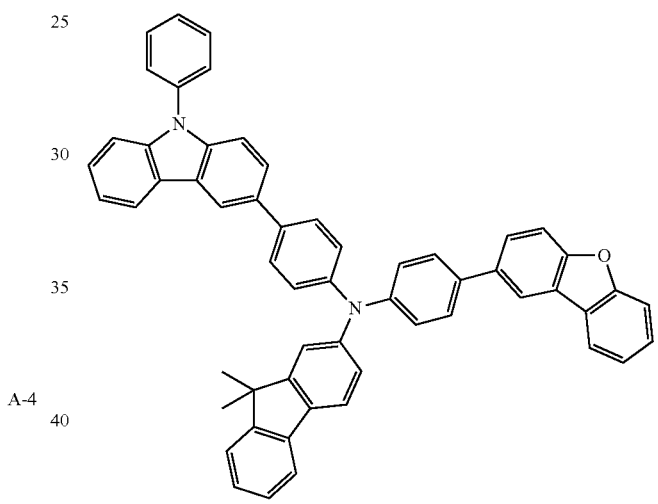
A-4
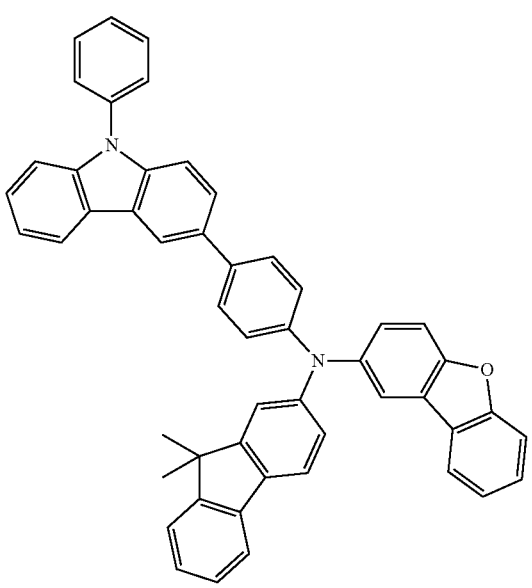
A-11
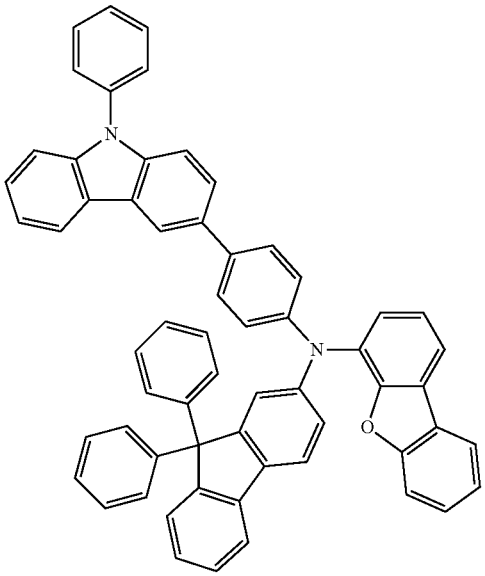

A-13
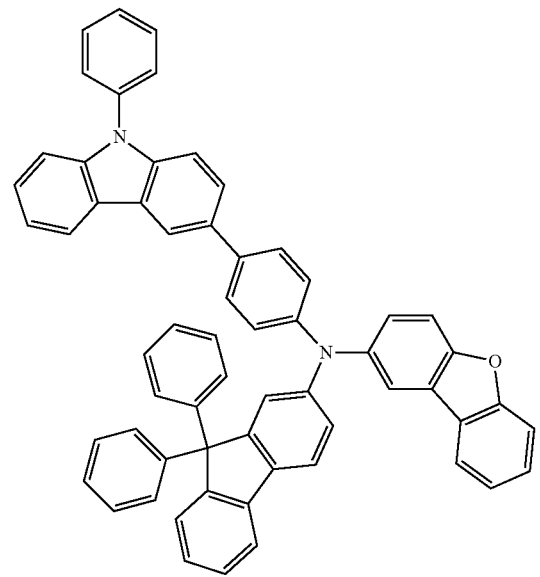
A-15
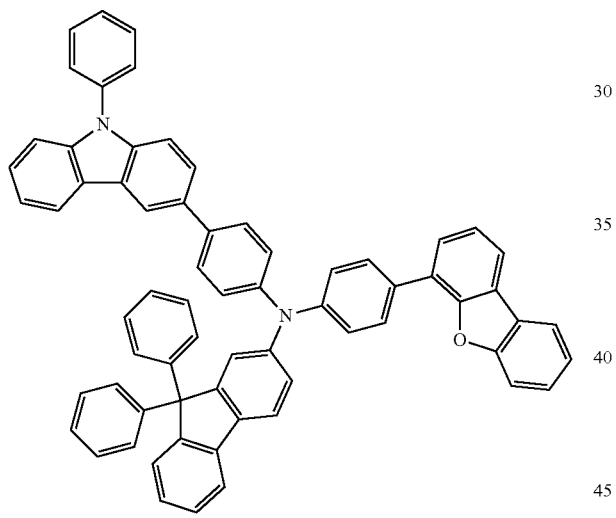
A-17
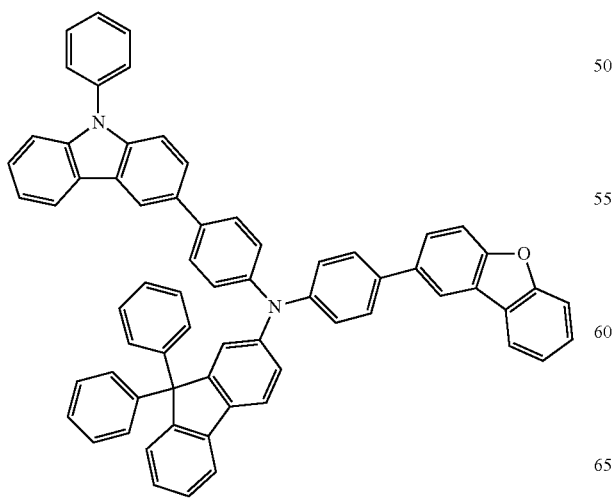
A-20
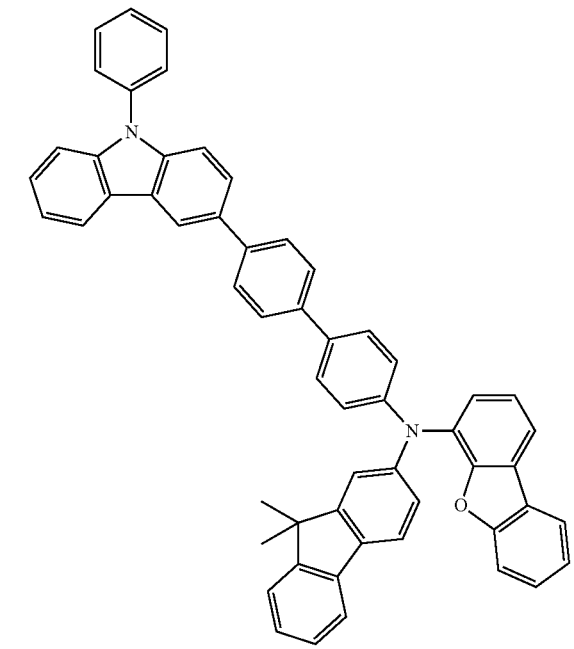
A-22
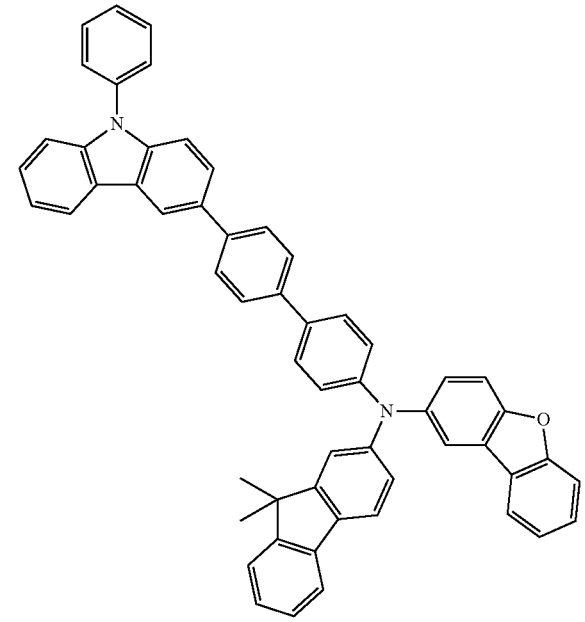

-continued
A-24
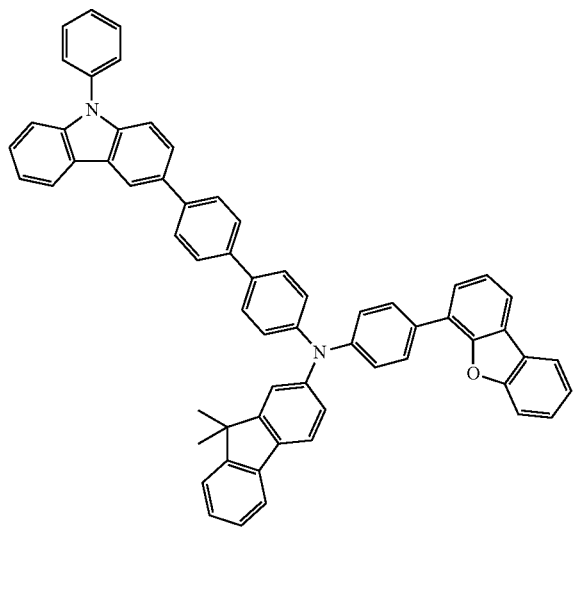
A-29
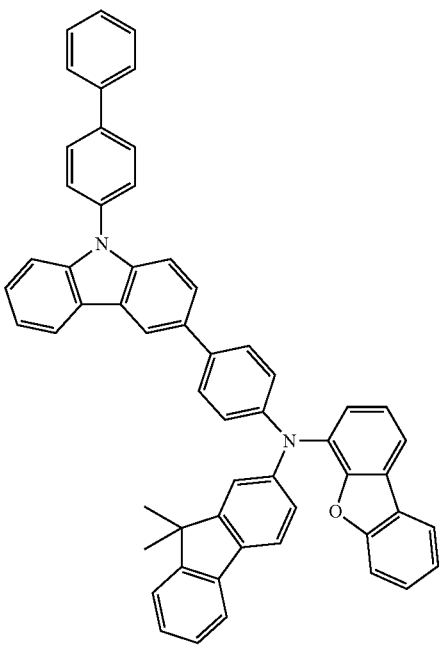
A-26
A-31
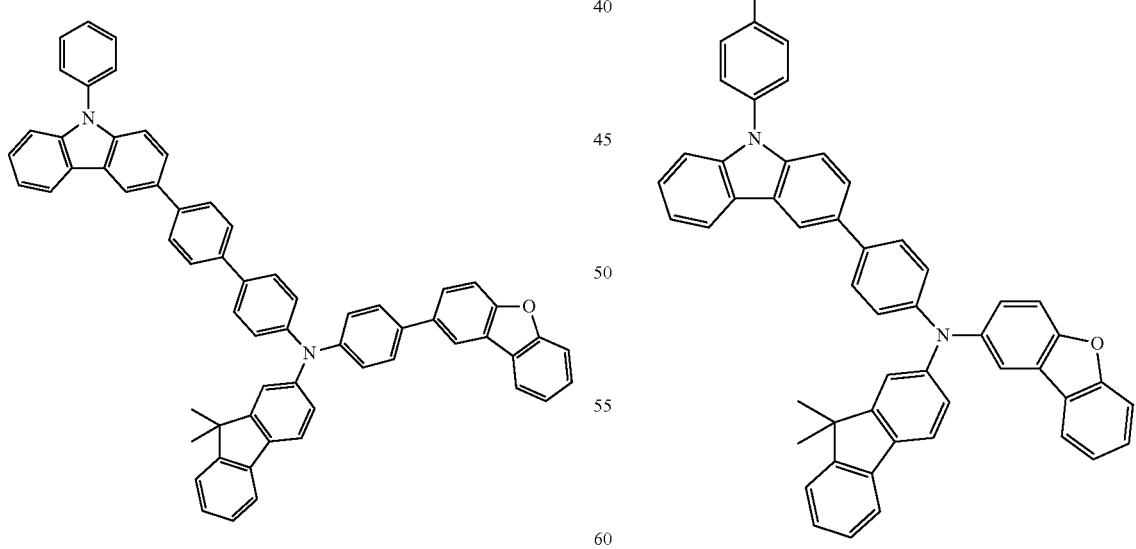

A-33
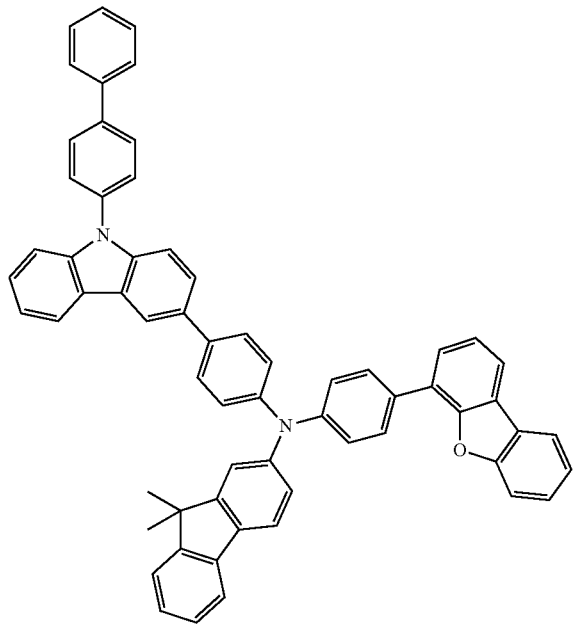
A-38
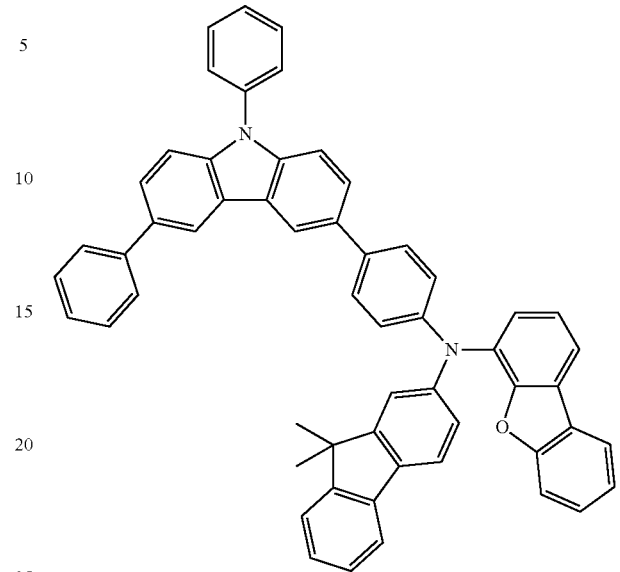
A-40
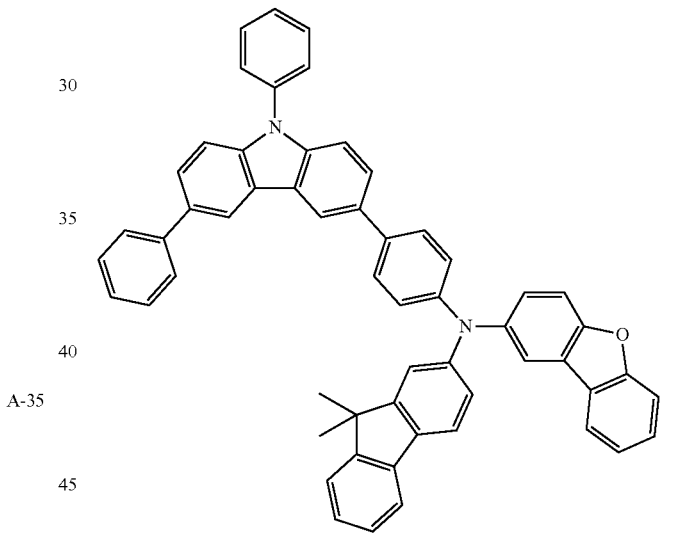
A-35
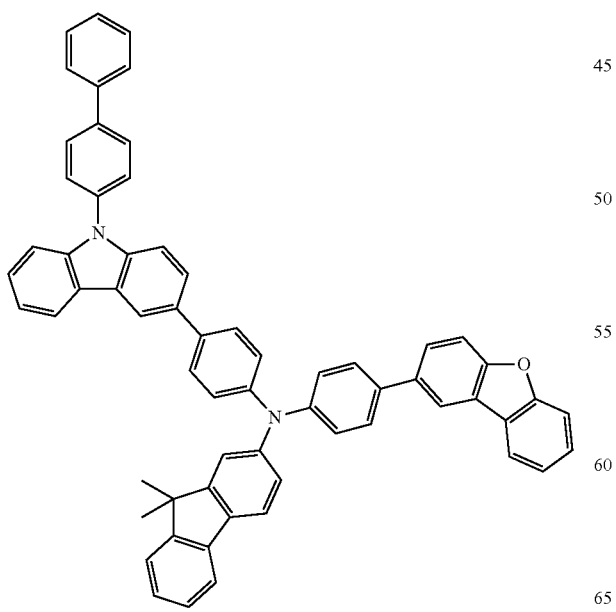
A-42
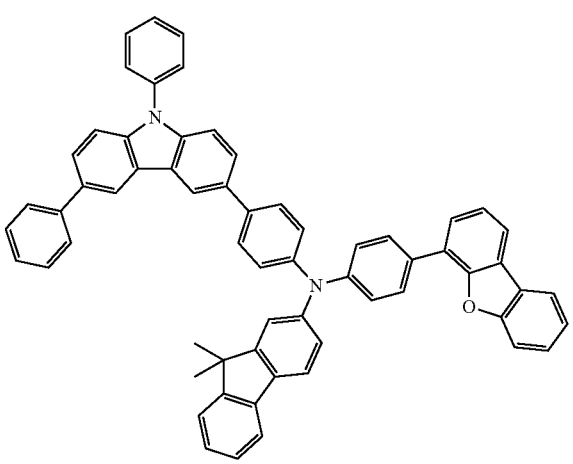

-continued
A-44
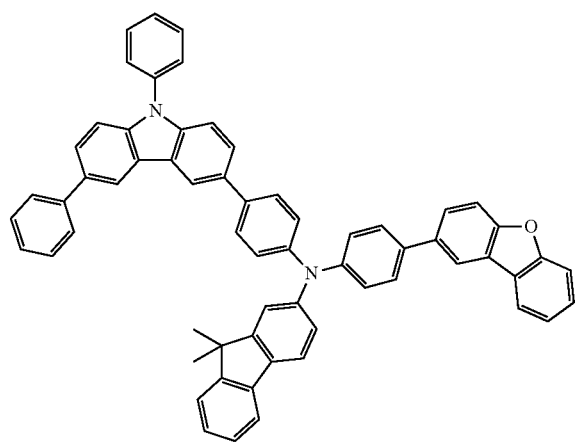
A-47
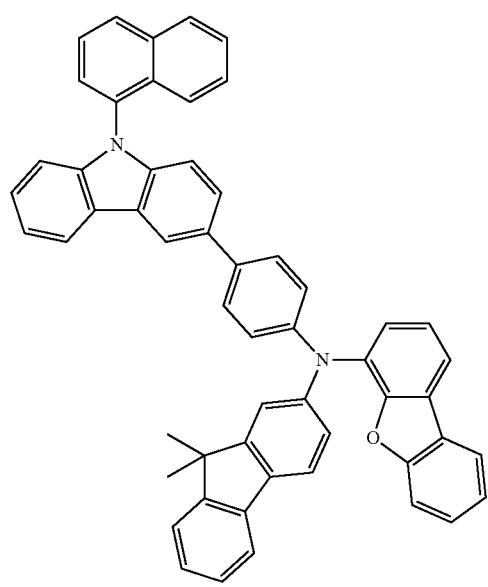
A-49
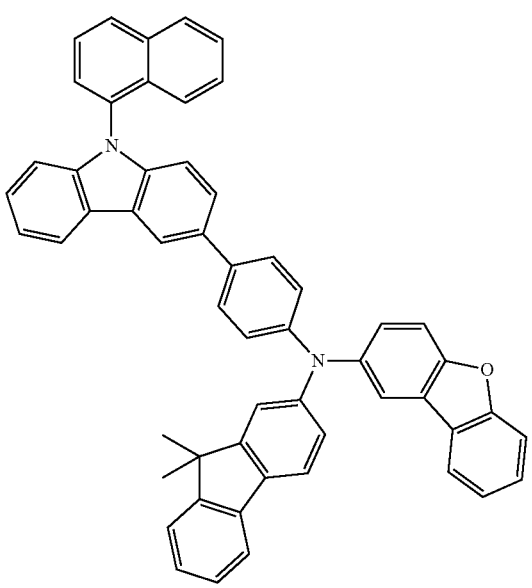
-continued
A-51
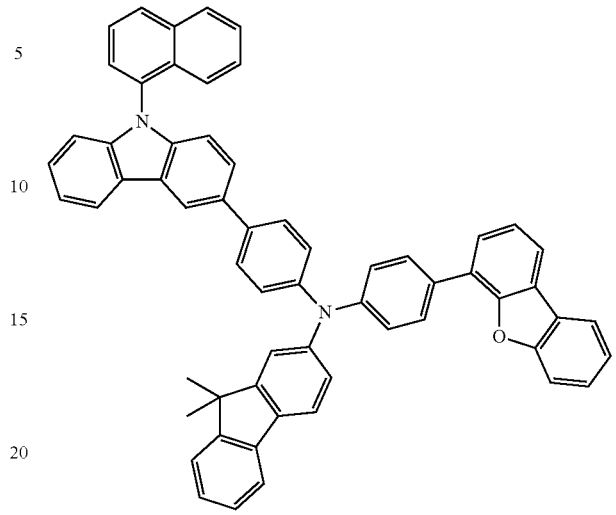
A-53
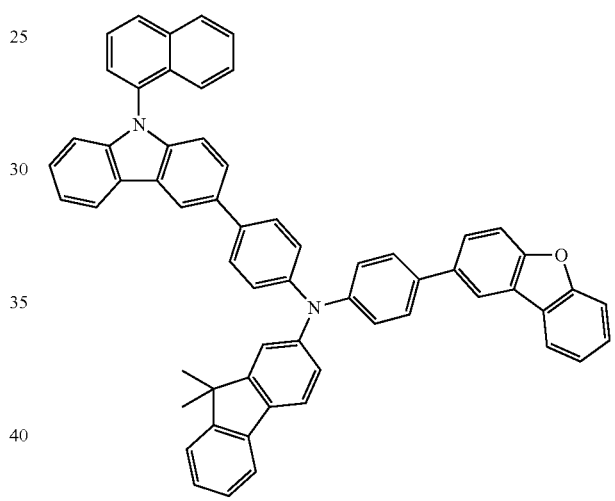
A-57
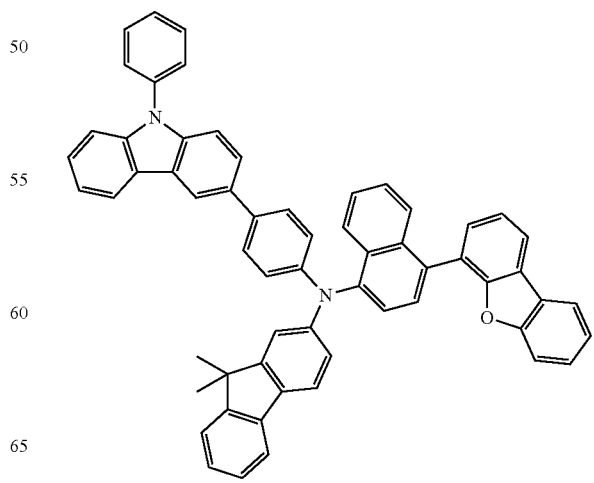

A-59
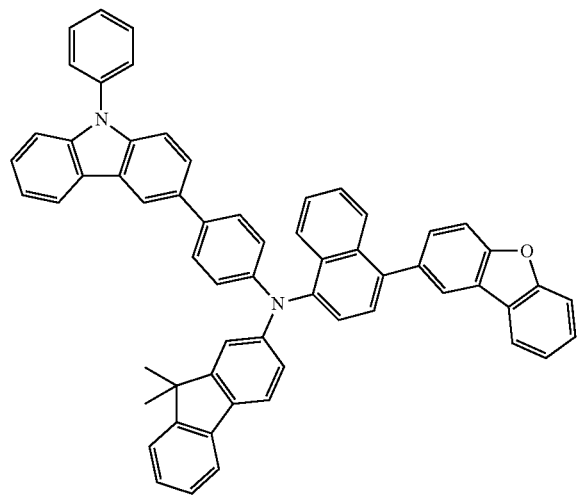
A-62
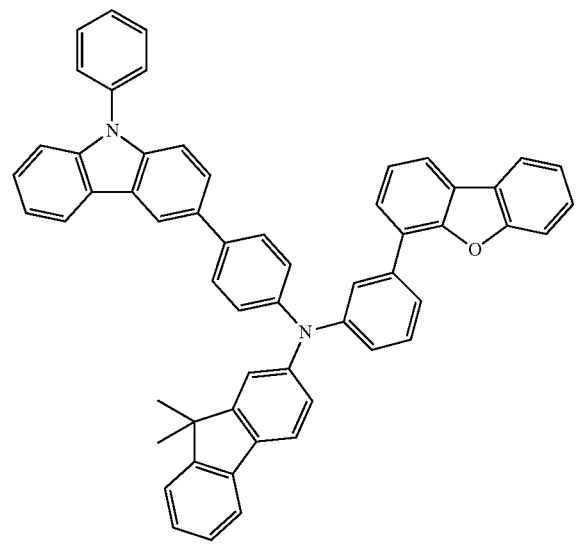
A-64
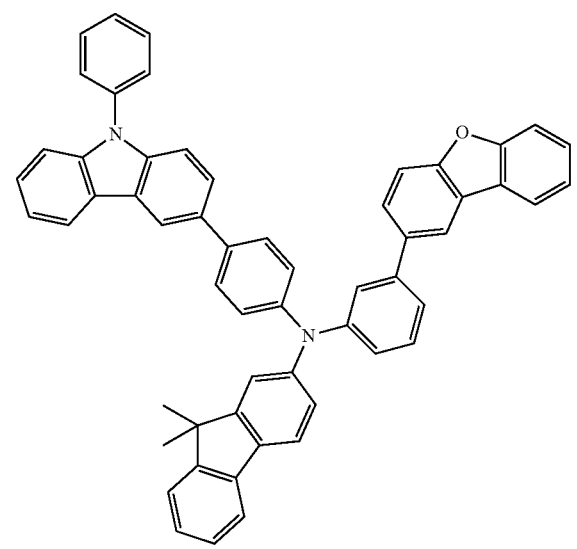
A-69
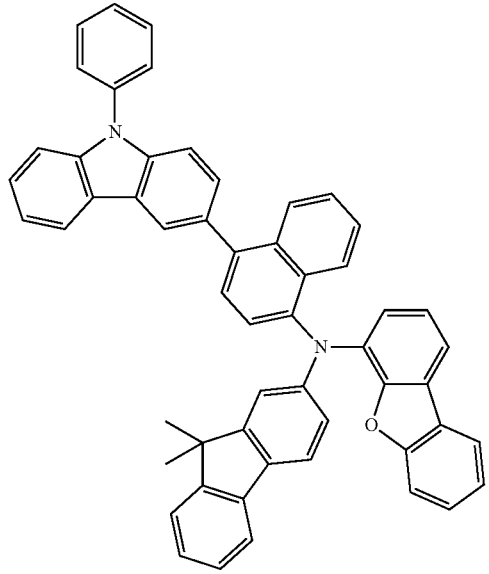
A-71
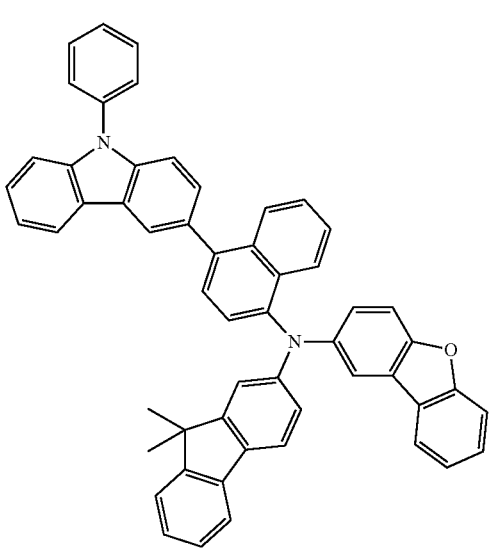
A-72
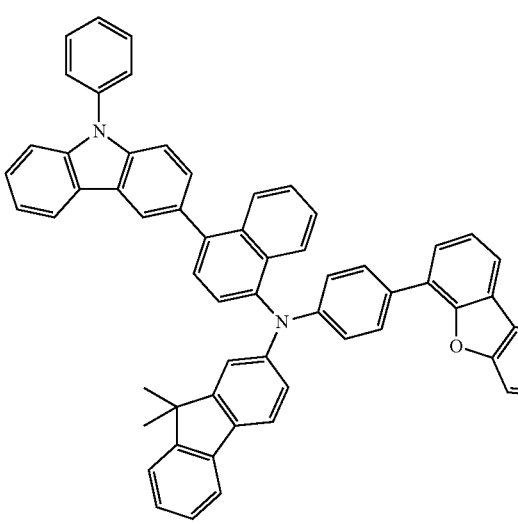

A-74
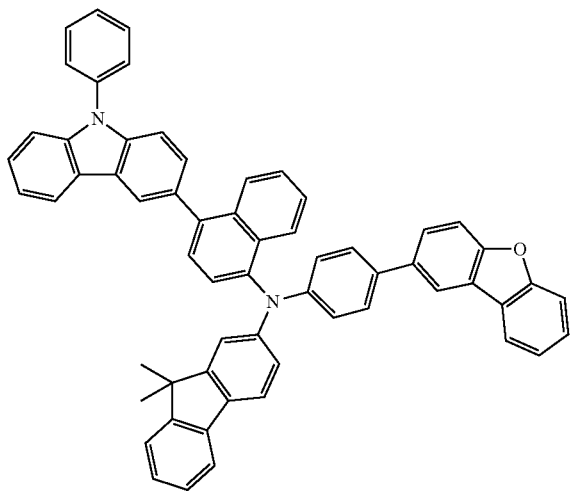
A-81
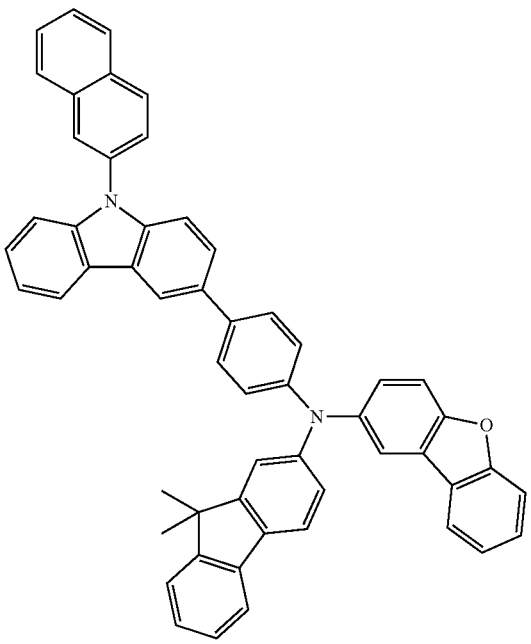
A-79
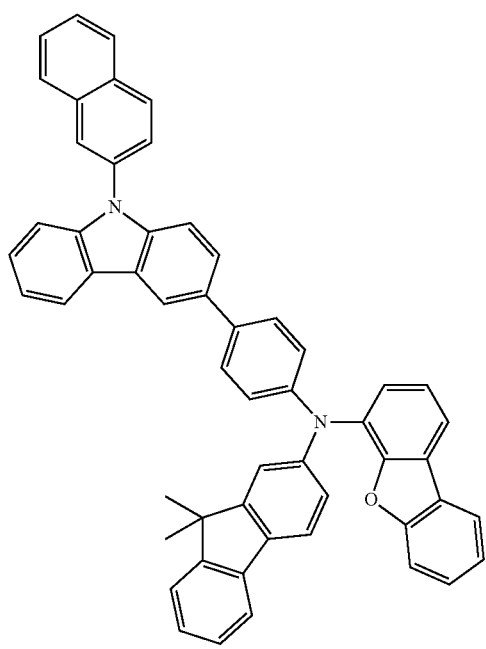
A-82
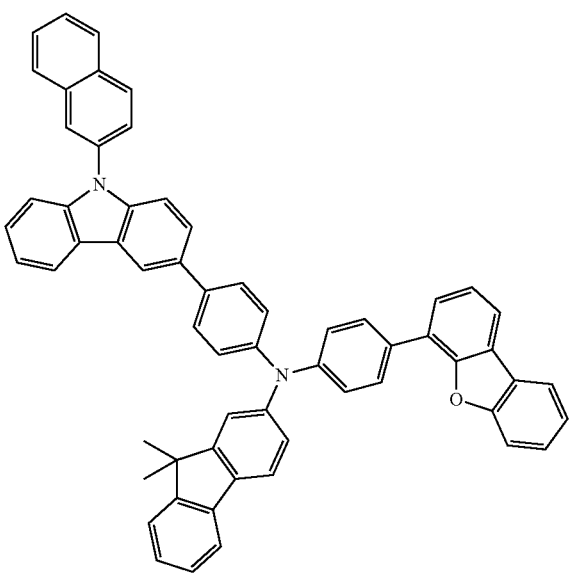

A-84
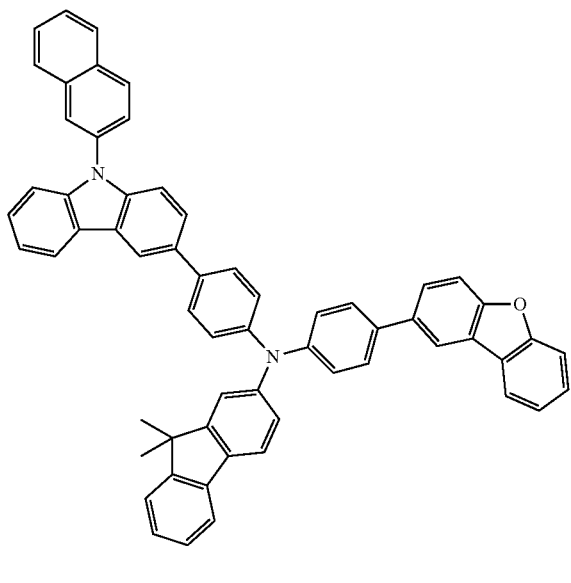
A-91
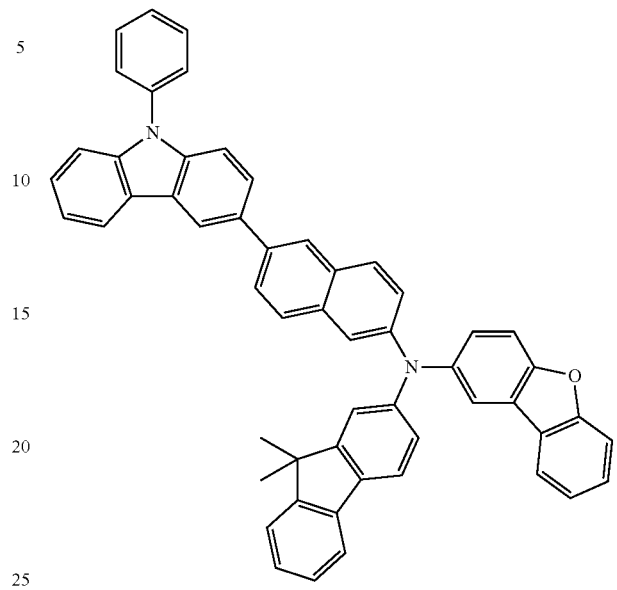
A-89
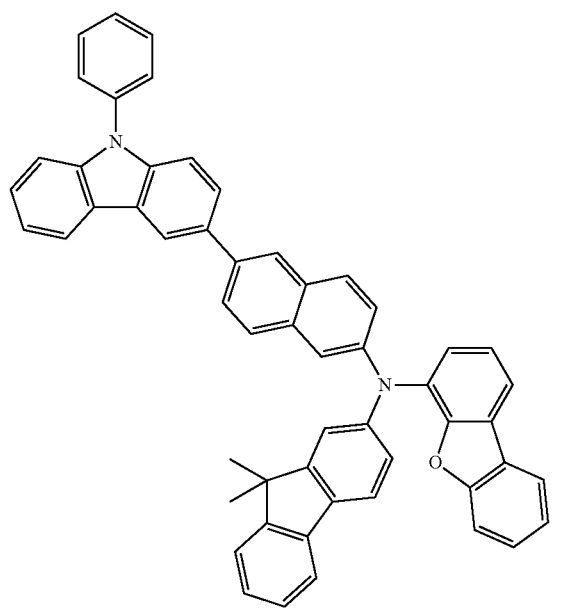
A-92
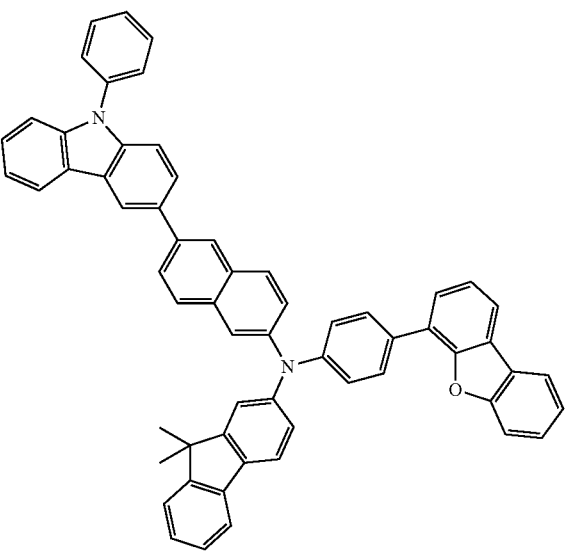

-continued
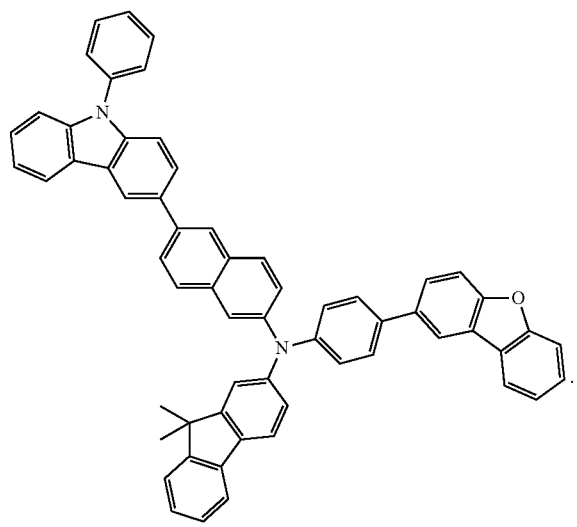
A-94
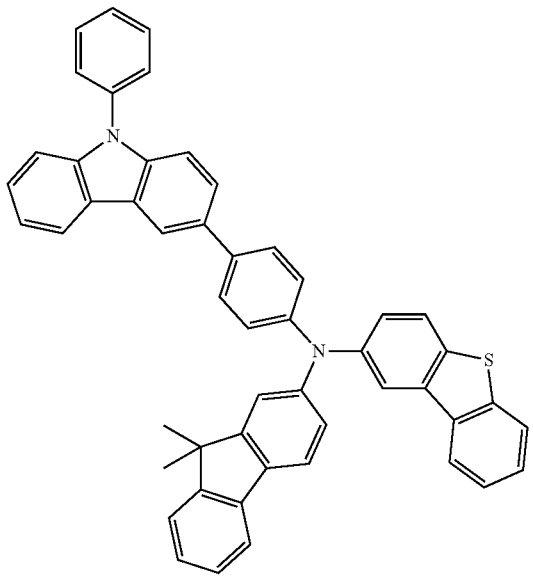
A-5
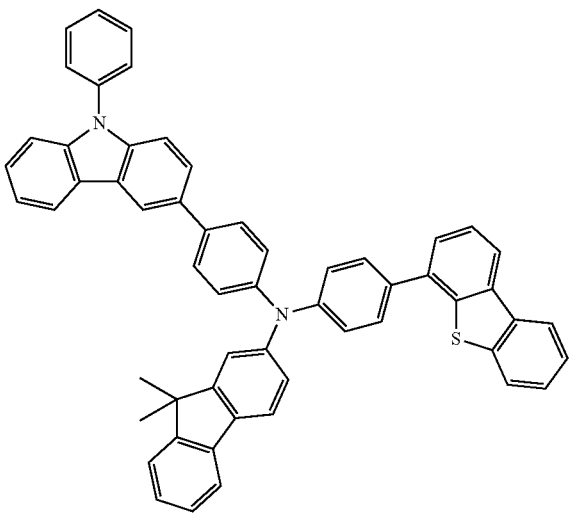
A-7
The compound represented by Chemical Formula 1 is represented by the following Chemical Formula A-3, A-5, A-7, A-9, A-12, A-14, A-16, A-18, A-21, A-23, A-25, A-27, A-30, A-32, A-34, A-36, A-39, A-41, A-43, A-45, A-48, A-50, A-52, A-54, A-58, A-60, A-63, A-65, A-68, A-70, A-73, A-75, A-78, A-80, A-83, A-85, A-88, A-90, A-93, or A-95.
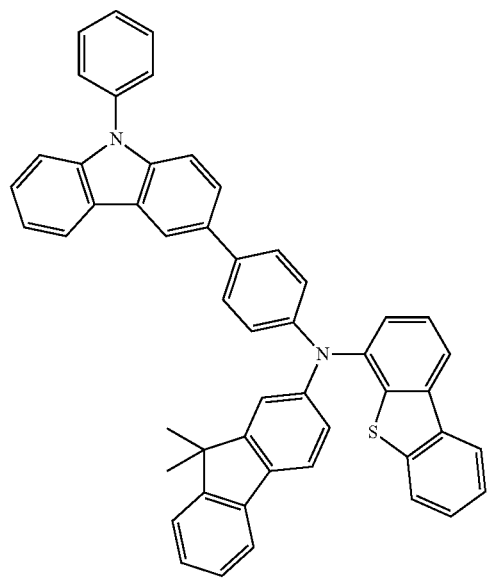
A-3
A-9

A-12
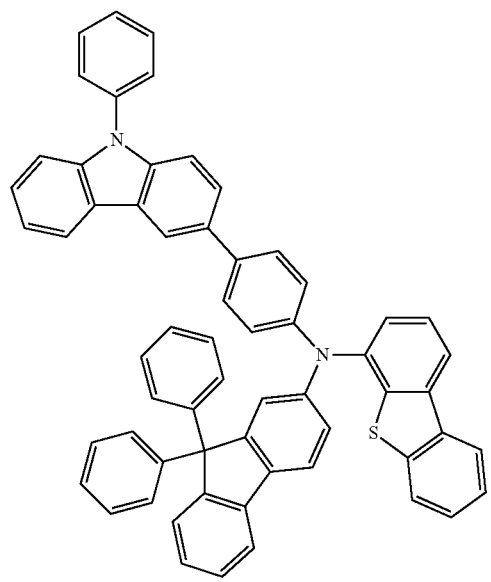
A-16
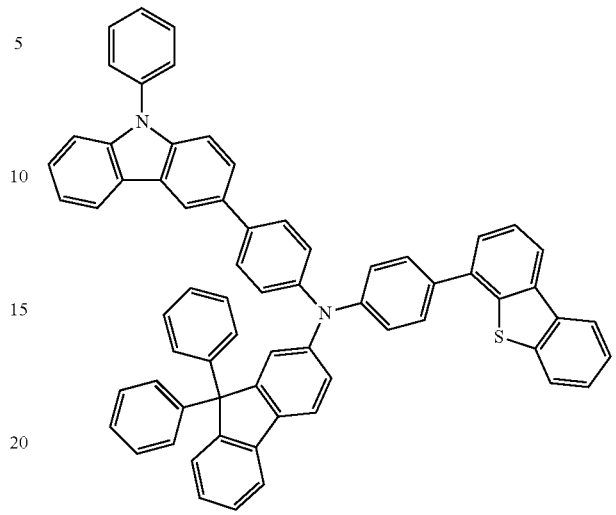
A-18
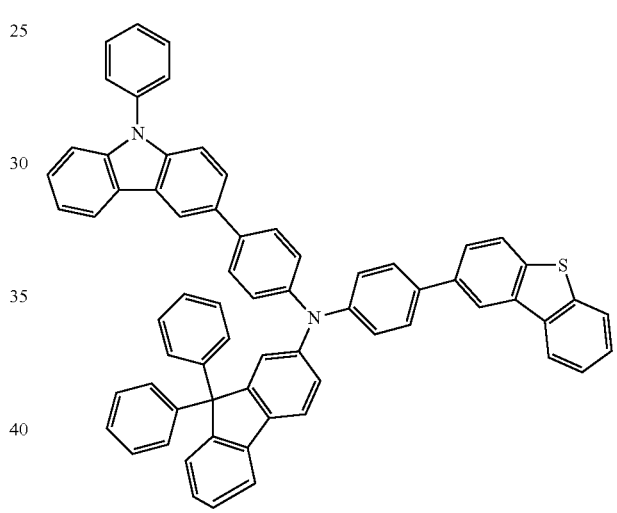
A-14
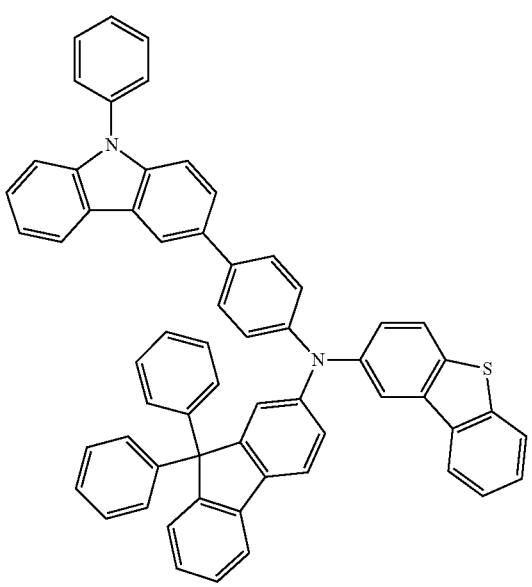
A-21
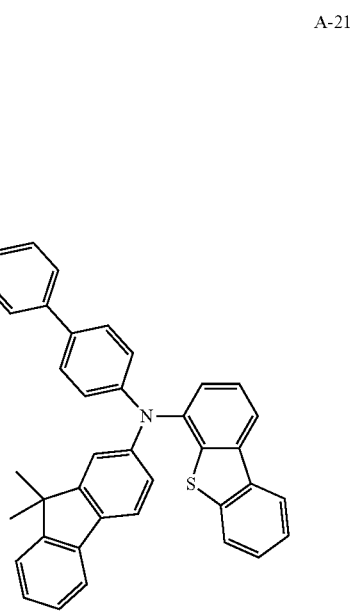

A-23
A-27
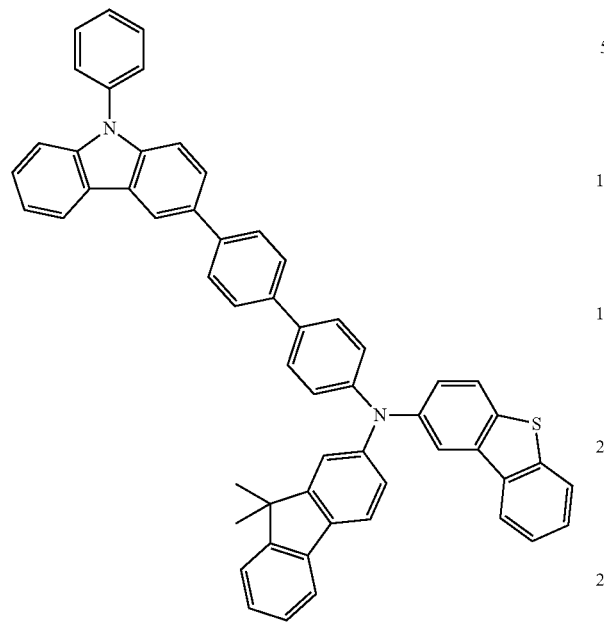
A-25
A-30
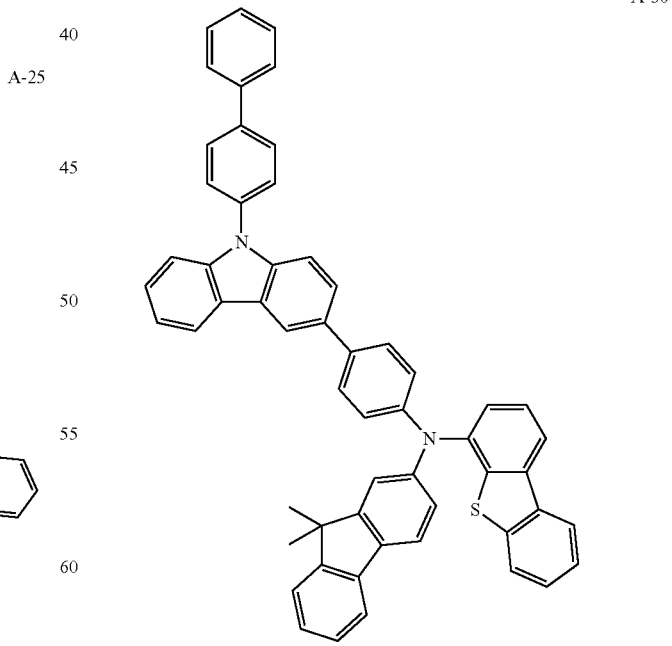

A-32
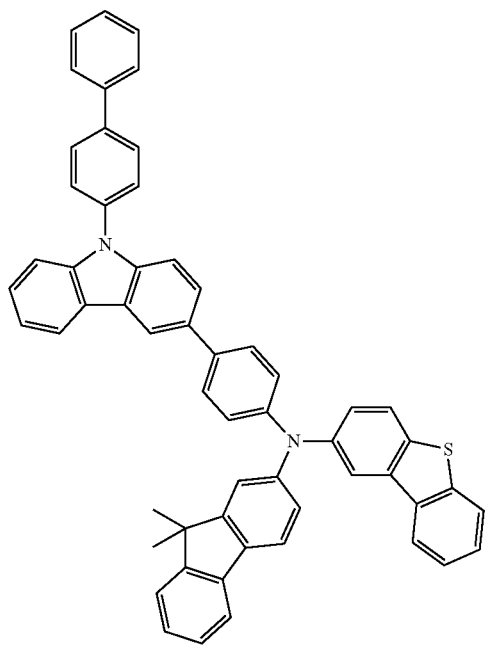
A-34
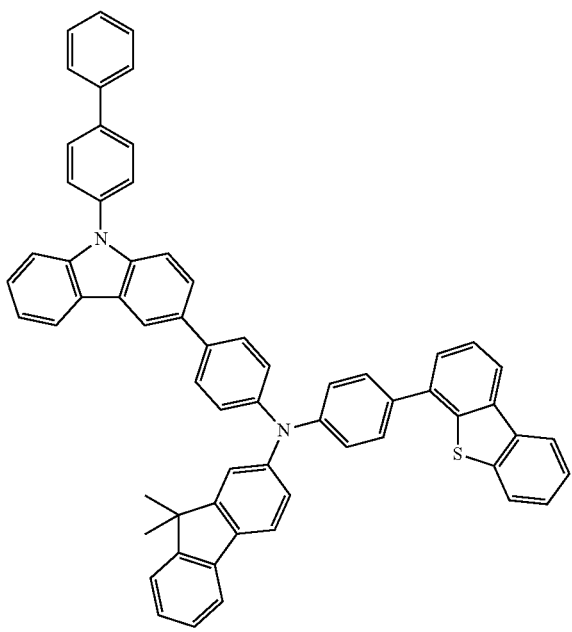
A-36
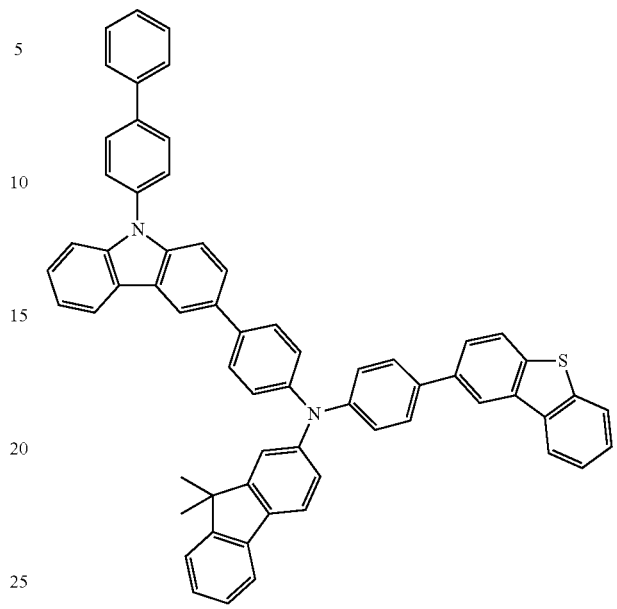
A-39
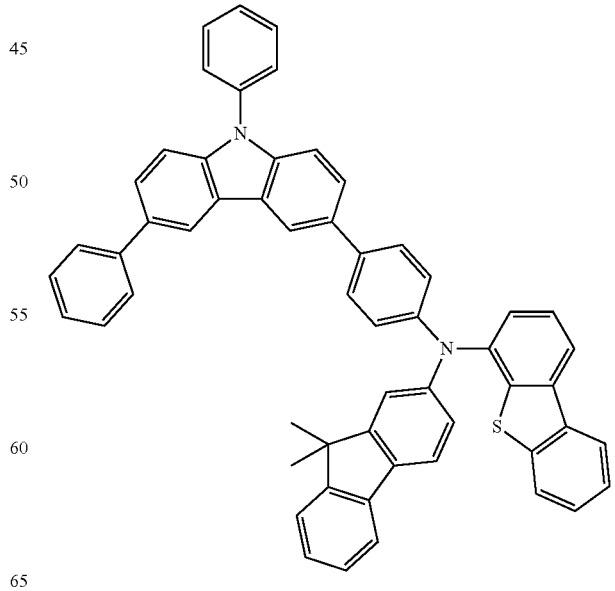

-continued
A-41
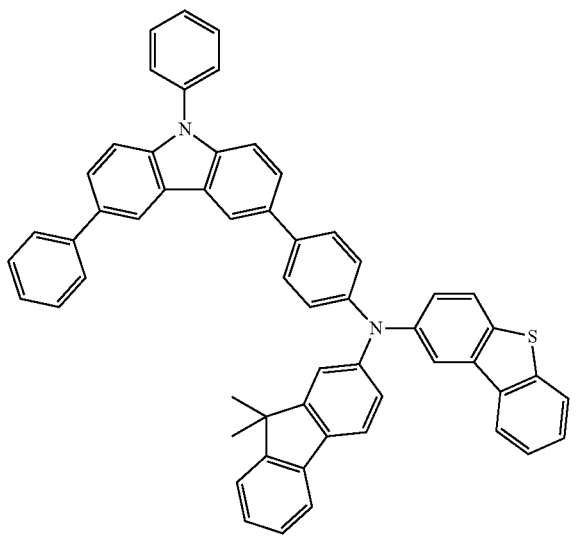
A-48
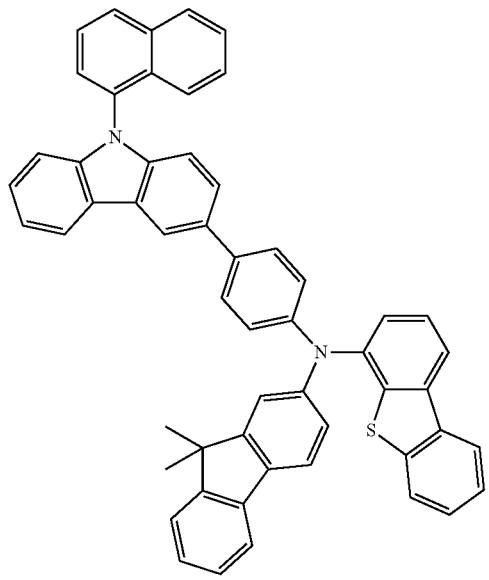
A-43
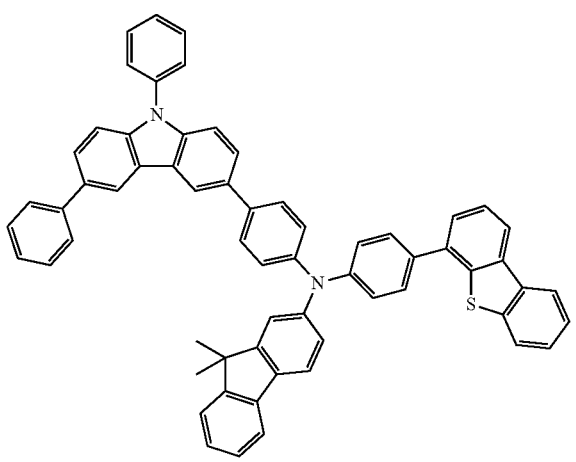
A-50
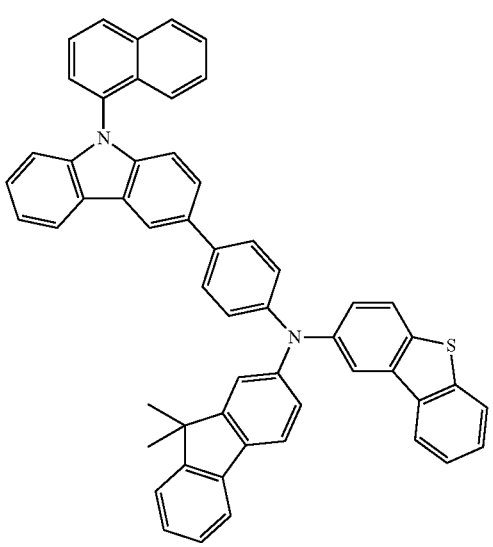
A-45
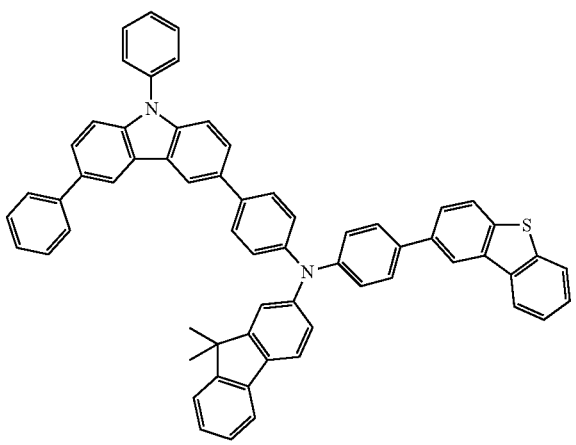
A-52
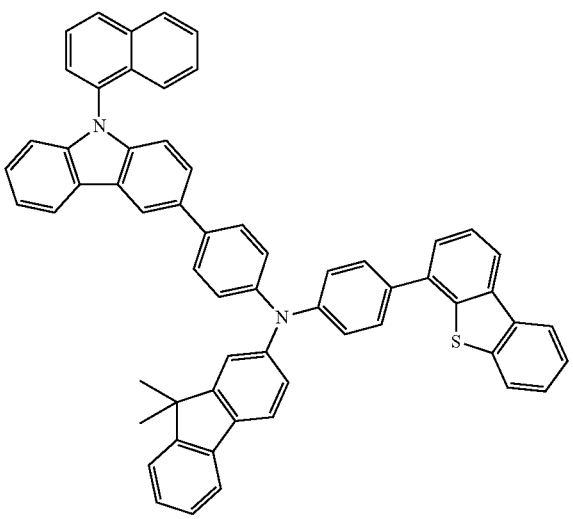

A-54
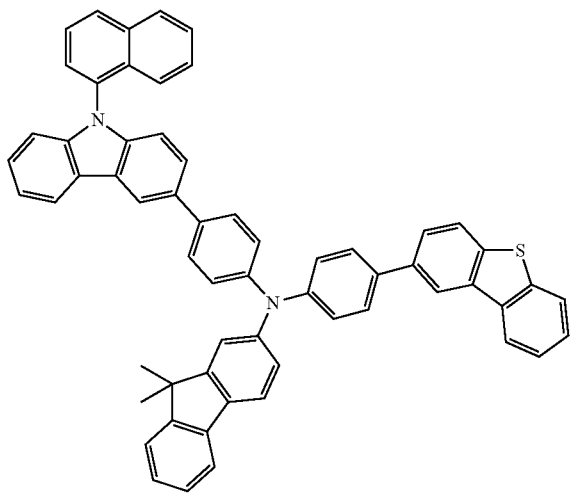
A-58
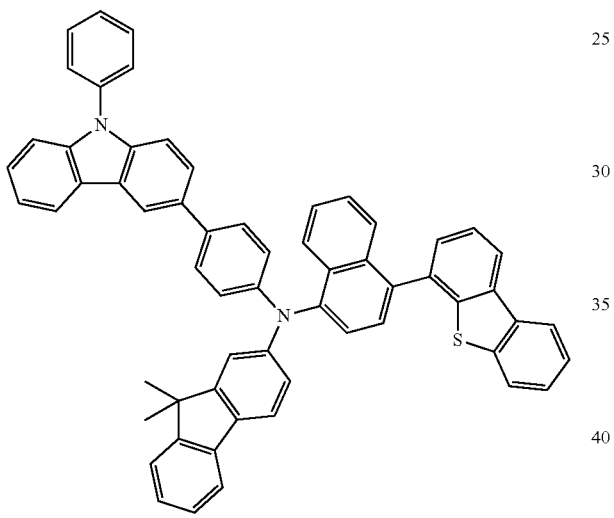
A-60
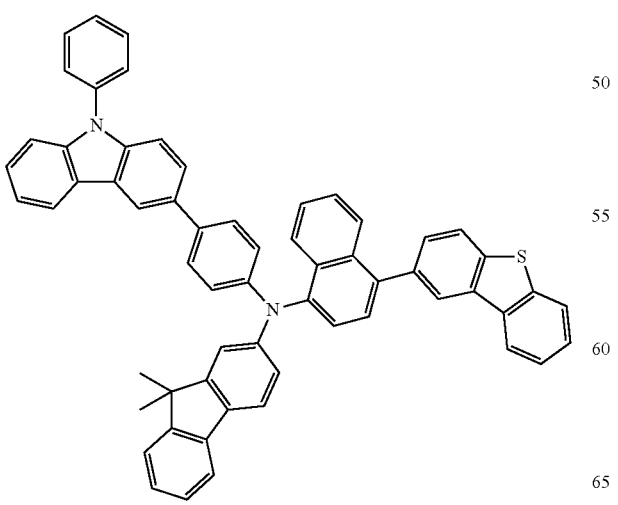
A-63
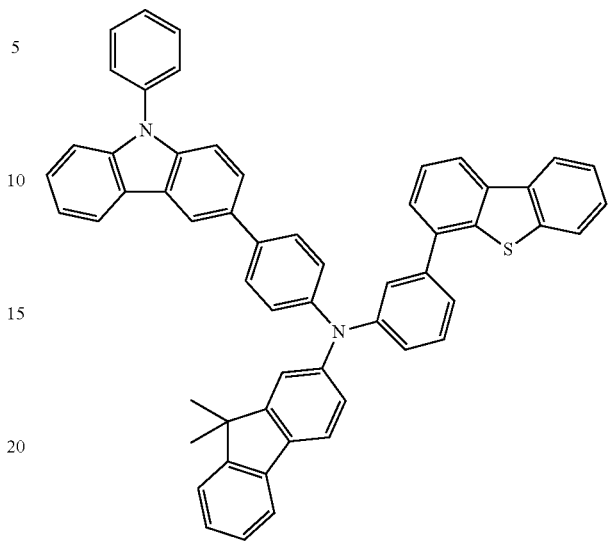
A-65

A-68
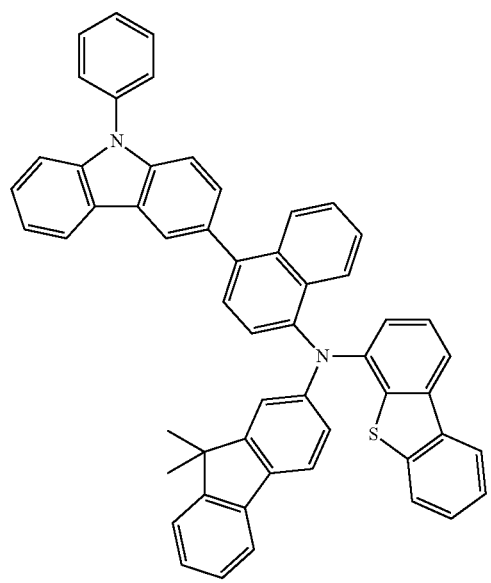
A-73
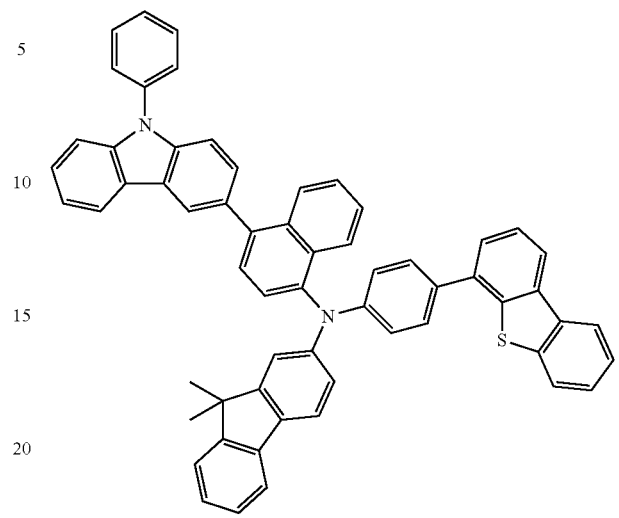
A-70
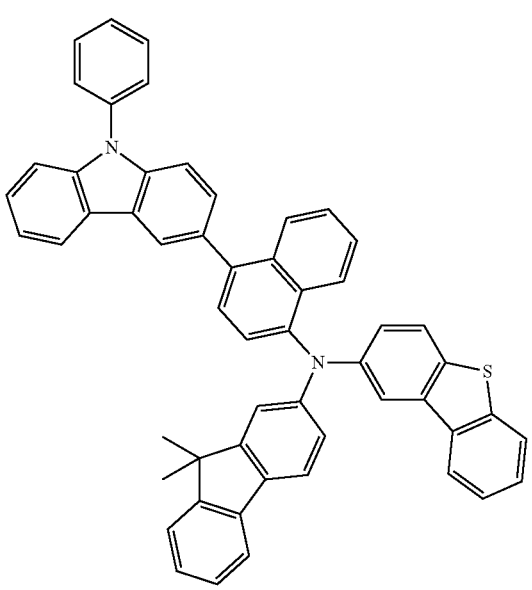
A-75
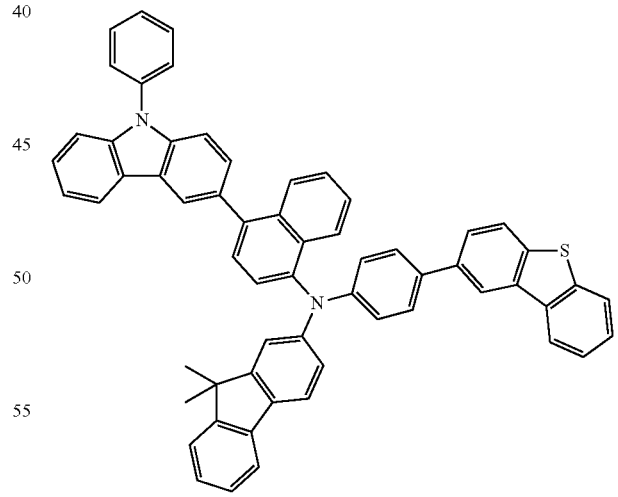

A-78
A-83
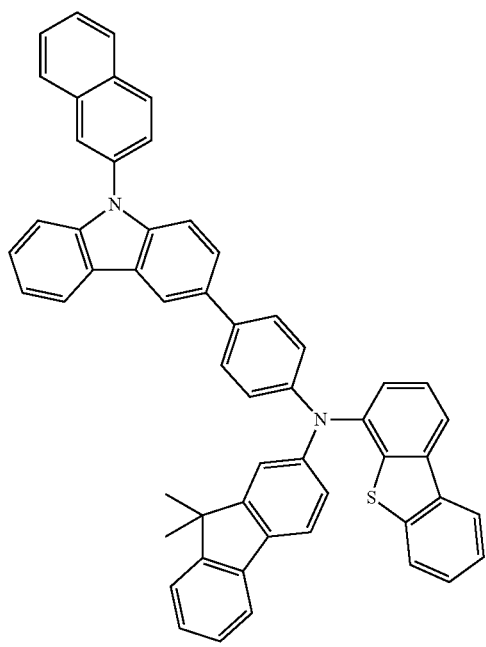
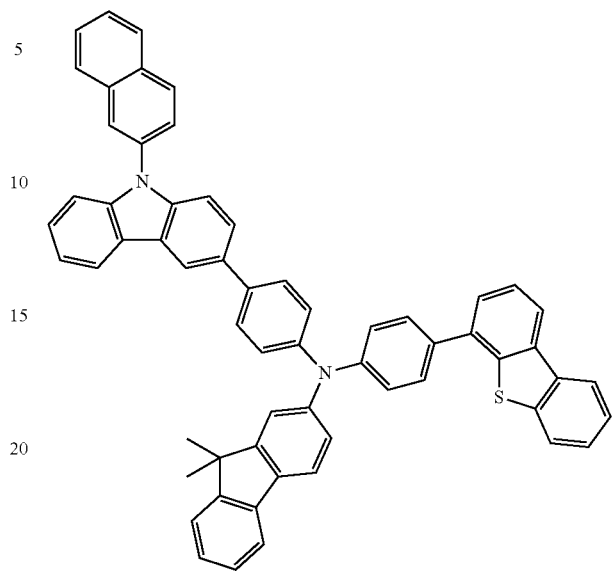
A-80
A-85

A-88

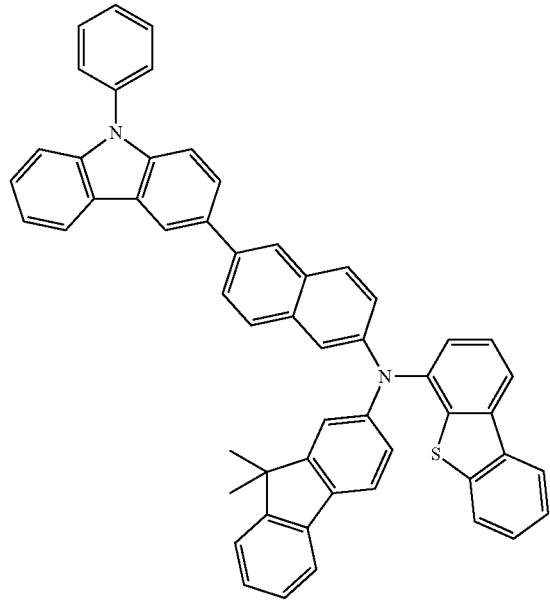

A-90

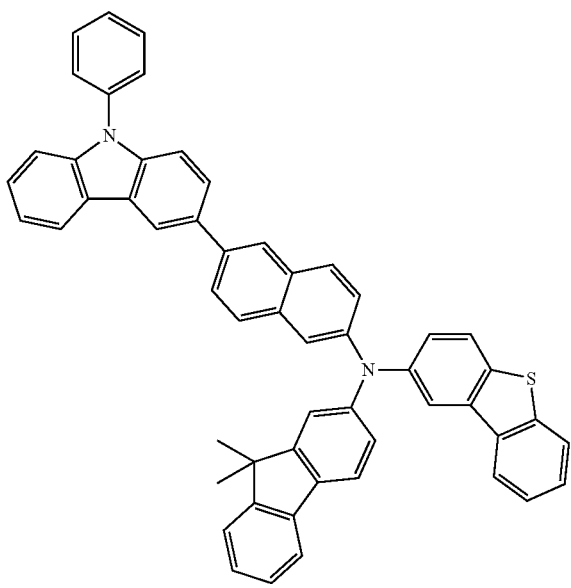

A-93

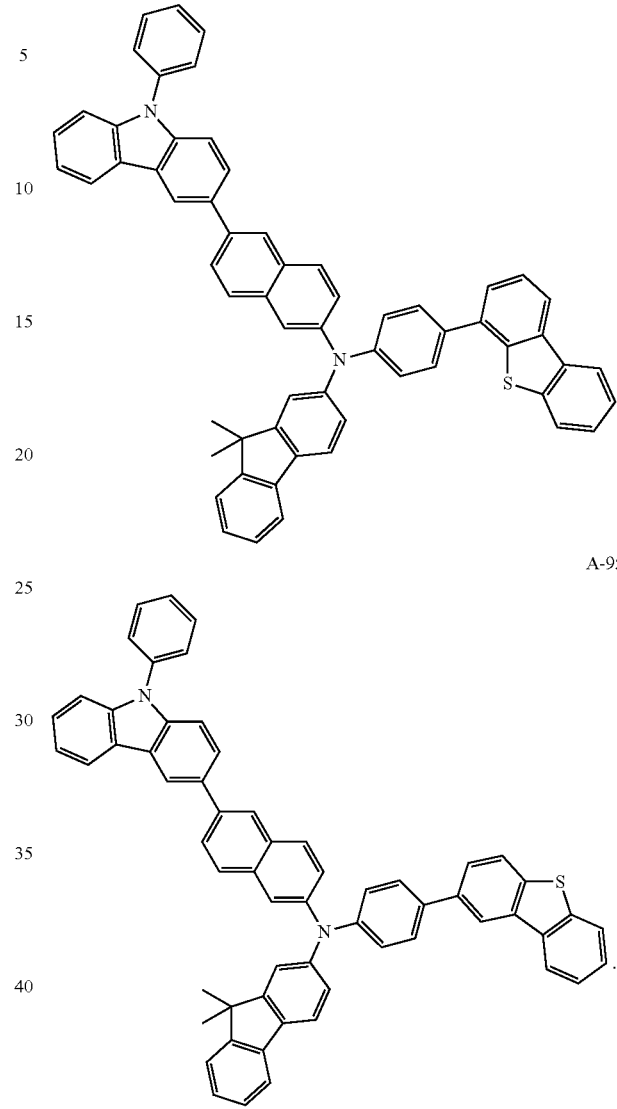

A-95

The compound may be a hole transport material or hole injection material of an organic light emitting diode.

The compound may have a triplet excitation energy (T1) of about 2.0 eV or greater.

The organic optoelectronic device may include one selected from an organic photoelectronic device, an organic light emitting diode, an organic solar cell, an organic transistor, an organic photosensitive drum, and an organic memory device.

The embodiments may also be realized by providing an organic light emitting diode including an anode, a cathode, and at least one organic thin layer between the anode and cathode, wherein the at least one organic thin layer includes the compound for an organic optoelectronic device according to an embodiment.

The at least one organic thin layer may be selected from an emission layer, a hole transport layer (HTL), a hole injection layer (HIL), an electron transport layer (ETL), an electron injection layer (EIL), a hole blocking layer, and a combination thereof.

The at least one organic thin layer may include a hole transport layer (HTL) or a hole injection layer (HIL), and the compound for an organic optoelectronic device may be included in the hole transport layer (HTL) or the hole injection layer (HIL).

The at least one organic thin layer may include an emission layer, and the compound for an organic optoelectronic device may be included in the emission layer.

The at least one organic thin layer may include an emission layer, and the compound for an organic optoelectronic device may be a phosphorescent host material or fluorescent host material in the emission layer.

The embodiments may also be realized by providing a display device including the organic light emitting diode according to an embodiment.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1:
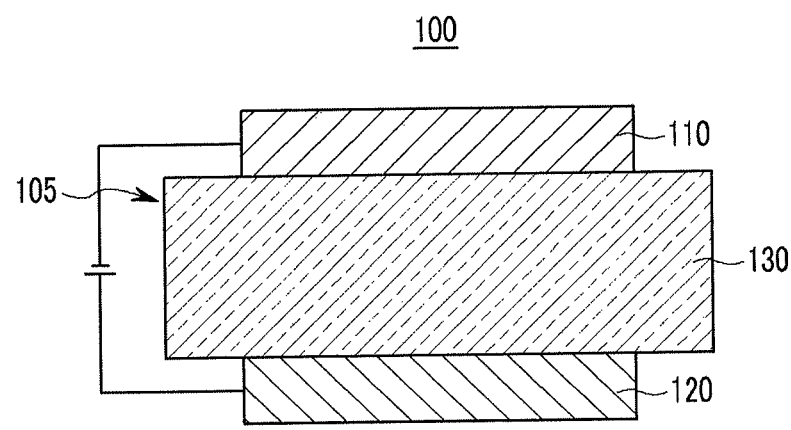
FIGS. 1 to 5 illustrate cross-sectional views of organic light emitting diodes including compounds according to various embodiments.

Korean Patent Application No. 10-2010-0079778, filed on Aug. 18, 2010, and Korean Patent Application No. 10-2010-0131038 filed on Dec. 20, 2010, both of which were filed in the Korean Intellectual Property Office, are incorporated by reference herein in their entireties.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term "substituted" may refer to one substituted with deuterium, a halogen, a hydroxy group, an amino group, a substituted or unsubstituted C1 to C20 amine group, nitro group, a substituted or unsubstituted C3 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group, a C1 to C10 trifluoroalkyl group such as a trifluoromethyl group, or a cyano group, instead of at least hydrogen of substituents or compounds.

As used herein, when specific definition is not otherwise provided, the prefix "hetero" may refer to one including 1 to 3 of N, O, S, or P, and remaining carbons in one ring.

As used herein, when a definition is not otherwise provided, the term "combination thereof" may refer to at least two substituents bound to each other by a linker, or at least two substituents condensed to each other.

As used herein, when a definition is not otherwise provided, the term "alkyl group" may refer to an aliphatic hydrocarbon group. The alkyl group may be a saturated alkyl group that does not include any alkene group or alkyne group. Alternatively, the alkyl may be an unsaturated alkyl group that includes at least one alkene group or alkyne group. The term "alkene" group may refer to a group in which at least two carbon atoms are bound in at least one carbon-carbon double bond, and the term "alkyne" group may refer to a group in which at least two carbon atoms are bound in at least one carbon-carbon triple bond. Regardless of being saturated or unsaturated, the alkyl may be branched, linear, or cyclic.

The alkyl group may have 1 to 20 carbon atoms. In an implementation, the alkyl group may be a medium-sized alkyl having 1 to 10 carbon atoms. In another implementation, the alkyl group may be a lower alkyl having 1 to 6 carbon atoms.

For example, a C1-C4 alkyl may have 1 to 4 carbon atoms and may be selected from the group of methyl, ethyl, propyl, iso-propyl, n-butyl, iso-butyl, sec-butyl, and t-butyl.

Examples of an alkyl group may include a methyl group, an ethyl group, a propyl group, an isopropyl group, a butyl group, an isobutyl group, a t-butyl group, a pentyl group, a hexyl group, an ethenyl group, a propenyl group, a butenyl group, a cyclopropyl group, a cyclobutyl group, a cyclopentyl group, and/or a cyclohexyl group, which may be individually and independently substituted.

The term "aromatic group" may refer to a cyclic functional group where all elements have conjugated pi-orbitals. Examples of the aromatic group include an aryl group and a heteroaryl group.

The term "aryl" group may refer to an aryl group including a carbocyclic aryl (e.g., phenyl) having at least one ring having a covalent pi electron system.

The term "heteroaryl group" may refer to an aryl group where 1 to 3 heteroatoms selected from N, O, S, and P, and remaining carbon. When the heteroaryl group is a fused ring, each ring may include 1 to 3 heteroatoms.

The term "spiro structure" may refer to a cyclic structure having a common carbon contact point. The term spiro structure may refer to a compound or substituent having a spiro structure.

According to an embodiment, a compound for an organic optoelectronic device may have a core structure including a carbazolyl and a fluorenyl group as a substituent linked to an N, B, or P atom.

The carbazolyl group (with excellent hole properties, e.g., hole transport properties and/or hole injection properties) may be linked to the N, B, or P atom in the core structure. Thus, the compound may be used as a hole injection material or a hole transport material for an organic light emitting diode.

At least one substituent combined or bound to the core may have excellent electron properties, e.g., electron transport properties and/or electron injection properties. Accordingly, the compound may have the core structure having excellent hole properties and may be reinforced with electron properties of the substituent and thus, may satisfy a condition desirable for an emission layer. For example, the compound may be used as a host material for an emission layer.

The hole properties are that holes generated at an anode may be easily injected into an emission layer and moved therein due to conductive properties according to HOMO levels.

In addition, the electron properties are that electrons generated at a cathode may be easily injected into an emission layer and moved therein due to conductive properties according to LUMO levels.

The compound for an organic optoelectronic device may have the core as described above and may include various substituents substituted on the core and thus, may have various energy band gaps.

When a compound having various energy levels (according to a substituent thereof) is used for an organic photoelectric device, it may reinforce hole transport capability or electron transport capability and thus, may have excellent effects on efficiency and driving voltage and also, may have excellent electrochemical and thermal stability. Accordingly, life-span of the organic photoelectric device may be improved.

According to an embodiment, the compound for an organic optoelectronic device may be represented by the following Chemical Formula 1.

[Chemical Formula 1]

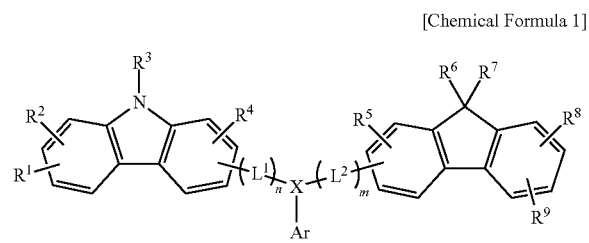

In Chemical Formula 1, Ar may be a substituted or unsubstituted triperylenyl group; a substituted or unsubstituted biphenylyl group; a substituted or unsubstituted dibenzofuranyl group; a substituted or unsubstituted triphenylenyl group; or a substituted or unsubstituted dibenzothiophenyl group, X may be N, B, or P, $L^1$ and $L^2$ may each independently be a single bond, a substituted or unsubstituted C2 to C10 alkenylene group, a substituted or unsubstituted C2 to C10 alkynylene group, a substituted or unsubstituted C6 to C30 arylene group or a substituted or unsubstituted C2 to C30 heteroarylene group, n and m may each independently be integers of 0 to about 3, and $R^1$ to $R^9$ may each independently be hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothiol group, a substituted or unsubstituted C1 to C20 ureide group, a substituted or unsubstituted C3 to C40 silyl group, or a combination thereof.

When Ar and $R^1$ to $R^9$ are selected as described above, the compound for an organic optoelectronic device may exhibit excellent hole or electron properties, film stability, thermal stability, and high triplet excitation energy (T1). In addition, the compound may have excellent thermal stability and/or excellent resistance against oxidation.

The compound represented by the above Chemical Formula 1 may have an asymmetrical bipolar structure. The asymmetrical bipolar structure may improve hole and electron transport capabilities and thus, may improve luminous efficiency and performance of a device.

In the asymmetrical bipolar structure, substituents may be selected to prepare a compound with a bulky structure and thus, lower crystallinity. The compound with lower crystallinity may improve life-span of a device.

In Chemical Formula 1, Ar may not be a carbazolyl group. For example, X, a core atom in the above Chemical Formula 1, may not be substituted with more than one carbazolyl group. Such a structure may avoid increased symmetry and thus, avoid increased crystallinity.

$L^1$, $L^2$, n, and m may be adjusted to control a length of the compound, which may adjust π-conjugation length of the compound. Accordingly, the compound may be adjusted regarding a triplet energy bandgap and thus, may be usefully applied to an emission layer for an organic photoelectric device as a phosphorescent host In addition, when a heteroaryl group is introduced as the substituent, the compound may have a molecule structure with bipolar properties and may realize high efficiency as a phosphorescent host.

In Chemical Formula 1, the fluorenyl group, as a substituent for the core, may decrease symmetry of the molecule and thus, may hinder crystallization of the compound. Accordingly, when this compound is used for a hole injection layer and/or a hole transport layer (HTL) for an organic electric field light emitting element, it may help achieve long life-span and high efficiency of the element.

As described above, Ar may be a substituted or unsubstituted triperylenyl or triphenylenyl group; a substituted or unsubstituted biphenylyl group; a substituted or unsubstituted dibenzofuranyl group; or a substituted or unsubstituted dibenzothiophenyl group.

The triphenylenyl group may have a bulky structure and may bring about resonance effects. Thus, the triphenylenyl group may suppress a side reaction occurring in the solid status of a compound and the compound may improve performance of an organic light emitting diode.

In addition, the triphenylenyl group may make the compound bulky and may lower crystallinity thereof, thereby increasing life-span of a device prepared using the compound.

The triphenylenyl group may have a broad bandgap and a large triplet excitation energy (unlike other substituents). Thus, the triphenylenyl group may be combined with the compound including carbazole without decreasing bandgap or triplet excitation energy of the compound.

When Ar is the dibenzofuranyl group or dibenzothiophenyl group having hole transport property and is asymmetrically combined as shown in the above Chemical Formula 1, the group may include a hetero aromatic cycle withdrawing electrons; and may bring about asymmetric bipolar properties all over a molecule.

The term "substituted" in the definition of "substituted or unsubstituted" may refer to one substituted with a substituent selected from deuterium, a halogen, a cyano group, a hydroxy group, an amino group, a substituted or unsubstituted C1 to C20 amine group, a nitro group, a substituted or unsubstituted C1 to C20 alkyl group, a substituted or unsubstituted C1 to C20 alkoxy group, a substituted or unsubstituted C3 to C40 silyl group, and a combination thereof, instead of hydrogen of each substituent.

Compared with the aforementioned basic structure of a compound, a "substituted" structure as aforementioned may subtly regulate electric-optical properties and thin film properties to optimize performance of a material for an organic photoelectric device as well as maintain basic properties of a compound.

The compound for an organic photoelectric device may be represented by the following Chemical Formula 2.

[Chemical Formula 2]

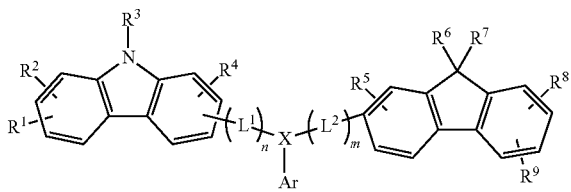

The above Chemical Formula 2 may be the same as the aforementioned Chemical Formula 1, except for being limited to a particular combination location with respect to the carbazolyl group and the fluorenyl group. When a compound is represented by Chemical Formula 2, it may be advantageous in terms of actual synthesis. Other than the combination location, Chemical Formula 2 is the same as Chemical Formula 1 (i.e., definitions of X, Ar, etc.), and repeated descriptions thereof are omitted.

The compound for an organic photoelectric device may be represented by the following Chemical Formula 3.

[Chemical Formula 3]

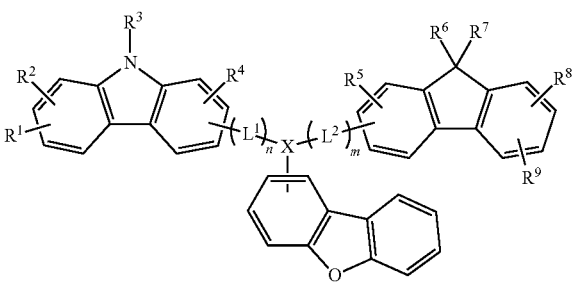

The above structure of Chemical Formula 3 defines Ar (from Chemical Formula 1) as a dibenzofuranyl group The compound represented by Chemical Formula 3 may exhibit improved thermal stability and may remarkably increase half life-span of a device.

The compound for an organic photoelectric device may be represented by the following Chemical Formula 4.

[Chemical Formula 4]

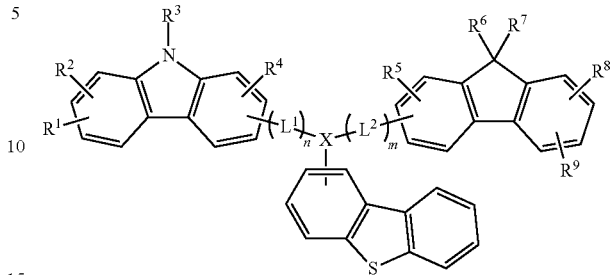

The structure of the above Chemical Formula 4 defines Ar (from Chemical Formula 1) as a dibenzothiophenyl group. This structure may improve thermal stability of a material and remarkably increases half life-span of a device.

The compound for an organic photoelectric device may be represented by the following Chemical Formula 5.

[Chemical Formula 5]

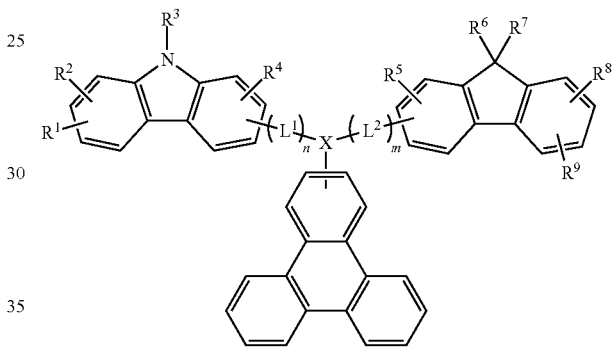

The structure of the above Chemical Formula 5 defines Ar (from Chemical Formula 1) as a triphenylenyl group. This structure may broaden T1 energy of triphenylene as well as improve thermal stability of a material and thus, may be used for hole transport and injection layers of a phosphorescent light emitting material.

The compound for an organic photoelectric device may be represented by the following Chemical Formula 6.

[Chemical Formula 6]

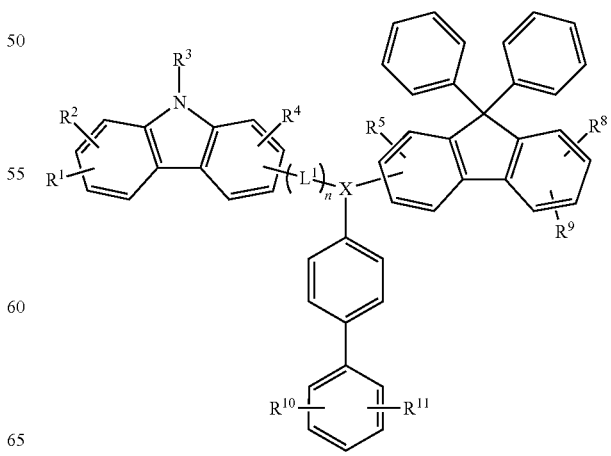

In Chemical Formula 6, X may be N, B, or P, $L^1$ may be a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n may be an integer of 0 to about 3, and $R^1$ to $R^5$ and $R^8$ to $R^{11}$ may each independently be hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 aryloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

In an implementation, in Chemical Formula 6, $L^1$ may be phenylene, and n may be 1.

When a compound represented by Chemical Formula 6 is used to fabricate an organic photoelectric device (e.g., an organic light emitting diode), the device may have excellent life-span.

The compound for an organic optoelectronic device according to an embodiment may exhibit remarkably improved thermal stability when phenyl groups are substituted at the 9 and 9' positions of the fluorenyl group and a biphenyl group is substituted on X. Thus, the compound may not be easily decomposed due to heat, even when deposited at a higher speed during the fabrication of a device.

In Chemical Formulae 1 to 6, X may be N. When the X is N, a tertiary amine core may be formed, and hole properties of the entire compound may be further improved.

The compound for an organic photoelectric device may be represented by one of the following Chemical Formulae A-1 to A-95. Compounds having following structures may exhibit excellent thin film properties and improved thermal stability (due to asymmetry thereof) and may exhibit excellent hole transport properties of a carbazolyl group. Thus, the compound may be applied to a hole injection layer and a hole transport layer (HTL) for an organic electric field light emitting element, thereby achieving long life-span and high efficiency of the organic electric field light emitting element.

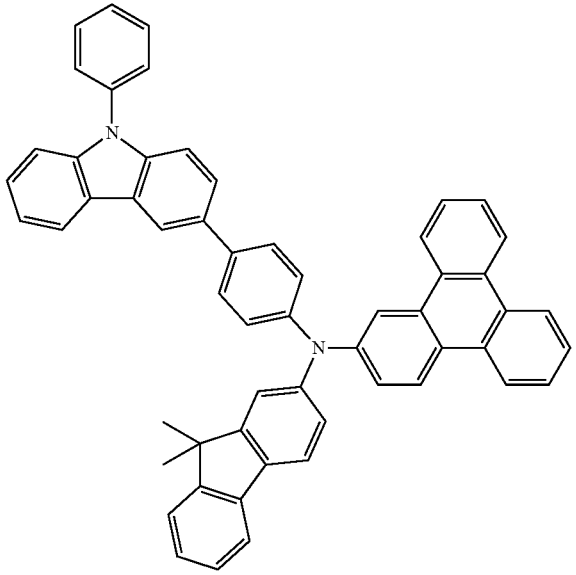

A-1

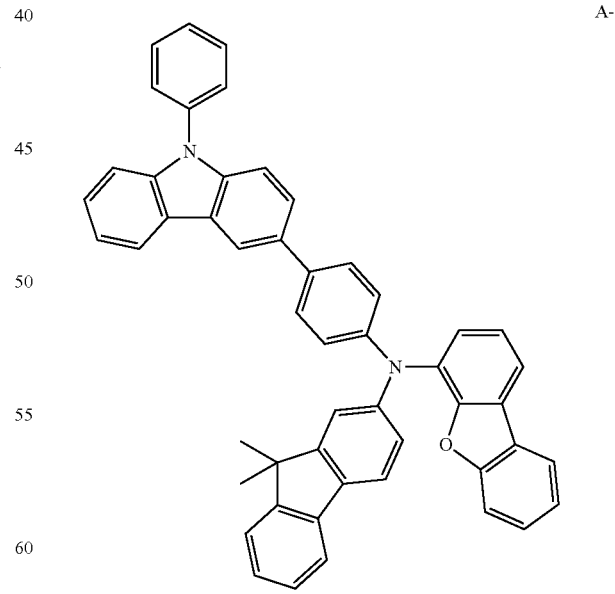

A-2

A-3
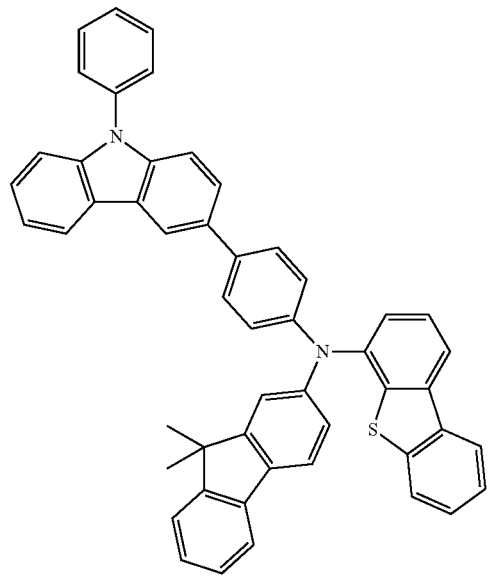
A-5
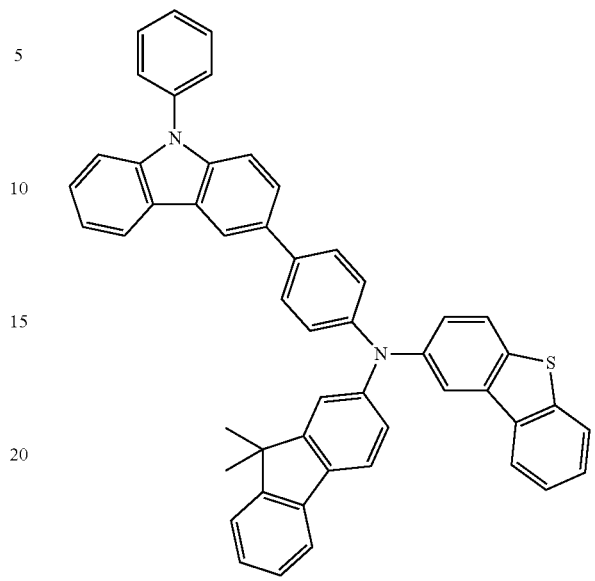
A-6
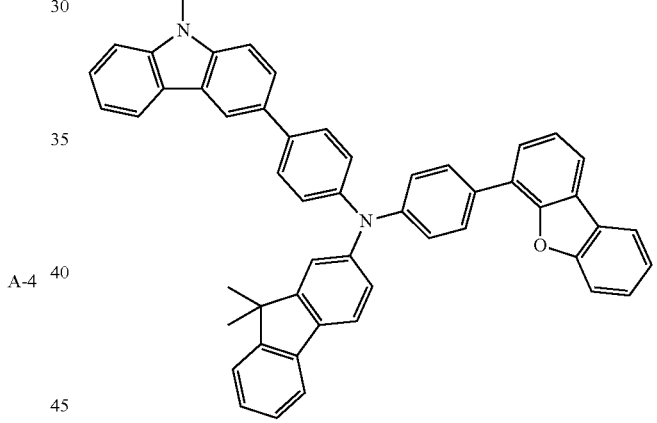
A-4
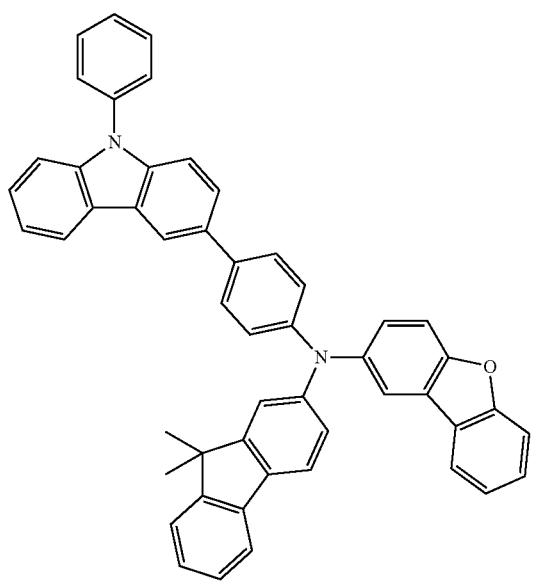
A-7
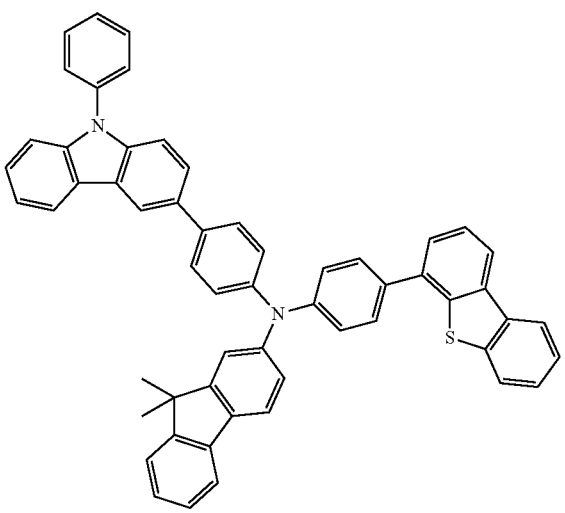

-continued
A-8
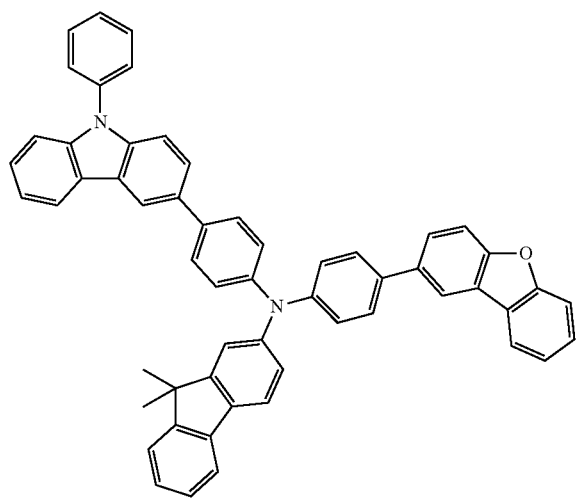
A-9
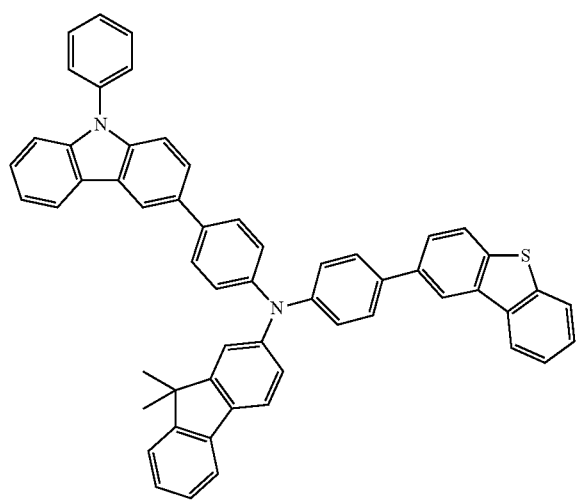
A-10
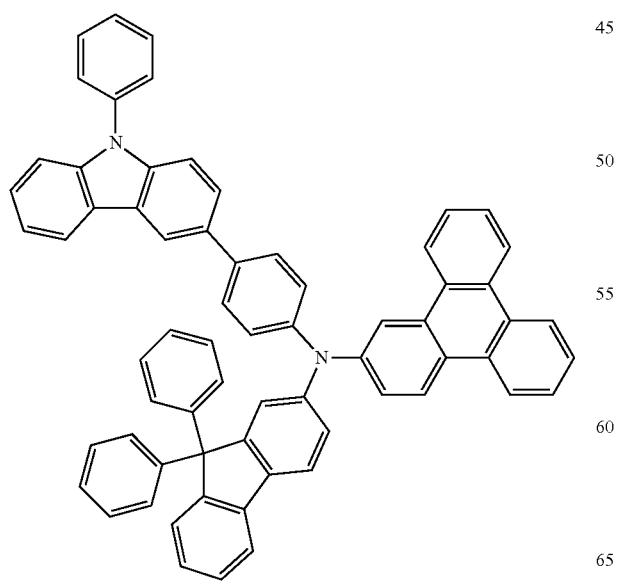
A-11
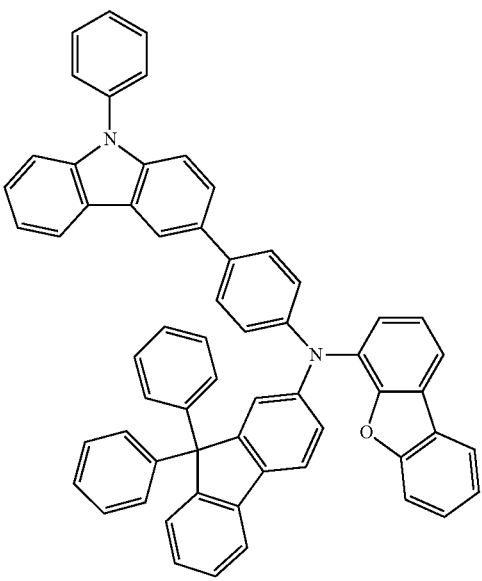
A-12
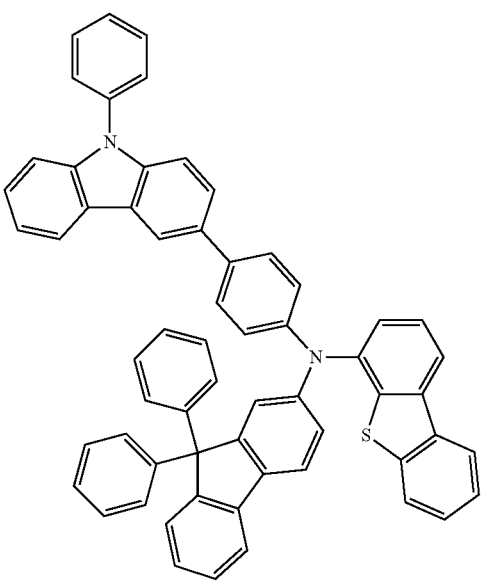

A-13
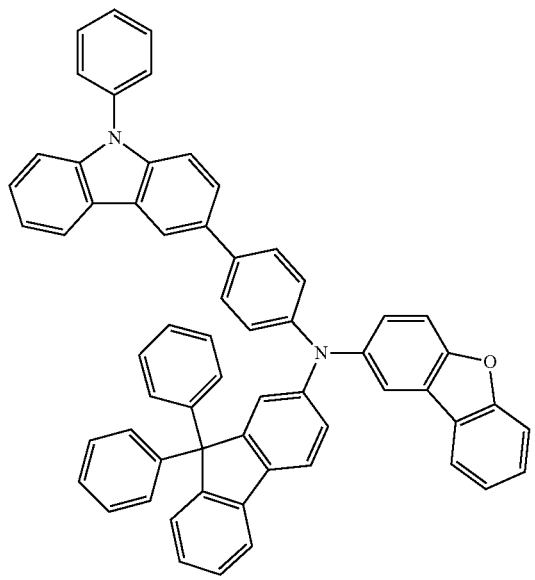
A-14
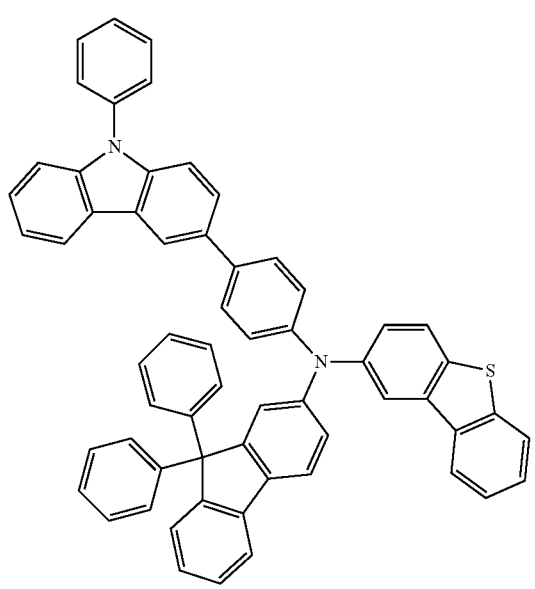
A-15
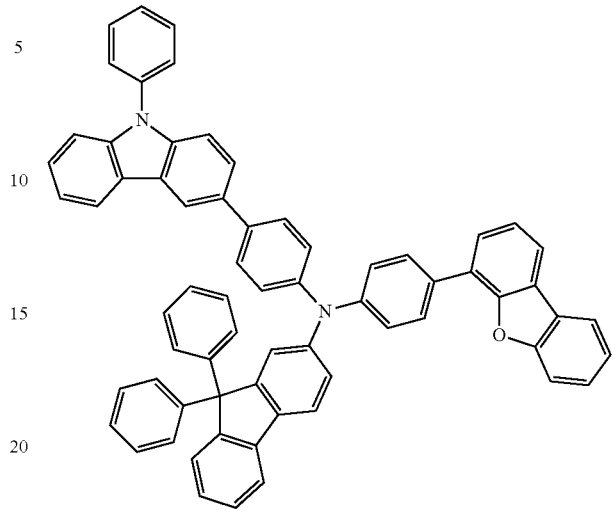
A-16
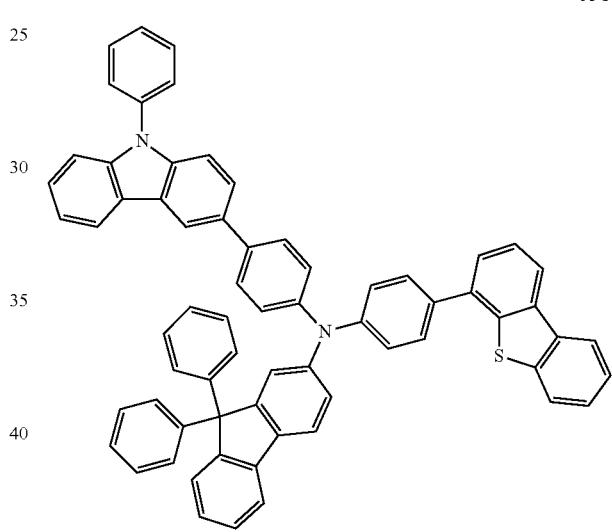
A-17
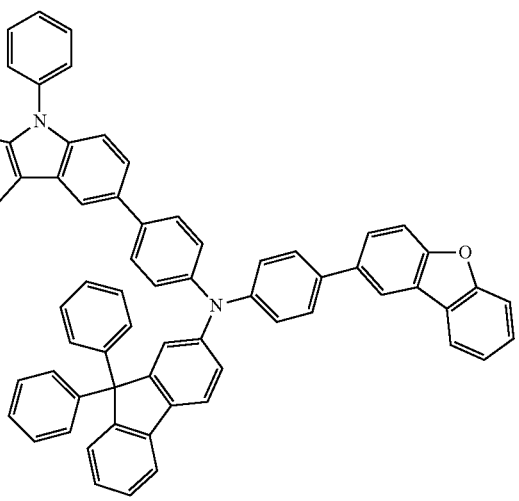

A-18
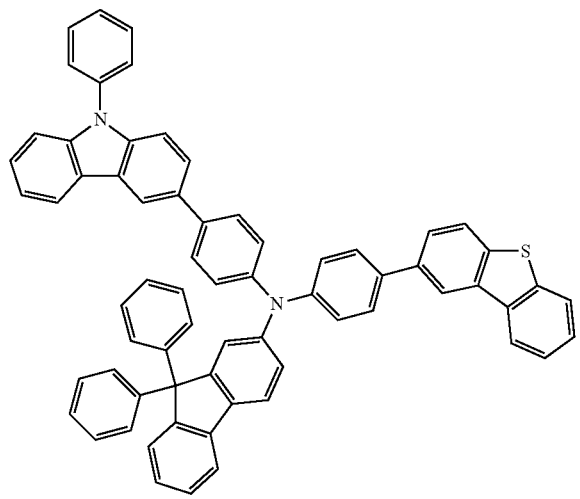
A-20
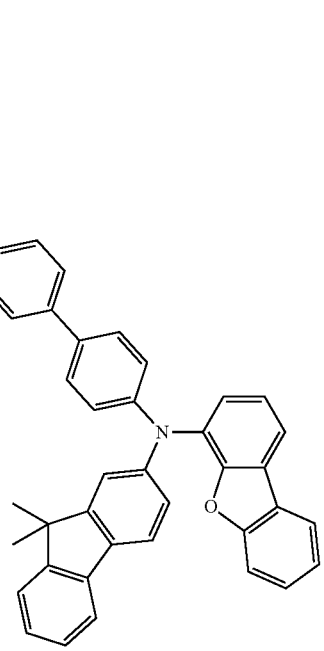
A-19
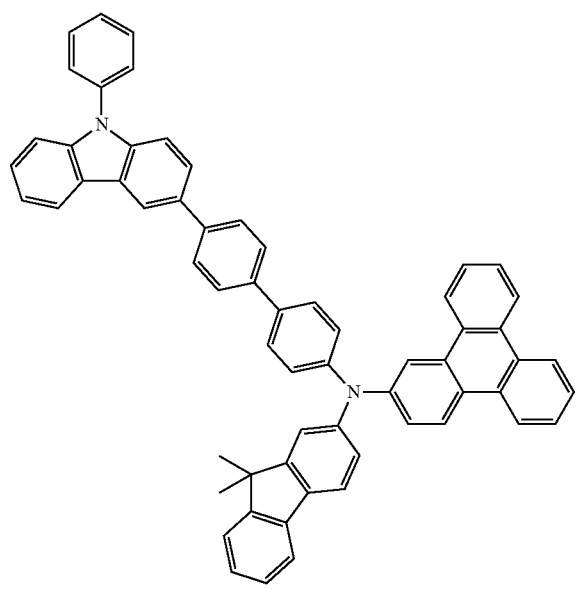
A-21
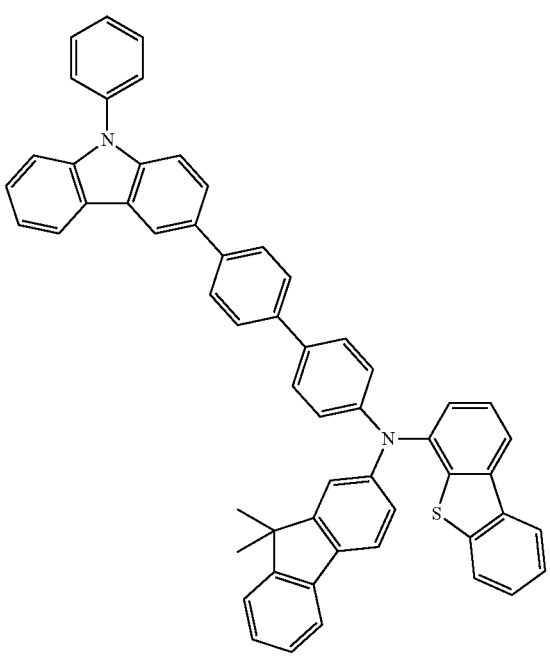

A-22
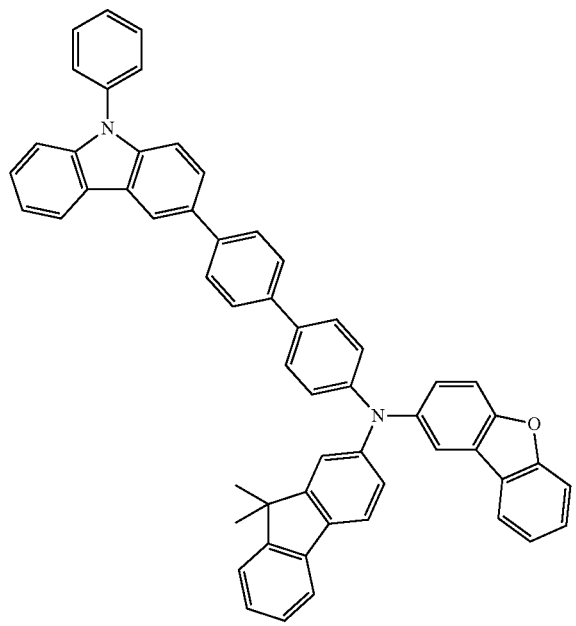
A-23
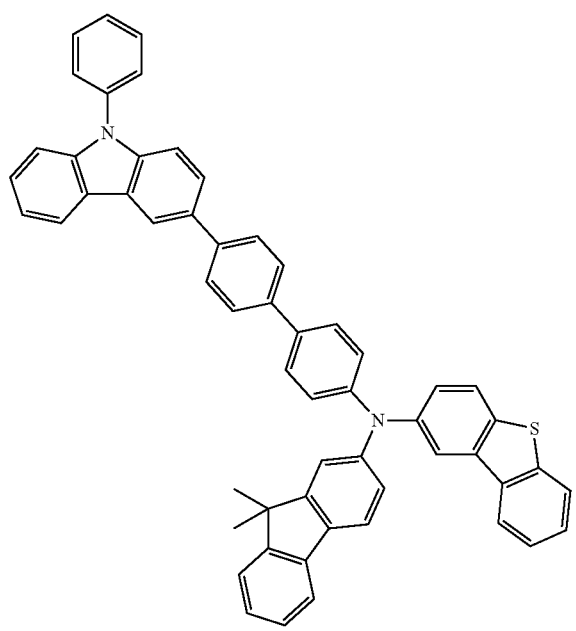
A-24
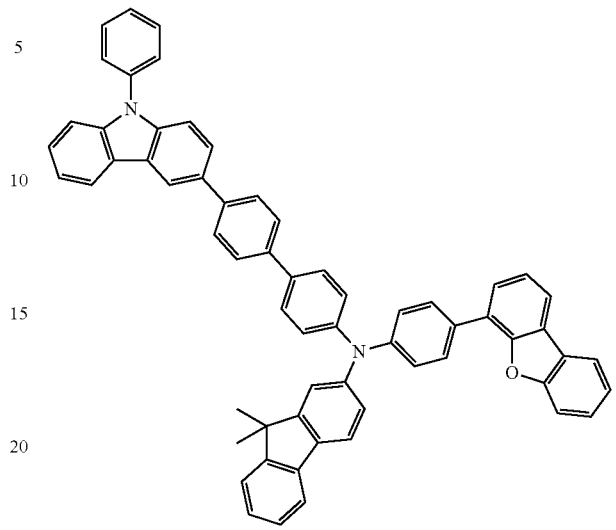
A-25
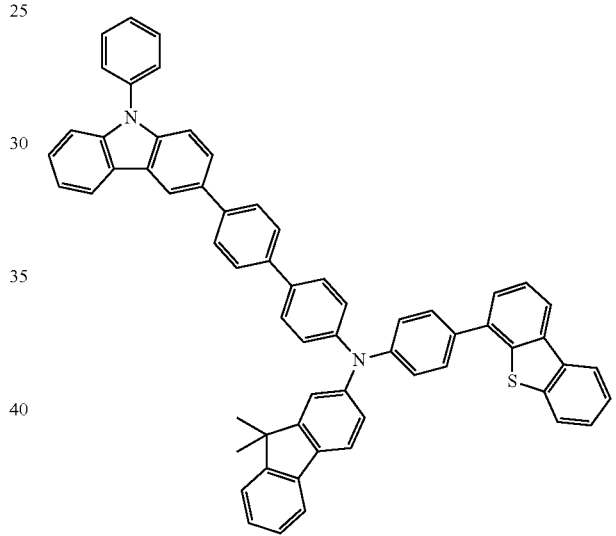
A-26
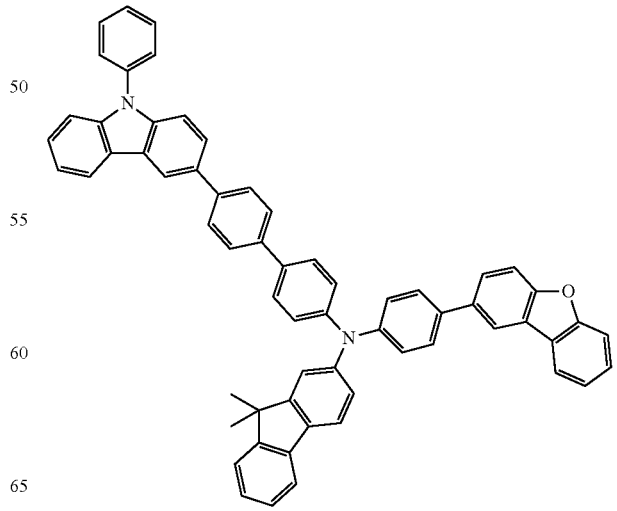

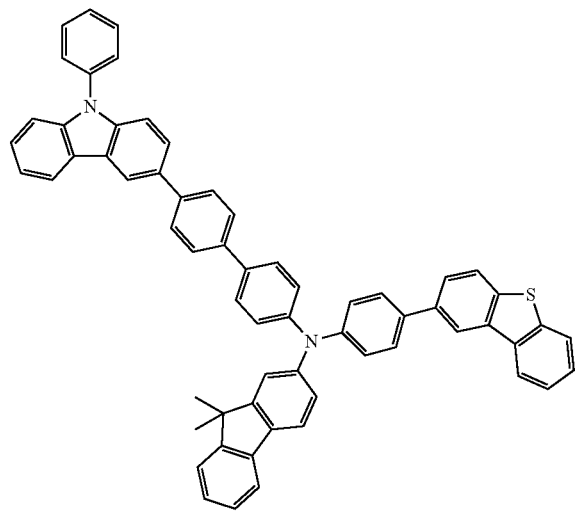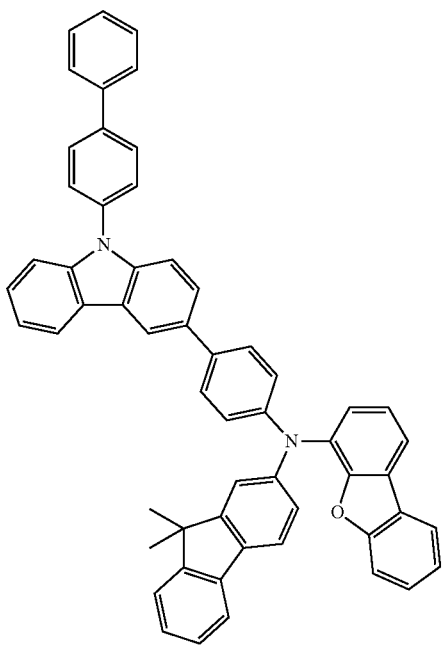

A-31
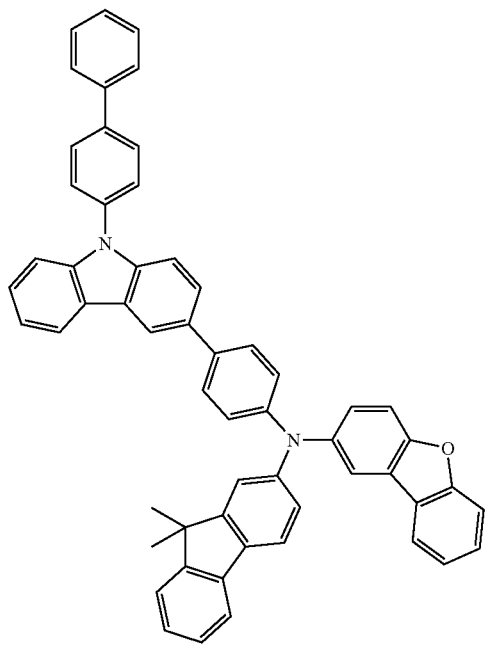
A-32
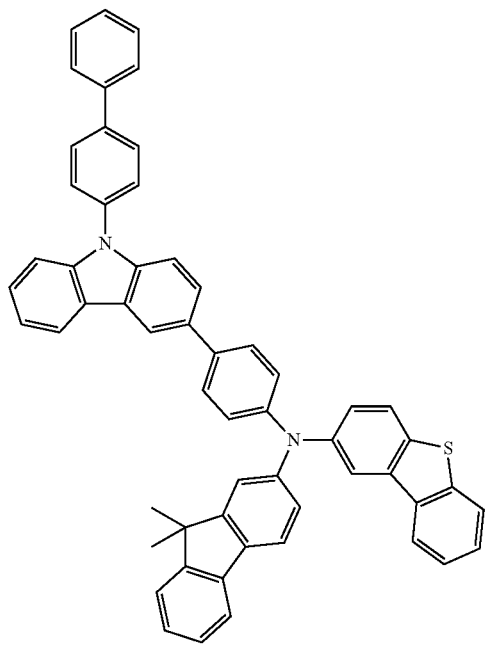
A-33
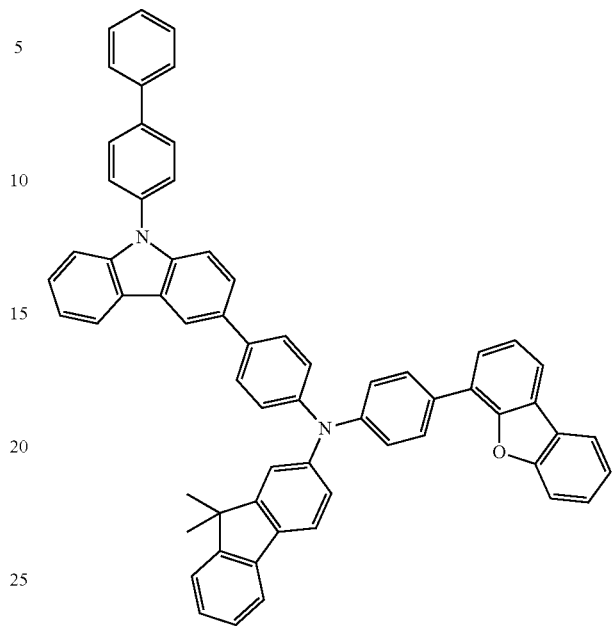
A-34
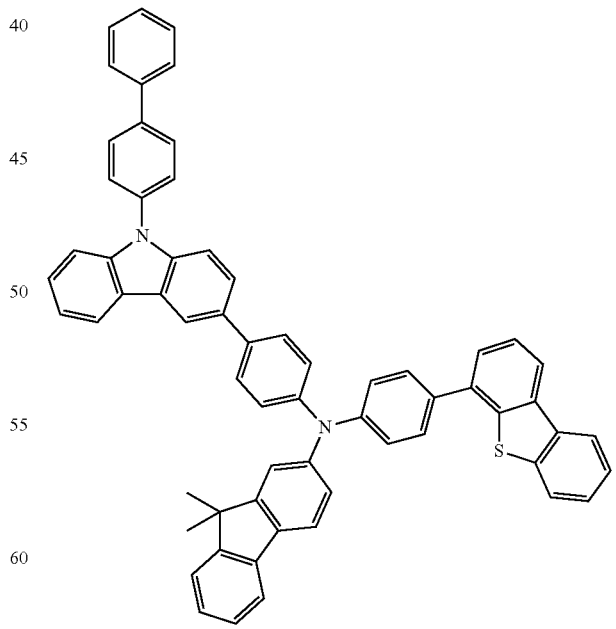

A-35
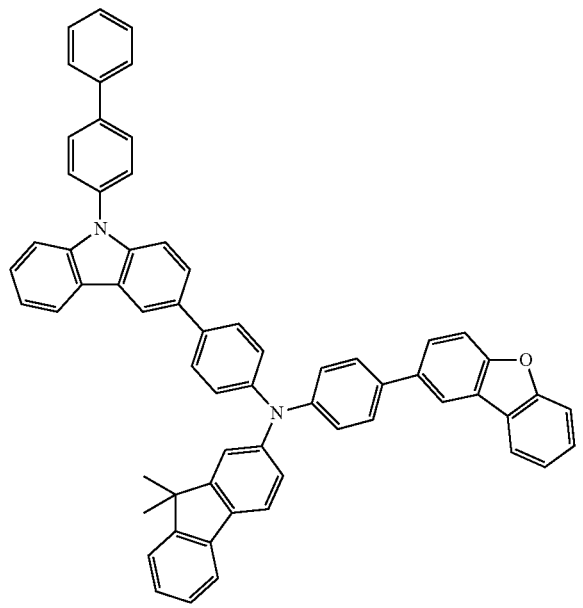
A-37
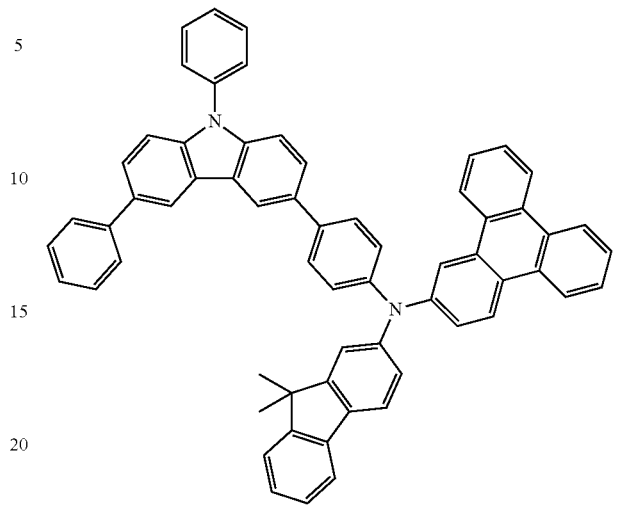
A-36
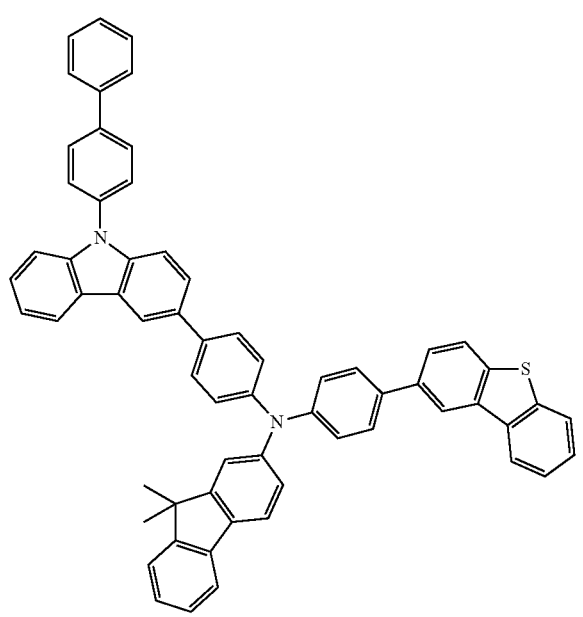
A-38
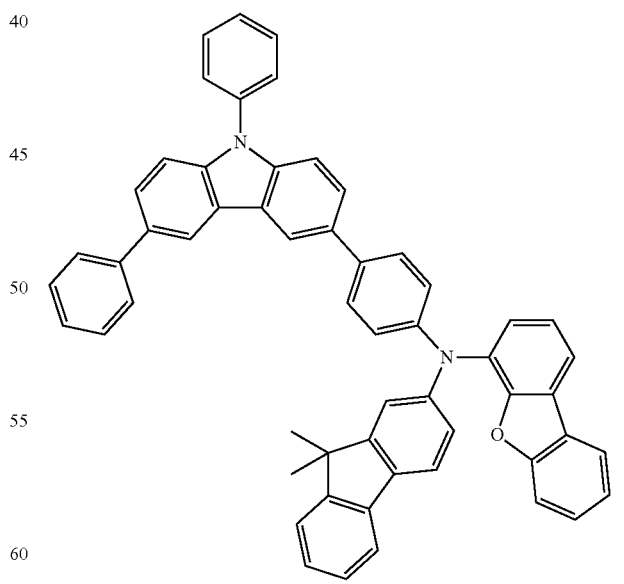

A-39
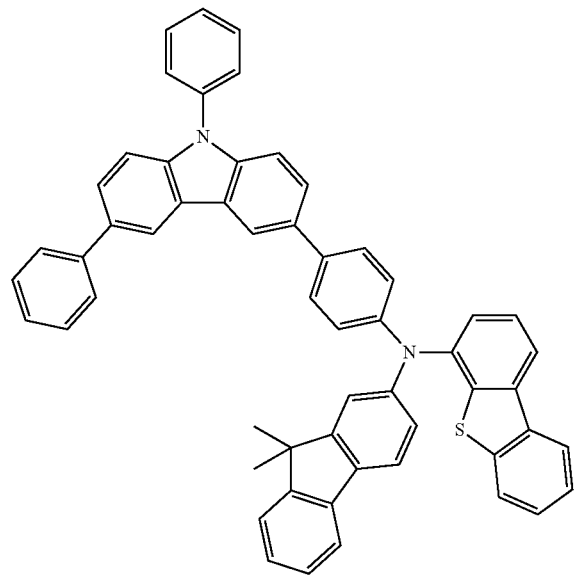
A-40
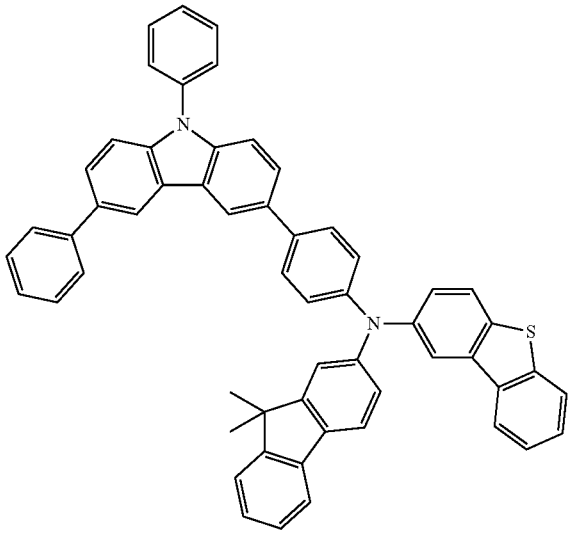
A-41
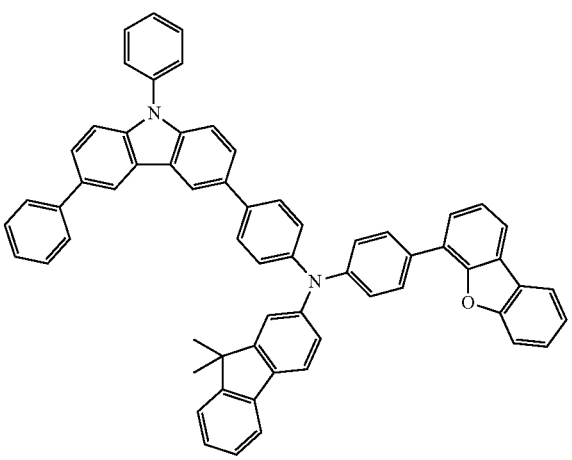
A-42
A-43
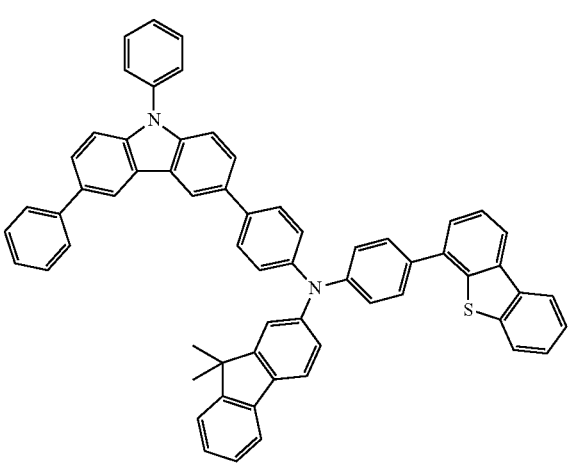

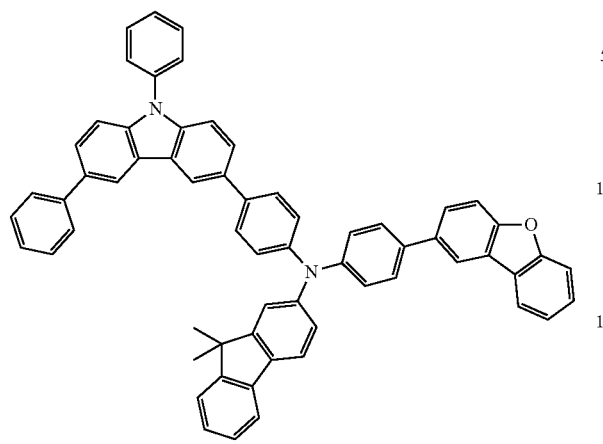
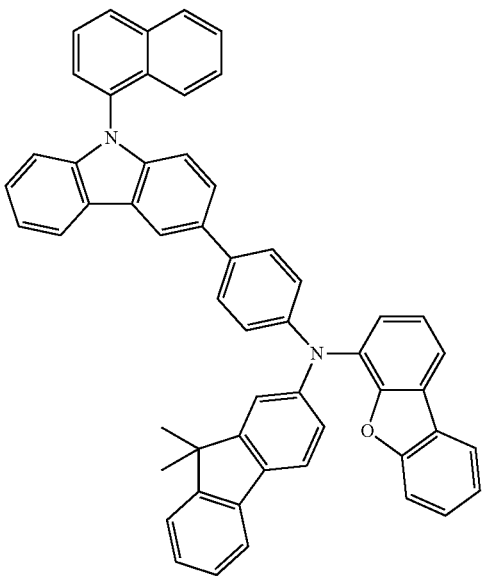

A-49
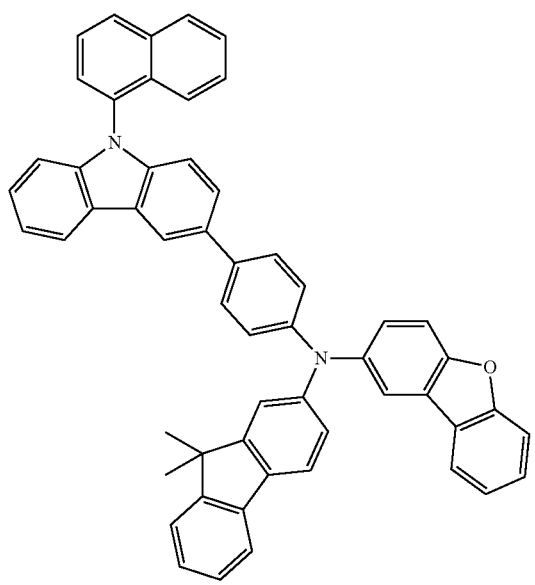
A-50
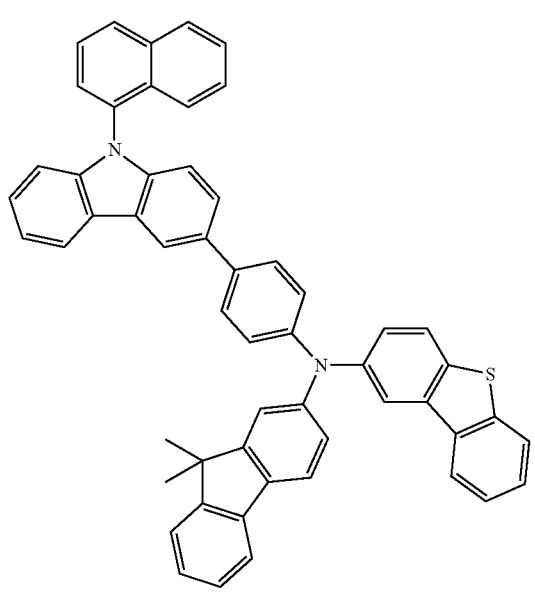
A-51
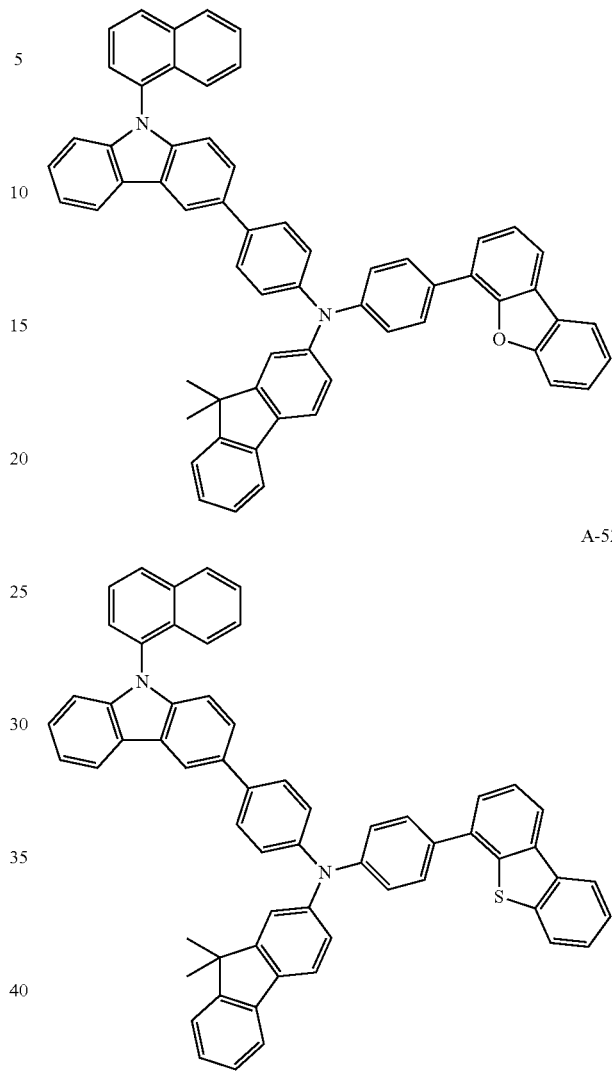
A-52
A-53
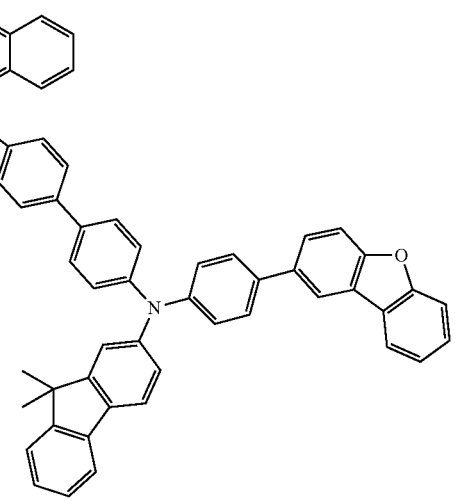

A-54
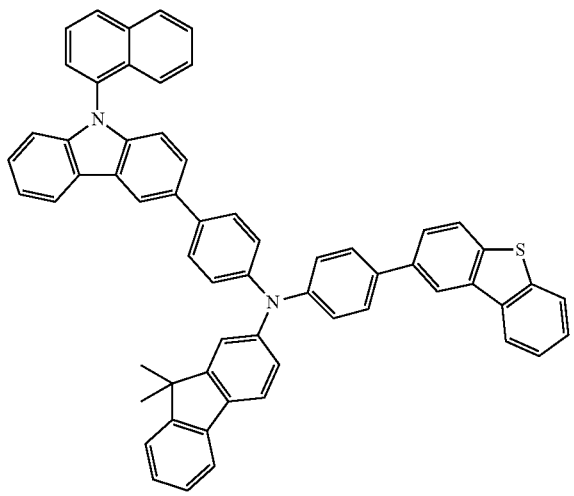
A-57
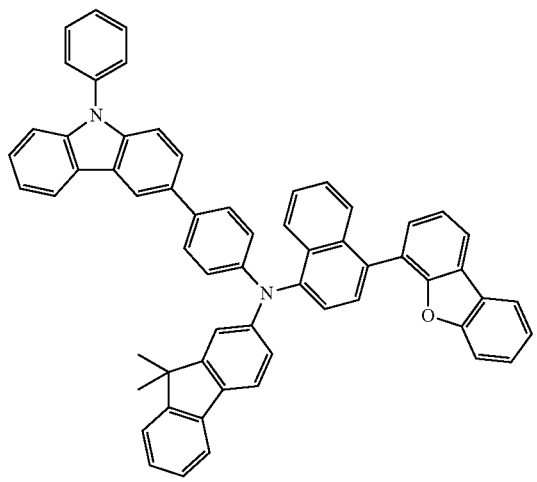
A-55
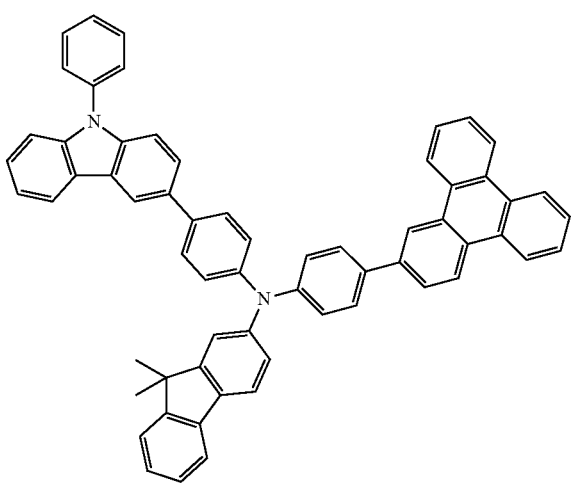
A-58
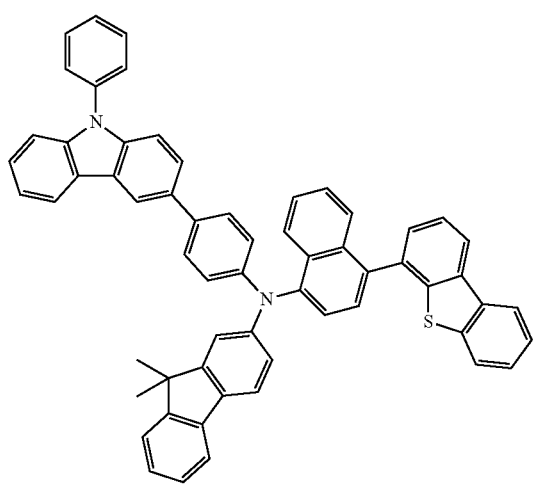
A-56
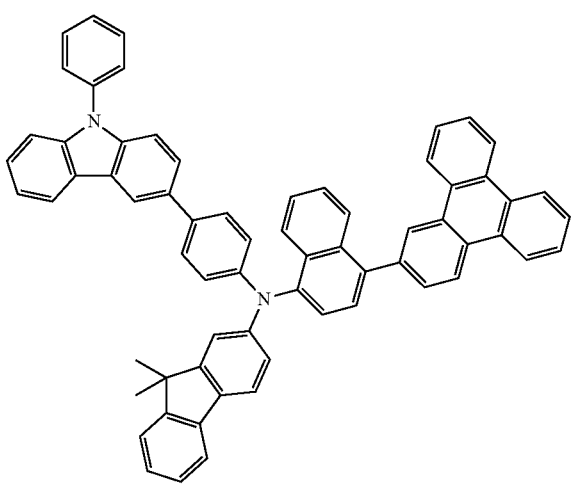
A-59
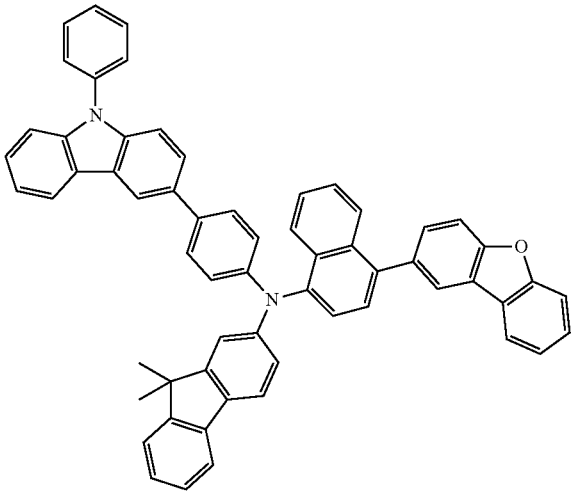

A-60
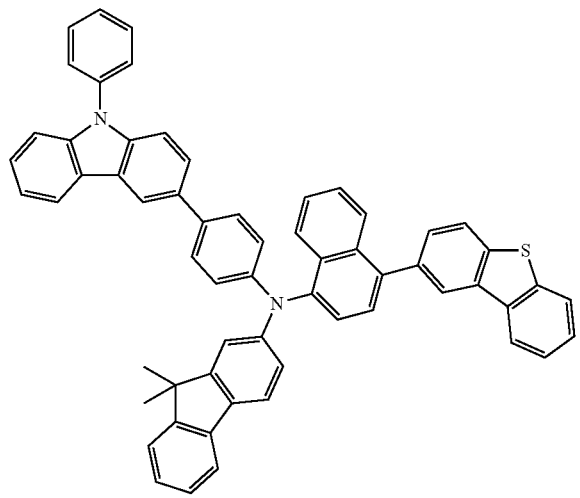
A-61
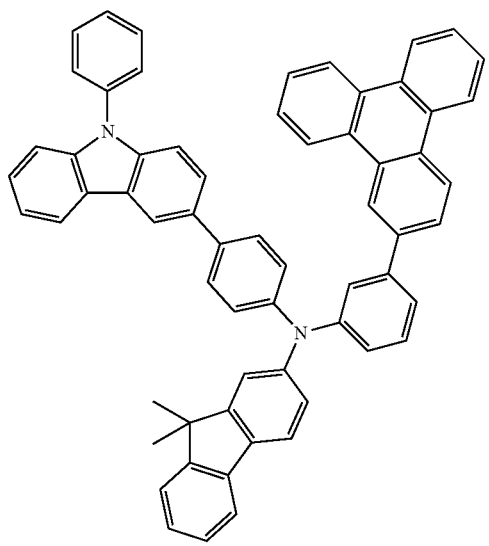
A-62
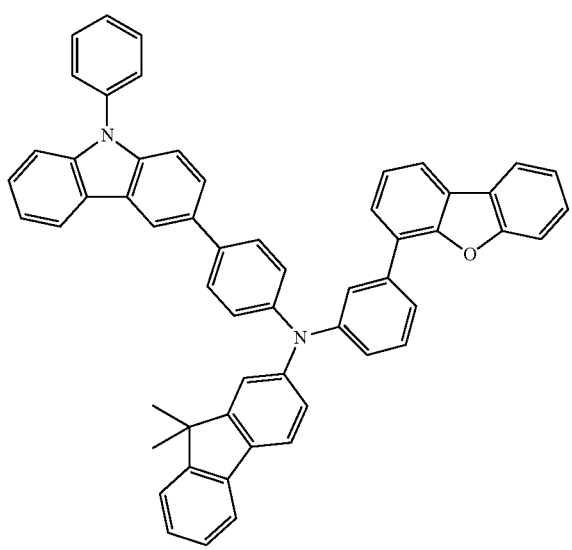
A-63
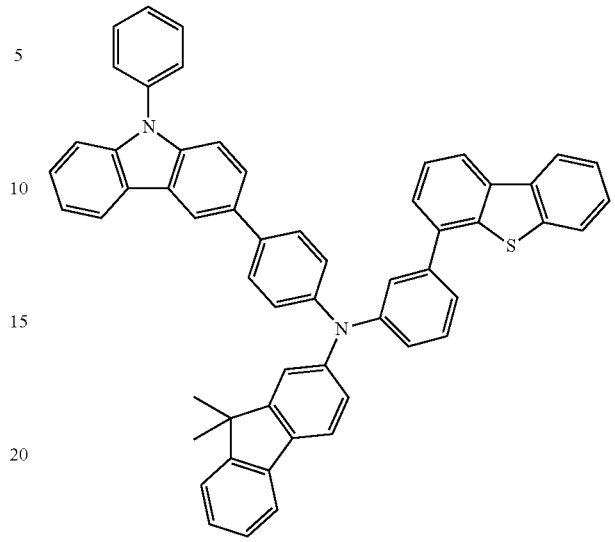
A-64
A-65
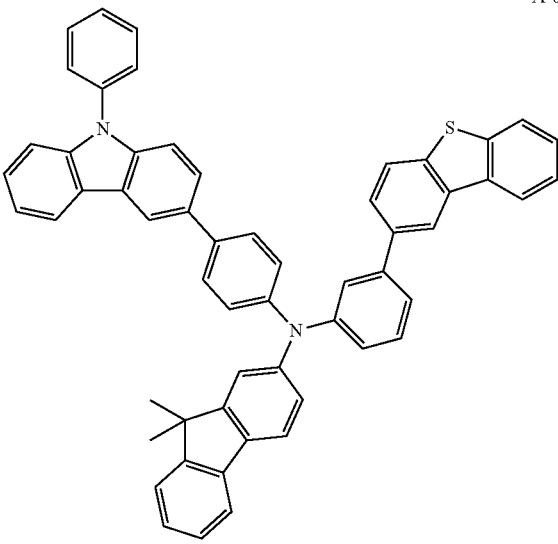

A-66
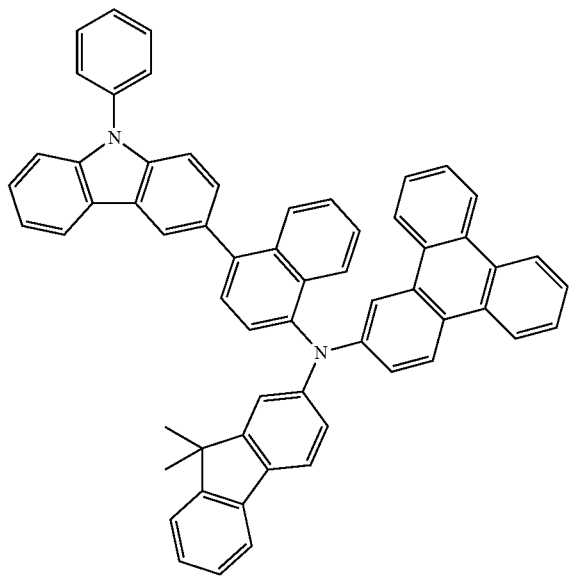
A-69
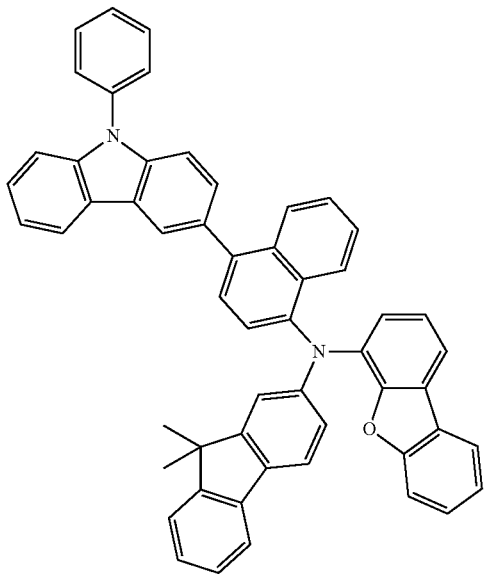
A-67
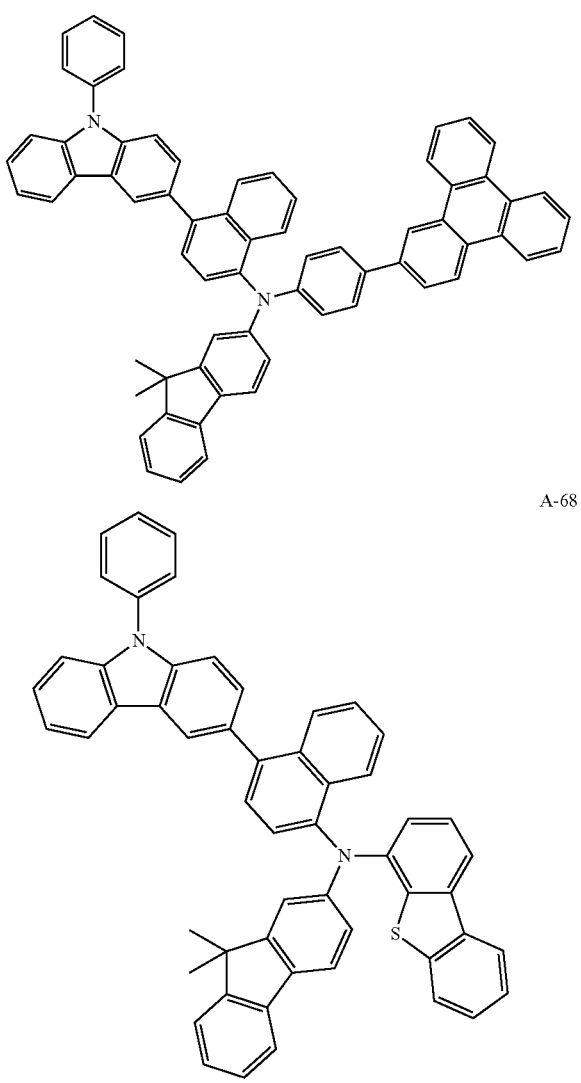
A-68
A-70
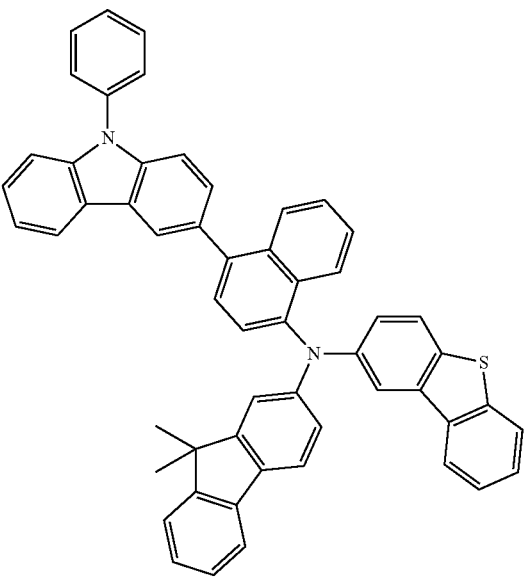

A-71
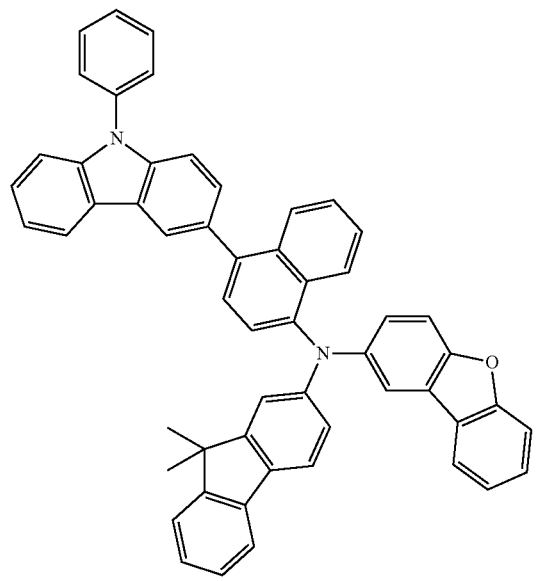
A-72
A-73
A-74
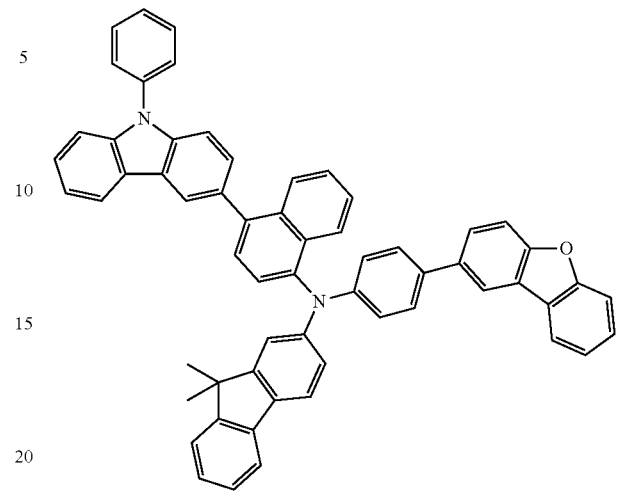
A-75
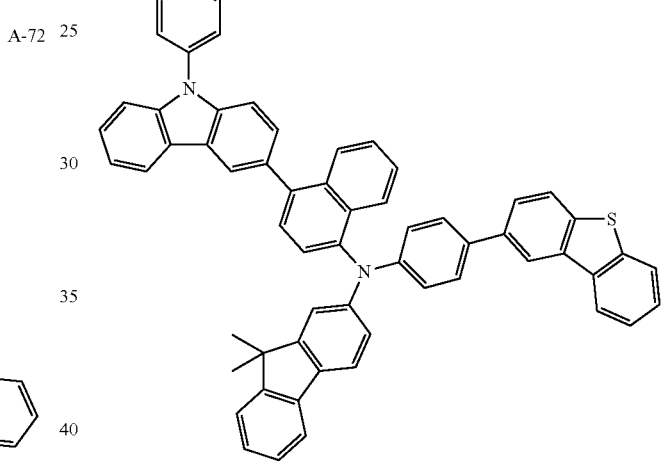
A-76
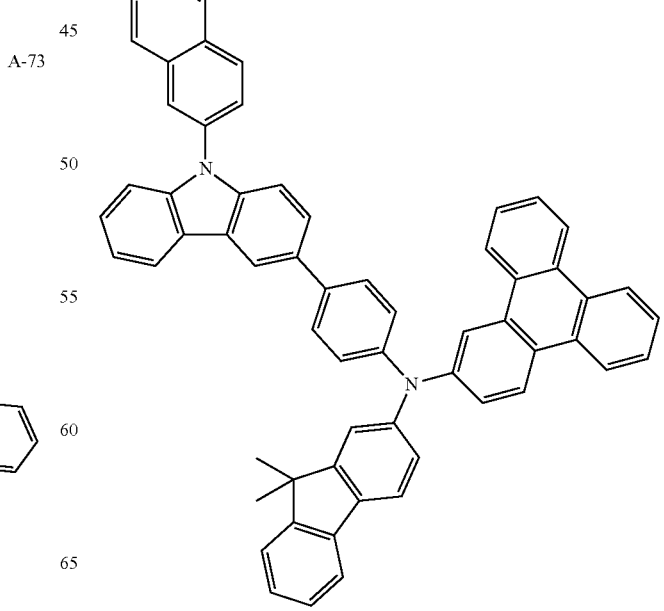

A-77
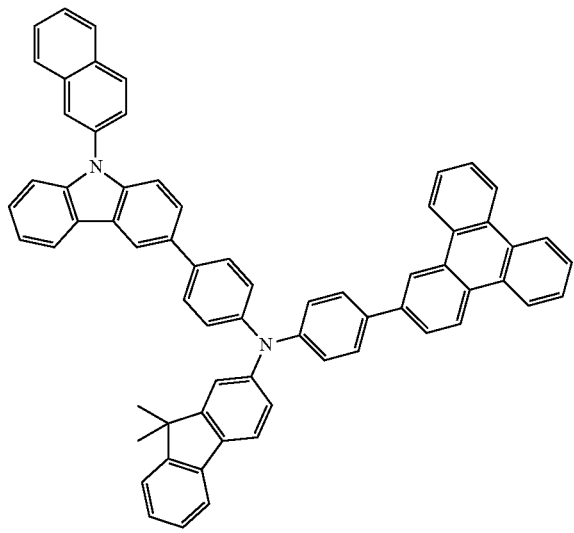
A-78
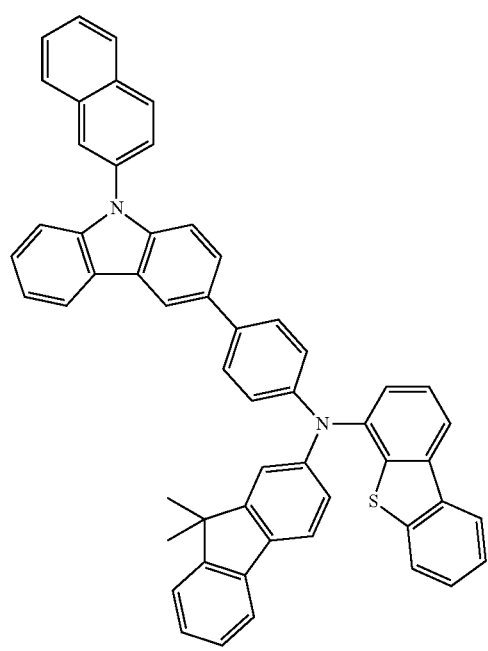
A-79
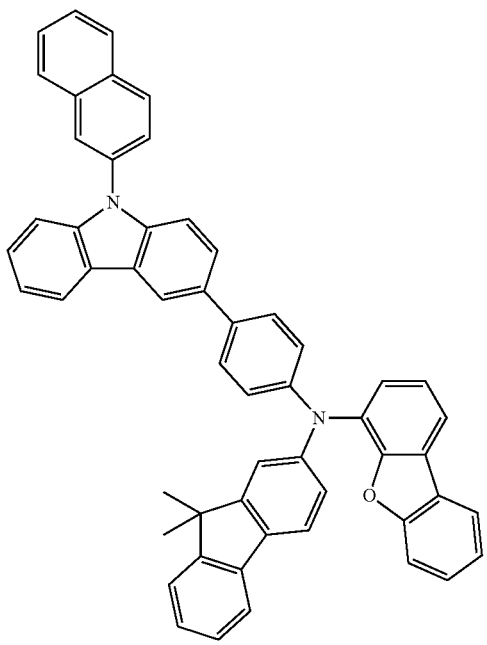
A-80
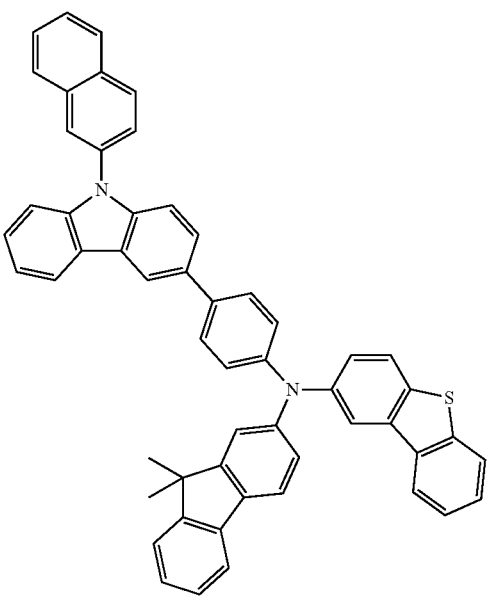

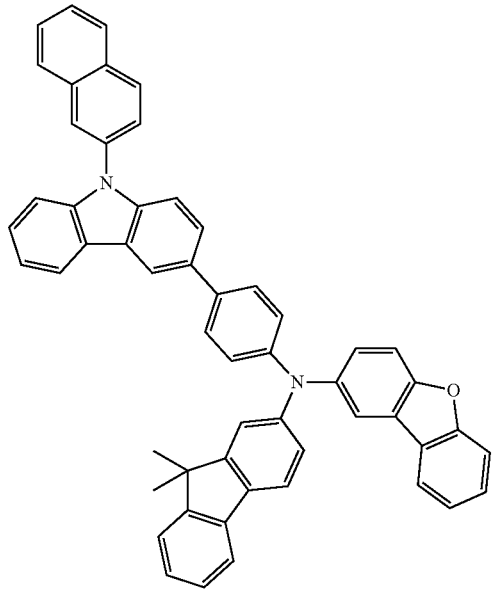
A-81
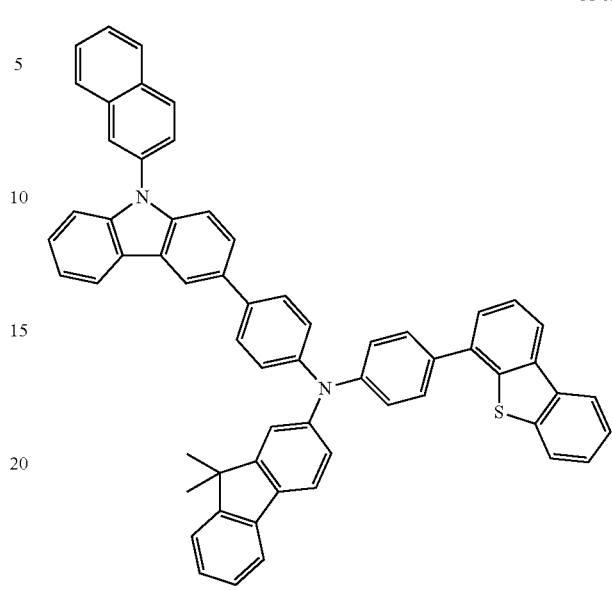
A-83
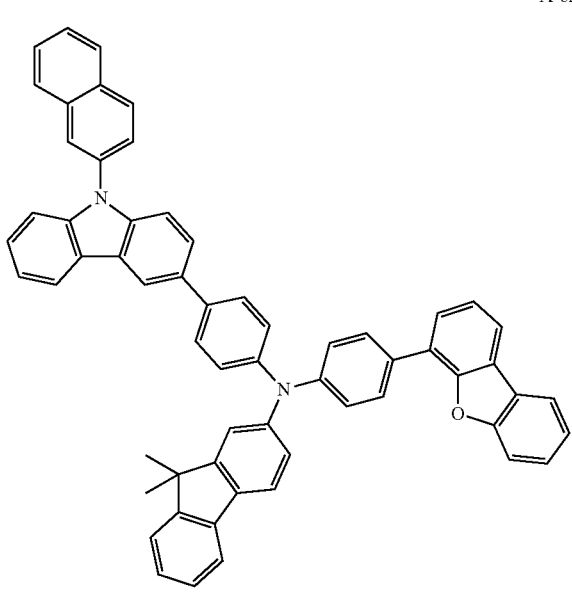
A-82
A-84

-continued
A-85
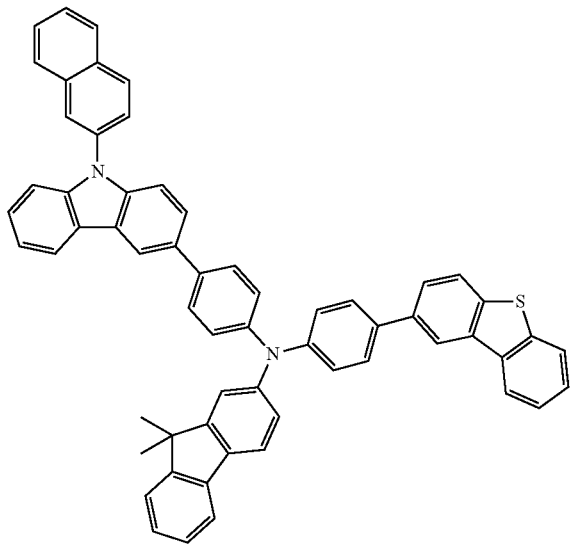
A-86
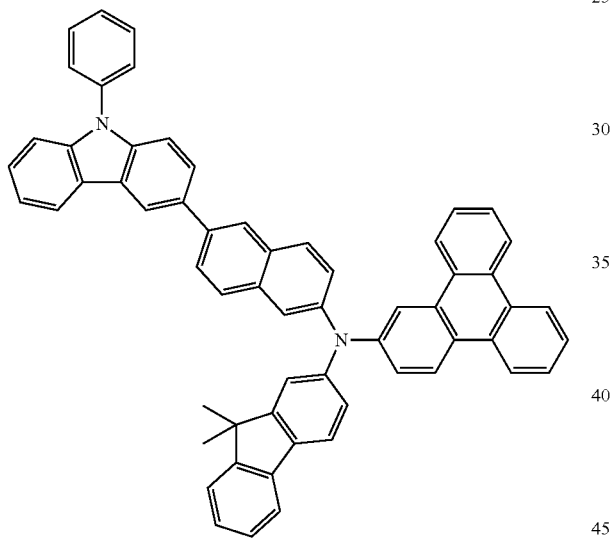
A-87
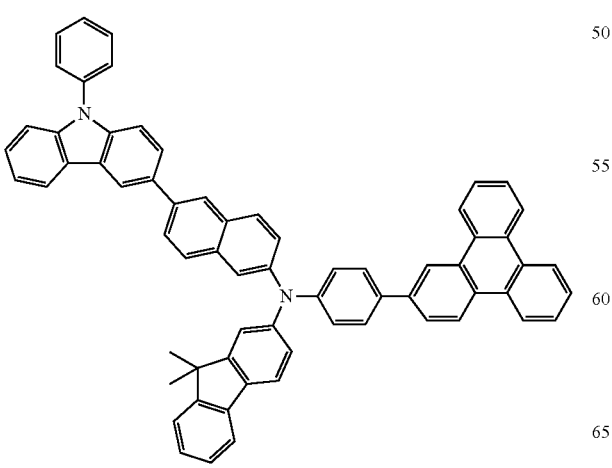
-continued
A-88
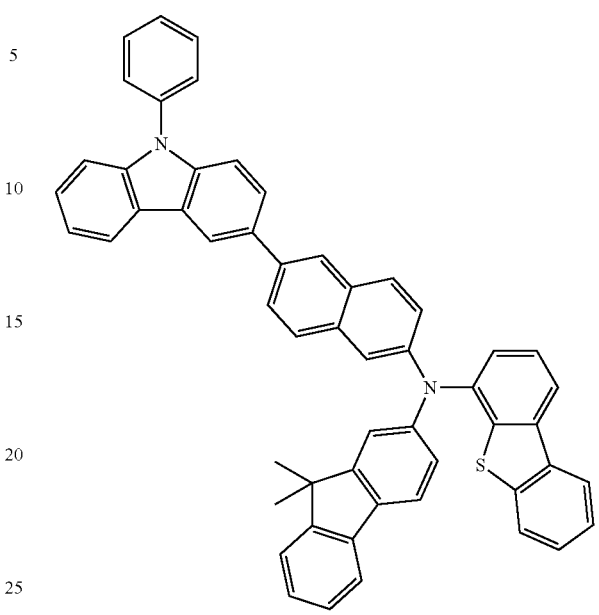
A-89
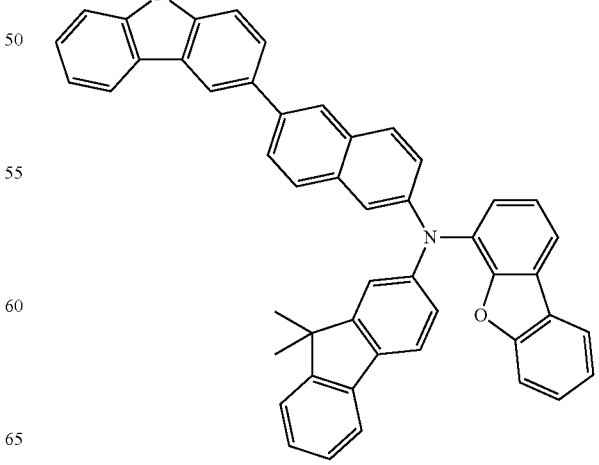

A-90
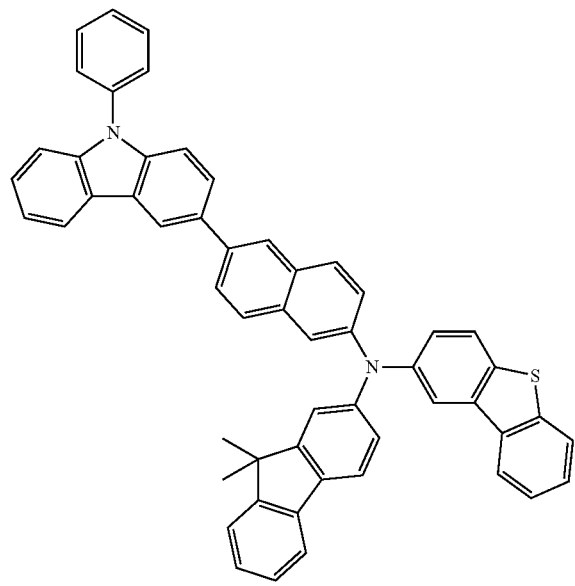
A-91
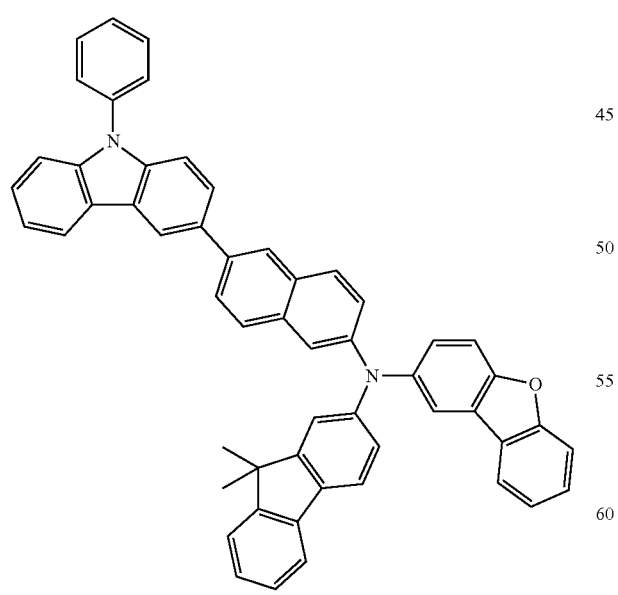
A-92
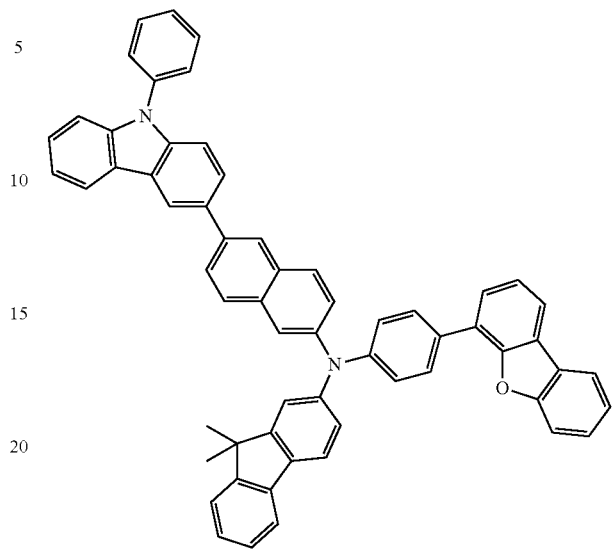
A-93
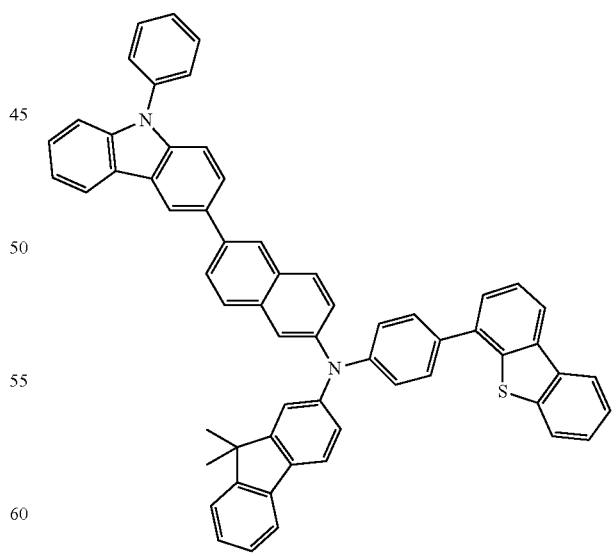

A-94
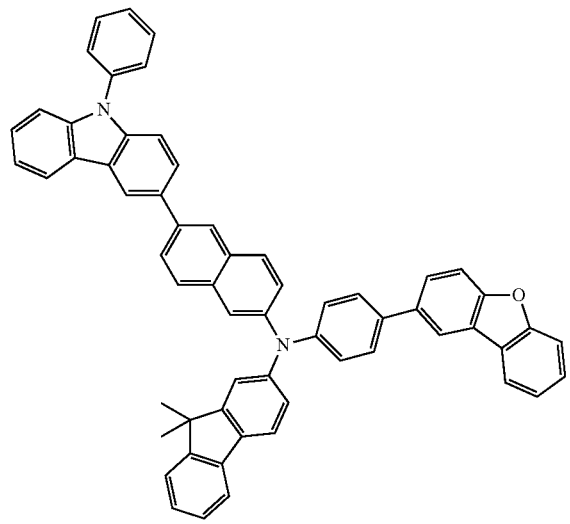
A-95
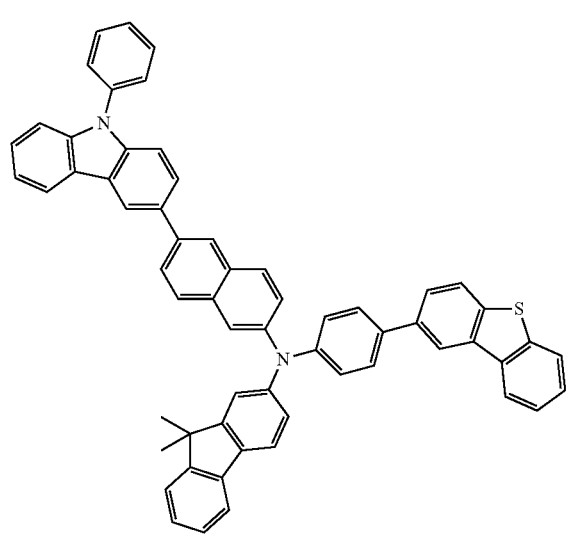
[Chemical Formula B-1]
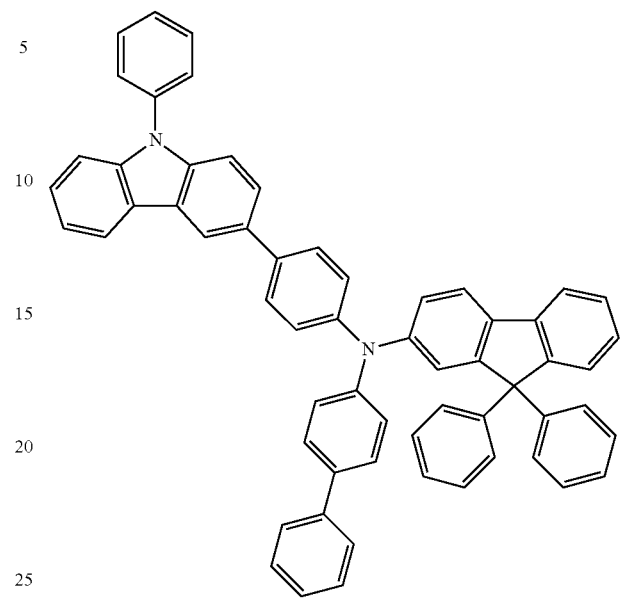
[Chemical Formula B-2]
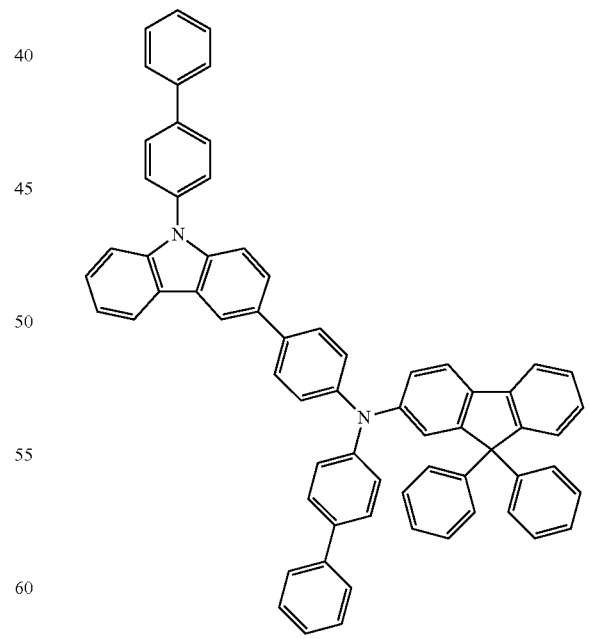
In an implementation, the compound for an organic optoelectronic device may be represented by one of the following Chemical Formulae B-1 to B-6.

[Chemical Formula B-3]

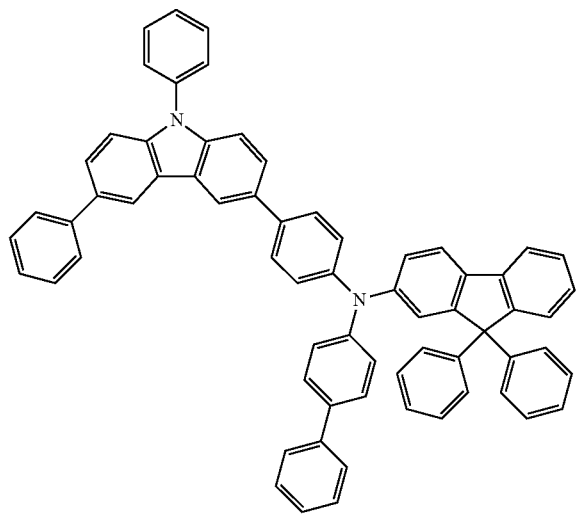

[Chemical Formula B-5]

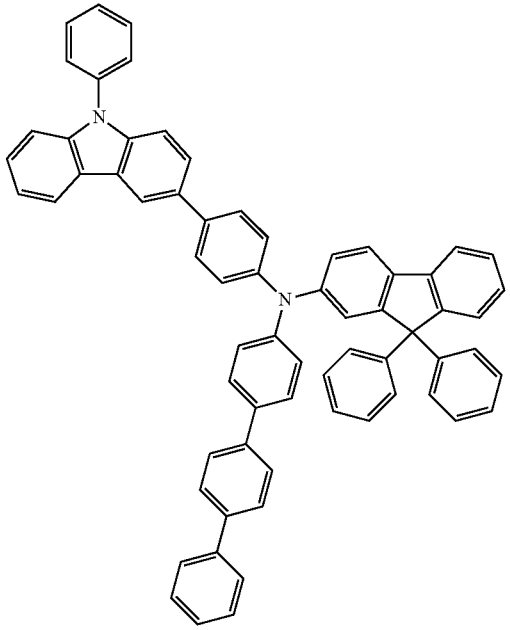

[Chemical Formula B-6]

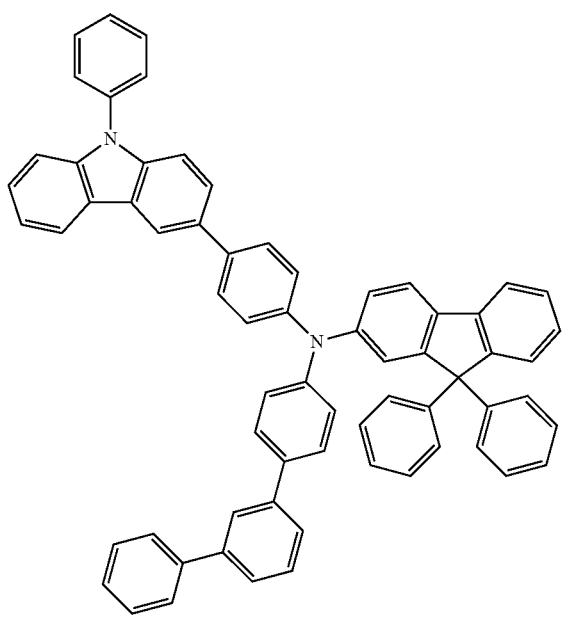

[Chemical Formula B-4]

When the compound having a structure of one of Chemical Formulae A-1 to A-95 and B-1 to B-6 is used to fabricate an organic photoelectric device (e.g., organic light emitting diode), the device may have excellent life-span.

When a compound for an organic optoelectronic device is used to form an electron blocking layer (or a hole transport layer (HTL)), a functional group with electron properties in a molecule may deteriorate electron blocking properties of the electron blocking layer. Accordingly, the compound should not include a functional group with electron properties. Examples of a functional group with electron properties may include benzoimidazole, pyridine, pyrazine, pyrimidine, triazine, quinoline, isoquinoline, and the like. When a compound for an organic optoelectronic device is used for an electron blocking layer or a hole transport layer (HTL) (or a hole injection layer (HIL)), the foresaid description may be limited.

When it is desired that the compound according to an embodiment exhibit both electron properties and hole properties, the functional group with electron properties may be included in the compound to effectively improve life-span of an organic light emitting diode and decrease its driving voltage.

The compound for an organic optoelectronic device according to an embodiment may have a maximum light emitting wavelength of about 320 to 500 nm and a triplet excitation energy (T1) of more than about 2.0 eV, e.g., about 2.0 to about 4.0 eV. Accordingly, the compound with high triplet excitation energy (T1) as a host may effectively transport a charge to a dopant and thus, may increase luminous efficiency of the dopant and also may be freely adjusted according to HOMO and LUMO energy levels and decrease driving voltage of a device. Thus, the compound may be usefully used as a host material or a charge transport material.

In addition, the compound for an organic optoelectronic device may have photoactive and electric activity and thus, may be usefully applied to a non-linear optical material, an electrode material, a discoloring material, an optical switch, a sensor, a module, a wave guide, an organic transistor, a laser, a light-absorbing agent, a dielectric material, a material for a separating membrane, or the like.

The compound for an organic optoelectronic device may have a glass transition temperature of about 90° C. or higher and a thermal decomposition temperature of about 400° C. or higher and thus, may exhibit excellent thermal stability. Accordingly, the compound may provide high efficiency to an organic photoelectric device.

The compound for an organic optoelectronic device according to an embodiment may play a role in emitting light or injecting and/or transporting electrons, and may act as a light emitting host together with a suitable dopant. For example, the compound for an organic optoelectronic device may be used as a phosphorescent or fluorescent host material, a blue light emitting dopant material, or an electron transporting material.

The compound for an organic optoelectronic device according to an embodiment may be used for an organic thin layer. Thus, the life span characteristic, efficiency characteristic, electrochemical stability, and thermal stability of an organic photoelectric device may be improved; and the driving voltage thereof may be decreased.

Another embodiment provides an organic optoelectronic device that includes the compound for an organic optoelectronic device. The organic optoelectronic device may include an organic photoelectronic device, an organic light emitting diode, an organic solar cell, an organic transistor, an organic photosensitive drum, an organic memory device, or the like. For example, the compound for an organic optoelectronic device according to an embodiment may be included in an electrode or an electrode buffer layer in the organic solar cell to improve quantum efficiency. In an implementation, the compound may be used as an electrode material for a gate, a source-drain electrode, or the like in the organic transistor.

Hereinafter, a detailed described relating to the organic light emitting diode will be provided.

An embodiment provides an organic light emitting diode including an anode, a cathode, and at least one organic thin layer between the anode and the cathode. The at least one organic thin layer may include the above-described compound for an organic optoelectronic device according to an embodiment.

The organic thin layer (that may include the compound for an organic optoelectronic device) may include a layer selected from the group of an emission layer, a hole transport layer (HTL), a hole injection layer (HIL), an electron transport layer (ETL), an electron injection layer (EIL), a hole blocking film, and a combination thereof. The at least one layer may include the compound for an organic optoelectronic device according to an embodiment. For example, the electron transport layer (ETL) or the electron injection layer (EIL) may include the compound for an organic optoelectronic device. When the compound for an organic optoelectronic device is included in the emission layer, the compound may be included as a phosphorescent or fluorescent host or as a fluorescent blue dopant material.

FIGS. 1 to 5 illustrate cross-sectional views of organic light emitting diodes including the compound for an organic optoelectronic device according to an embodiment.

Referring to FIGS. 1 to 5, organic light emitting diodes 100, 200, 300, 400, and 500 may include at least one organic thin layer 105 between an anode 120 and a cathode 110.

The anode 120 may include an anode material laving a large work function to facilitate hole injection into an organic thin layer. The anode material may include, e.g., a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or SnO$_2$:Sb; or a conductive polymer such as poly(3-methylthiophene), poly[3,4-(ethylene-1,2-dioxy)thiophene] (PEDT), polypyrrole, and polyaniline, but is not limited thereto. In an implementation, the anode 120 may include a transparent electrode including indium tin oxide (ITO).

The cathode 110 may include a cathode material having a small work function to facilitate electron injection into an organic thin layer. The cathode material may include, e.g., a metal such as magnesium, calcium, sodium, potassium, titanium, indium, yttrium, lithium, gadolinium, aluminum, silver, tin, lead, cesium, barium, and the like, or alloys thereof; or a multi-layered material such as LiF/Al, LiO$_2$/Al, LiF/Ca, LiF/Al, and BaF$_2$/Ca, but is not limited thereto. In an implementation, the cathode 110 may include a metal electrode including aluminum.

Referring to FIG. 1, the organic light emitting diode 100 may include an organic thin layer 105 including only an emission layer 130.

Figure 2:
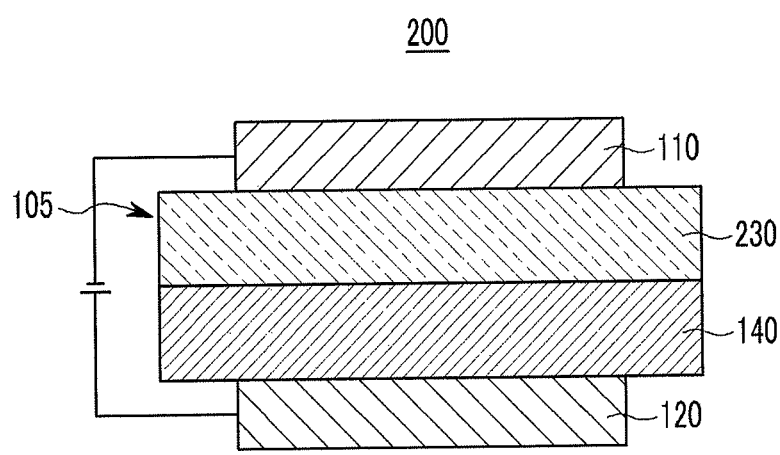

Referring to FIG. 2, the organic light emitting diode 200 may include the emission layer 230 (which may also function as an electron transport layer (ETL)) and a hole transport layer (HTL) 140 layer (that has an excellent binding property with a transparent electrode such as ITO or an excellent hole transporting property).

Figure 3:
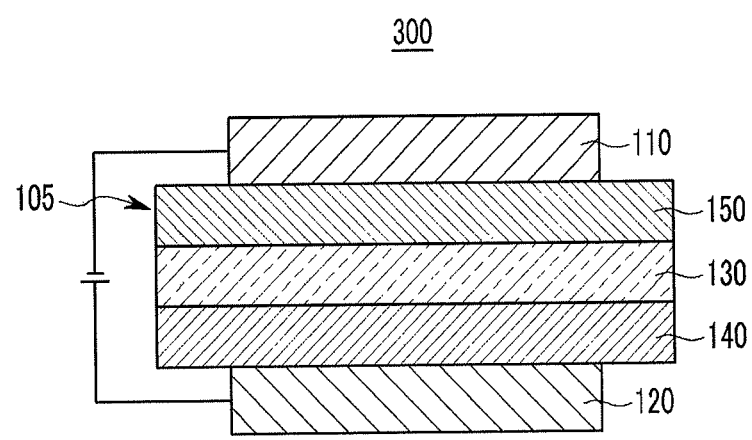

Referring to FIG. 3, a three-layered organic light emitting diode 300 may include an organic thin layer 105 including an electron transport layer (ETL) 150, an emission layer 130, and a hole transport layer (HTL) 140. The emission layer 130 may be independently installed; and layers having an excellent electron transporting property or an excellent hole transporting property may be separately stacked.

Figure 4:
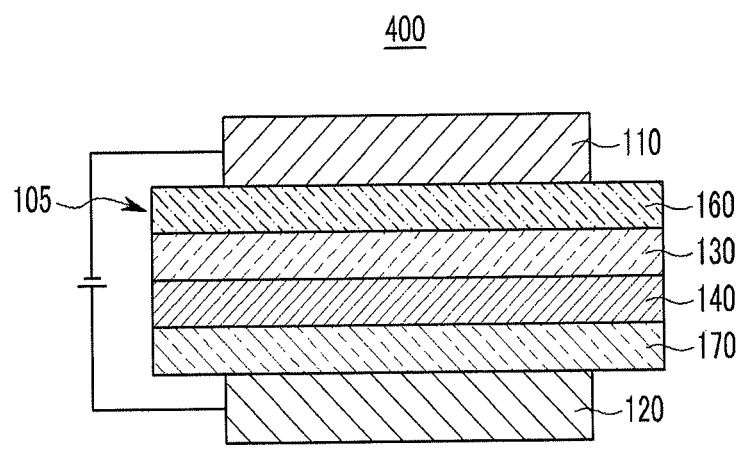

Referring to FIG. 4, a four-layered organic light emitting diode 400 may include an organic thin layer 105 including an electron injection layer (EIL) 160, an emission layer 130, a hole transport layer (HTL) 140, and a hole injection layer (HIL) 170 for binding with the anode 120 of ITO.

Figure 5:
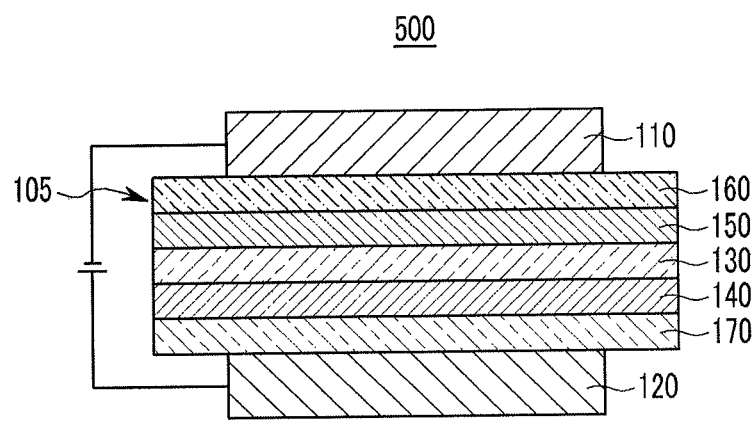

Referring to FIG. 5, a five-layered organic light emitting diode 500 may include an organic thin layer 105 including an electron transport layer (ETL) 150, an emission layer 130, a hole transport layer (HTL) 140, and a hole injection layer (HIL) 170, and may further include an electron injection layer (EIL) 160 to achieve a low voltage.

In FIG. 1 to FIG. 5, the organic thin layer 105 (including at least one selected from the group of an electron transport layer (ETL) 150, an electron injection layer (EIL) 160, an emission layer 130 and 230, a hole transport layer (HTL) 140, a hole injection layer (HIL) 170, and combinations thereof) may include the compound for an organic optoelectronic device according to an embodiment. The compound for an organic optoelectronic device may be used for an electron transport layer (ETL) 150 or electron injection layer (EIL) 160. When the compound is included in the electron transport layer (ETL), it is possible to provide an organic light emitting diode having a simpler structure because an additional hole blocking layer (not shown) may be omitted.

When the compound for an organic optoelectronic device is included in the emission layer 130 and 230, the compound may be included as a phosphorescent or fluorescent host or a fluorescent blue dopant.

The organic light emitting diode may be fabricated by, e.g., forming an anode on a substrate; forming an organic thin layer (in accordance with a dry coating method such as evaporation, sputtering, plasma plating, and ion plating, or a wet coating method such as spin coating, dipping, and flow coating); and providing a cathode thereon.

Another embodiment provides a display device including the organic light emitting diode according to an embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Preparation of Compound for an Organic Optoelectronic Device

Synthesis of Intermediates

Synthesis of Intermediate M-1

[Reaction Scheme 1]

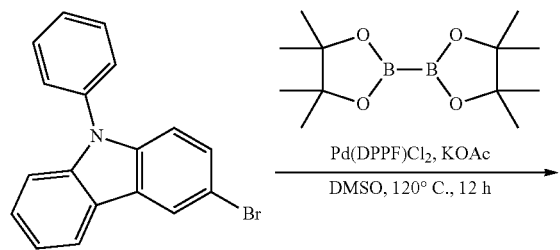

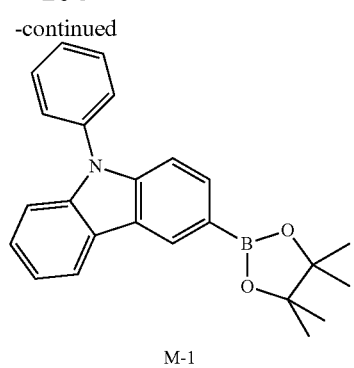

M-1

50 g (155.18 mmol) of 3-bromo-9-phenyl-9H-carbazole, 3.41 g (4.65 mmol) of Pd(dppf)Cl$_2$, 51.32 g (201.8 mmol) of bis(pinacolato)diboron, and 45.8 g (465.5 mmol) of potassium acetate were dissolved in 520 ml of DMSO.

The reactant was refluxed and agitated under a nitrogen atmosphere for 12 hours and then extracted three times with dichloromethane and distilled water. The extracted solution was dried with magnesium sulfate, filtered, and then concentrated under a reduced pressure.

The product was purified through silica gel column chromatography by using n-hexane/dichloromethane mixed in a volume ratio of 7:3, obtaining a desired compound, an intermediate M-1, as 43 g of a white solid (yield: 75%).

LC-Mass (theoretical value: 369.19 g/mol, measured value: M+1=370 g/mol),

Synthesis of Intermediate M-2

[Reaction Scheme 2]

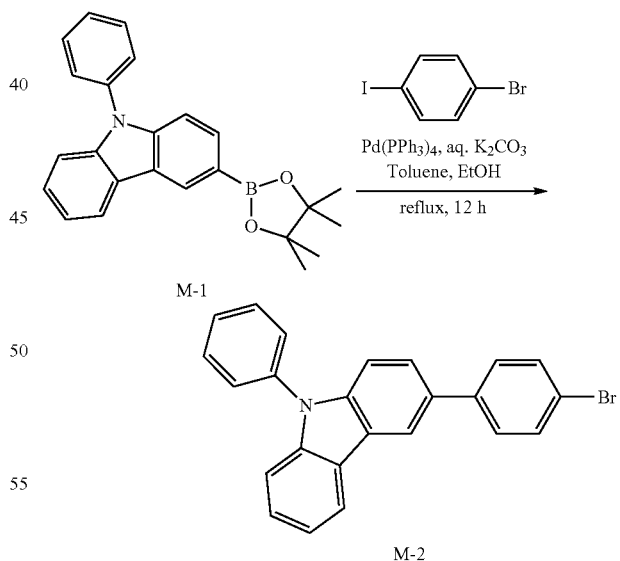

40 g (108.3 mmol) of the intermediate M-1, 30.6 g (108.3 mmol) of 1-bromo-4-iodobenzene, and 1.25 g (1.08 mmol) of tetrakis(triphenylphosphine) palladium were provided in a flask and dissolved in 270 ml of toluene and 135 ml of ethanol under a nitrogen atmosphere. 135 ml of an aqueous solution prepared by dissolving 31.9 g (58.9 mmol) of potassium carbonate was added thereto. The mixture was refluxed and agitated for 12 hours.

After the reaction, the resulting product was extracted with ethyl acetate. The extracted solution was dried with magnesium sulfate, filtered, and then concentrated under a reduced pressure.

Then, the product was purified through silica gel column chromatography by using n-hexane/dichloromethane in a volume ratio of 7:3, obtaining a desired compound, an intermediate M-2, as 35 g of a white solid (yield: 81%).

LC-Mass (theoretical value: 398.29 g/mol, measured value: M+1=399 g/mol)

Synthesis of Intermediate M-3

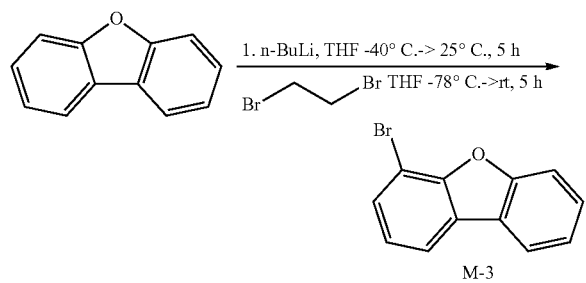

10 g (59.5 mmol) of dibenzofuran was put in a two-necked round-bottomed flask heated and dried under vacuum; and 119 ml of anhydrous tetrahydrofuran was added thereto under a nitrogen atmosphere to dissolve the dibenzofuran. The solution was cooled down to −40° C. and agitated.

Next, 26 ml of 2.5M n-butyllithium (in 65.5 mmol of hexane) was slowly added to the agitated reactant and agitated again at room temperature (~25° C.) under a nitrogen atmosphere for 5 hours. The reactant solution was cooled down to −78° C.; and a solution prepared by dissolving 22.4 g (119 mmol) of dibromoethane in 10 ml of anhydrous tetrahydrofuran was slowly added thereto. The mixture was agitated at room temperature for 5 hours.

When the reaction was complete, the agitated solution was concentrated under a reduced pressure to remove a solvent therein. The resulting product was extracted with distilled water and dichloromethane. The extraction solution was dried with magnesium sulfate, filtered, and then concentrated under a reduced pressure. The reactant solution was recrystallized with n-hexane, obtaining a desired compound, an intermediate M-3, as 11 g of a white solid (yield: 75%).

GC-Mass (theoretical value: 245.97 g/mol, measured value: 246 g/mol)

Synthesis of Intermediate M-4

[Reaction Scheme 4]

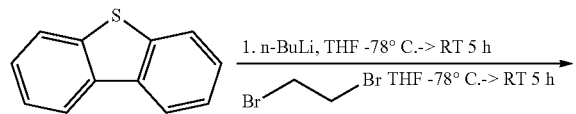

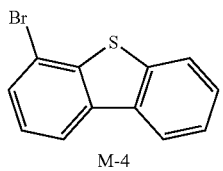

10 g (54.3 mmol) of dibenzothiophene was put in a two-necked round-bottomed flask heated and dried under vacuum; and 120 ml of anhydrous tetrahydrofuran was added thereto to dissolve the dibenzothiophene. The solution was cooled down to −78° C. and agitated.

Then, 24 ml of 2.5M n-butyllithium (in 59.7 mmol of hexane) was slowly added to the resulting product. The mixture was agitated at room temperature under a nitrogen atmosphere for 5 hours. The reactant solution was cooled down to −78° C.; and 20.4 g (108.6 mmol) of 1,2-dibromoethane dissolved in 10 ml of anhydrous tetrahydrofuran was slowly added thereto. The resulting mixture was agitated at room temperature for 5 hours.

When the reaction was complete, the agitated solution was concentrated under a reduced pressure to remove solvent and then extracted with distilled water and dichloromethane. The extracted solution was dried with magnesium sulfate, filtered, and then concentrated again under a reduced pressure. The reactant solution was recrystallized with n-hexane, obtaining a desired compound, an intermediate M-4, as 11 g of a white solid (yield: 77%).

GC-Mass (theoretical value: 261.95 g/mol, measured value: 262 g/mol)

Synthesis of Intermediate M-5

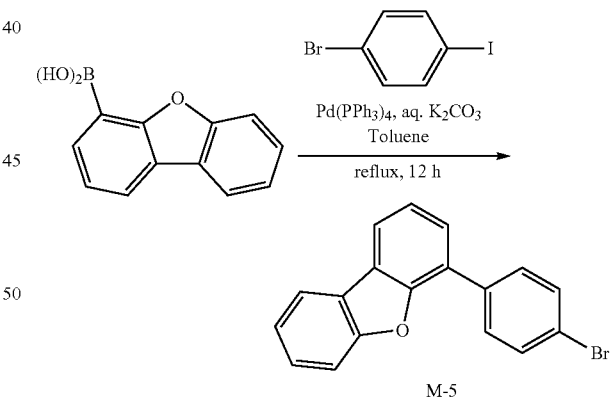

20 g (94.4 mmol) of 4-dibenzofuranboronic acid), 28 g (99.2 mmol) of 1-bromo-4-iodobenzene, and 1.08 g (0.94 mmol) of tetrakis(triphenylphosphine) palladium were provided in a flask; and 120 ml of an aqueous solution prepared by dissolving 28 g (188.8 mmol) of potassium carbonate in 240 ml of toluene under a nitrogen atmosphere was added thereto. The mixture was refluxed for 12 hours.

When the reaction was complete, the resulting reactant was extracted with ethyl acetate, dried with magnesium sulfate, filtered, and then concentrated under a reduced pressure. The resulting product was purified through silica gel column chromatography by using n-hexane/dichloromethane mixed in a volume ratio of 9:1, obtaining a desired compound, an intermediate M-5, as 27 g of a white solid (yield: 89%).

LC-Mass (theoretical value: 322.00 g/mol, measured value: M+1=323 g/mol)

Synthesis of Intermediate M-6

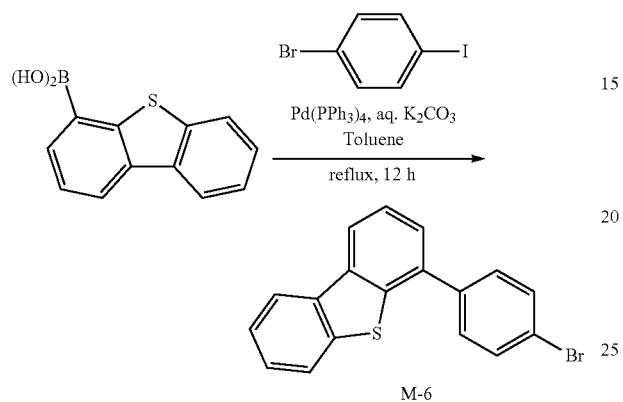

20 g (87.69 mmol) of 4-dibenzothiopheneboric acid, 27.3 g (96.46 mmol) of 1-bromo-4-iodobenzene, and 1.01 g (0.88 mmol) of tetrakis(triphenylphosphine) palladium were put in a flask and dissolved in 220 ml of toluene under a nitrogen atmosphere. 110 ml of an aqueous solution prepared by dissolving 25.8 g (175.4 mmol) of potassium carbonate was added thereto. The mixture was refluxed for 12 hours.

When the reaction was complete, the reactant was extracted with ethyl acetate. The extracted solution was dried with magnesium sulfate, filtered, and then concentrated under a reduced pressure. The product was purified through silica gel column chromatography by using n-hexane/dichloromethane mixed in a volume ratio of 9:1, obtaining a desired compound, an intermediate M-6, as 25 g of a white solid (yield: 83%).

LC-Mass (theoretical value: 337.98 g/mol, measured value: M+1=338 g/mol)

Synthesis of Intermediate M-7

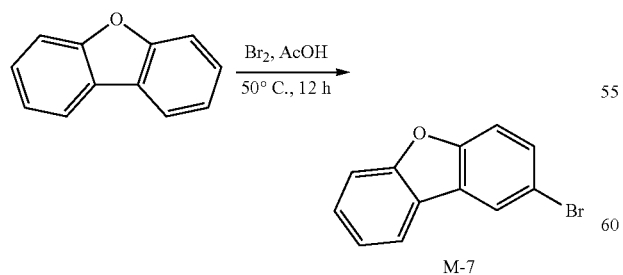

30 g (178.4 mmol) of dibenzofuran was put in a round-bottomed flask and dissolved in 270 g of acetic acid. 29 g (181.5 mmol) of bromine dissolved in 6 g of acetic acid at 50° C. was slowly added thereto for 4 hours. The reactant solution was additionally agitated at 50° C. for 8 hours, cooled down, and then added to distilled water. The obtained orange solid was dissolved in dichloromethane and washed with a sodium thiosulfite aqueous solution. Then, the organic layer was dried with magnesium sulfate, filtered, and then concentrated under a reduced pressure.

The resulting product was recrystallized with dichloromethane/n-hexane mixed in a volume ratio of 1:3, obtaining a desired compound, an intermediate M-7, as 10.1 g of a white solid (yield: 23%).

GC-Mass (theoretical value: 245.97 g/mol, measured value: 246 g/mol)

Synthesis of Intermediate M-8

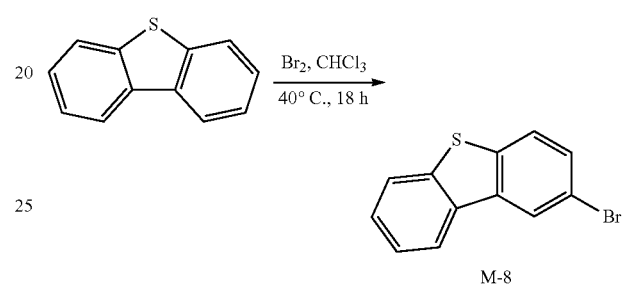

30 g (162.8 mmol) of dibenzothiophene was put in a round-bottomed flask and dissolved in 2 L of chloroform. 27.3 g (170.9 mmol) of bromine was slowly added thereto at room temperature for 6 hours. The reactant solution was additionally agitated at 40° C. for 12 hours, cooled down, and then extracted with a sodium thiosulfite aqueous solution. The obtained organic layer was dried with magnesium sulfate, filtered, and then concentrated under a reduced pressure.

The resulting product was recrystallized with ethyl acetate/n-hexane mixed in a volume ratio of 1:3, obtaining a desired compound, an intermediate M-8, as 15.4 g of a white solid (yield: 36%).

GC-Mass (theoretical value: 261.95 g/mol, measured value: 262 g/mol)

Synthesis of Intermediate M-9

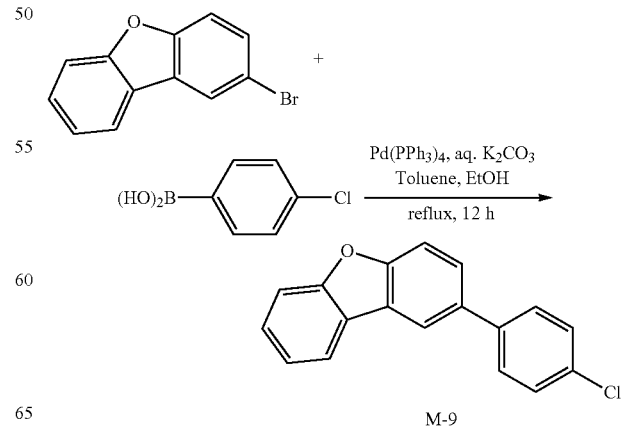

20 g (127.9 mmol) of 4-chlorophenylboric acid, 30.0 g (121.5 mmol) of the intermediate M-7, and 1.48 g (1.28 mmol) of tetrakis(triphenylphosphine) palladium were put in a flask and dissolved in 320 ml of toluene and 160 ml of ethanol under a nitrogen atmosphere. 160 ml of an aqueous solution in which 37.7 g (255.8 mmol) of potassium carbonate was dissolved was added thereto. The mixture was refluxed and agitated for 12 hours.

When the reaction was complete, the extracted solution was dried with magnesium sulfate, filtered, and then concentrated under a reduced pressure. The resulting product was purified through silica gel column chromatography by using n-hexane/dichloromethane mixed in a volume ratio of 9:1, obtaining a desired compound, an intermediate M-9, as 28.1 g of a white solid (yield: 83%).

LC-Mass (theoretical value: 278.05 g/mol, measured value: M+1=279 g/mol)

Synthesis of Intermediate M-10

[Reaction Scheme 10]

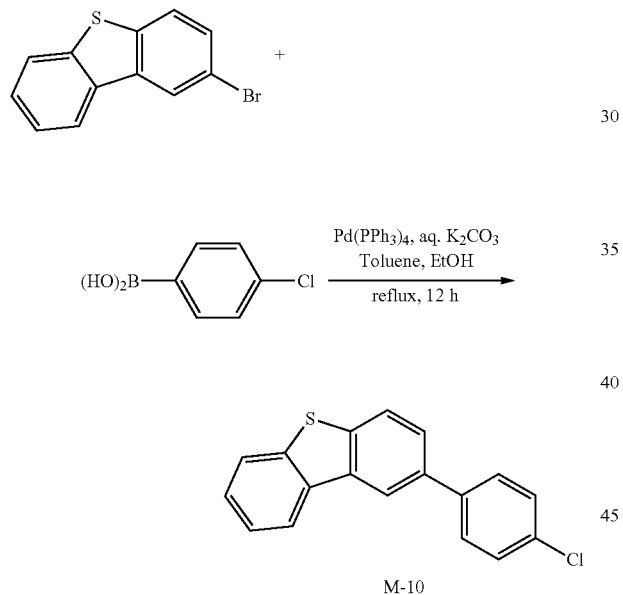

M-10

20 g (127.9 mmol) of 4-chlorophenylboric acid, 32.0 g (121.5 mmol) of the intermediate M-8, and 1.48 g (1.28 mmol) of tetrakis(triphenylphosphine) palladium were put in a flask and dissolved in 320 ml of toluene and 160 ml of ethanol under a nitrogen atmosphere. 160 ml of an aqueous solution in which 37.7 g (255.8 mmol) of potassium carbonate was dissolved was added thereto. The mixture was refluxed and agitated for 12 hours.

When the reaction was complete, the extracted solution was dried with magnesium sulfate, filtered, and then concentrated under a reduced pressure. The resulting product was purified through silica gel column chromatography by using n-hexane/dichloromethane in a volume ratio of 9:1, obtaining a desired compound, an intermediate M-9, as 30.4 g of a white solid (yield: 85%).

LC-Mass (theoretical value: 294.03 g/mol, measured value: M+1=295 g/mol)

Synthesis of Intermediate M-11

[Reaction Scheme 11]

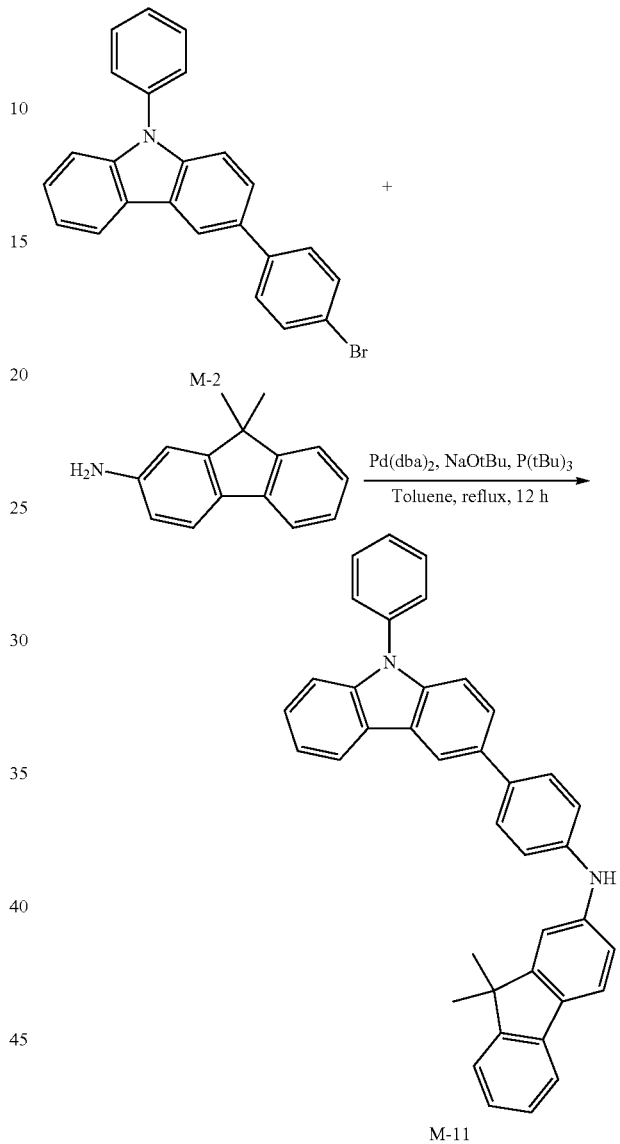

M-11

30 g (75.3 mmol) of the intermediate M-2, 18.92 g (90.39 mmol) of 2-amino-9,9'-dimethylfluorene, 26.06 g (271.16 mmol) of sodium t-butoxide, and 0.46 g (2.26 mmol) of tris(tert-butyl)phosphine were dissolved in 600 ml of toluene, and 1.3 g (2.26 mmol) of Pd(dba)$_2$ was added thereto. The mixture was refluxed and agitated under a nitrogen atmosphere for 12 hours.

When the reaction was complete, the reactant was extracted with toluene and distilled water. The obtained organic layer was dried with magnesium sulfate, filtered, and then concentrated under a reduced pressure. The product was purified through silica gel column chromatography by using n-hexane/dichloromethane mixed in a volume ratio of 1:1 and recrystallized in a mixed solvent of dichloromethane/n-hexane, obtaining a desired compound, an intermediate M-11, as 30.9 g of a white solid (yield: 78%).

LC-Mass (theoretical value: 526.24 g/mol, measured value: M+1=527.24 g/mol)

Synthesis of Intermediate M-12

[Reaction Scheme 12]

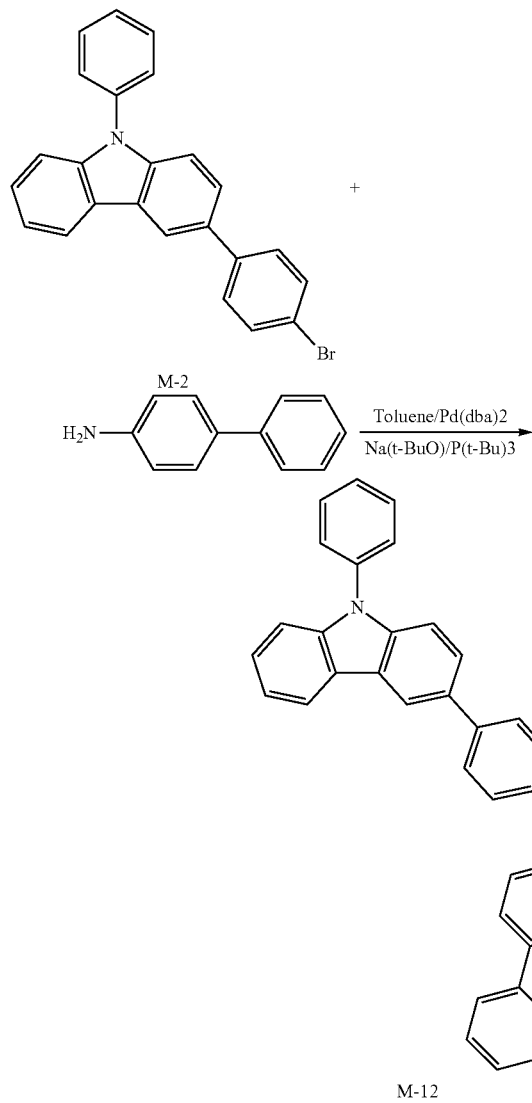

30 g (75.3 mmol) of the intermediate M-2, 15.29 g (90.39 mmol) of 4-aminobiphenyl, 26.06 g (271.16 mmol) of sodium t-butoxide, and 0.46 g (2.26 mmol) of tris(tert-butyl) phosphine were dissolved in 600 ml of toluene, and 1.3 g (2.26 mmol) of Pd(dba)$_2$ was added thereto. The mixture was refluxed and agitated under a nitrogen atmosphere for 12 hours.

When the reaction was complete, the product was extracted with toluene and distilled water. Then, the obtained organic layer was dried with magnesium sulfate, filtered, and then concentrated under reduced pressure. The resulting product was purified through silica gel column chromatography by using n-hexane/dichloromethane in a volume ratio of 1:1 and then, recrystallized in a mixed solvent of dichloromethane/n-hexane, obtaining a desired compound, an intermediate M-12, as 28.4 g of a white solid (yield: 77.5%).

LC-Mass (theoretical value: 486.21 g/mol, measured value: M+1=487.21 g/mol)

Example 1

Preparation of Compound A-1

[Reaction Scheme 13]

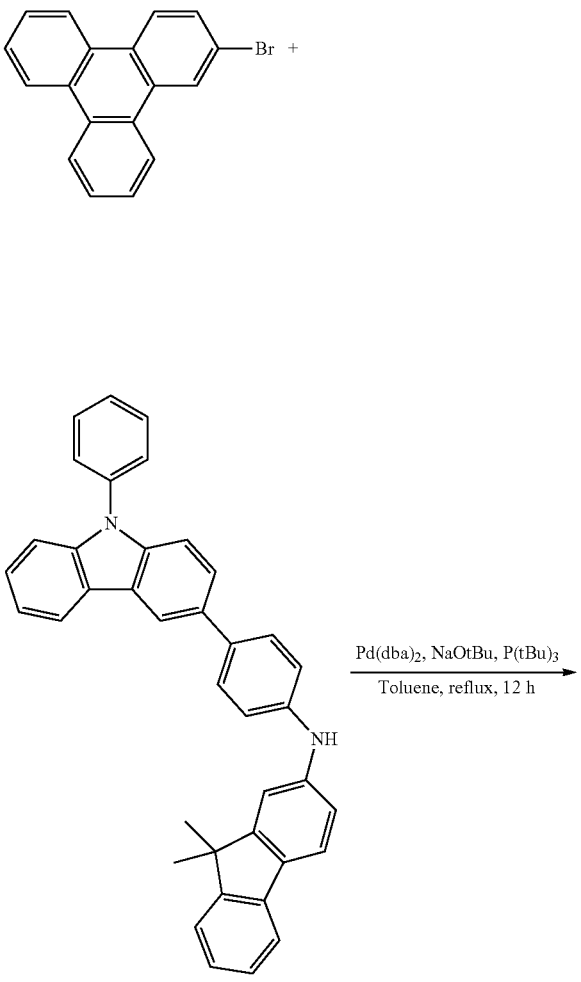

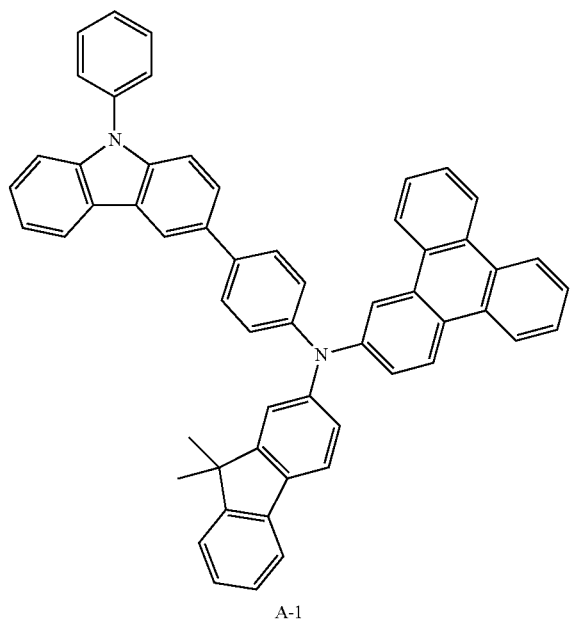

A-1

5.6 g (18.23 mmol) of 2-bromo triphenylene, 8.0 g (15.19 mmol) of the intermediate M-11, 5.26 g (54.68 mmol) of sodium t-butoxide, 0.09 g (0.46 mmol) of tris(tert-butyl)phosphine were dissolved in 200 ml of toluene, and 0.26 g (0.46 mmol) of Pd(dba)$_2$ was added thereto. The mixture was refluxed and agitated under a nitrogen atmosphere for 12 hours.

When the reaction was complete, the mixture was extracted with toluene and distilled water. The obtained organic layer was dried with anhydrous magnesium sulfate, filtered, and then concentrated under a reduced pressure. The product was purified through silica gel column chromatography by using n-hexane/dichloromethane mixed in a volume ratio of 1:1 and recrystallized in a mixed solvent of dichloromethane/ethyl acetate, obtaining a desired compound A-1, as 6.88 g of a white solid (yield: 60.1%).

LC-Mass (theoretical value: 752.32 g/mol, measured value: M+1=753.32 g/mol)

Example 2

Preparation of Compound A-2

[Reaction Scheme 14]

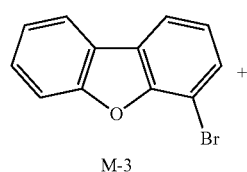

M-3

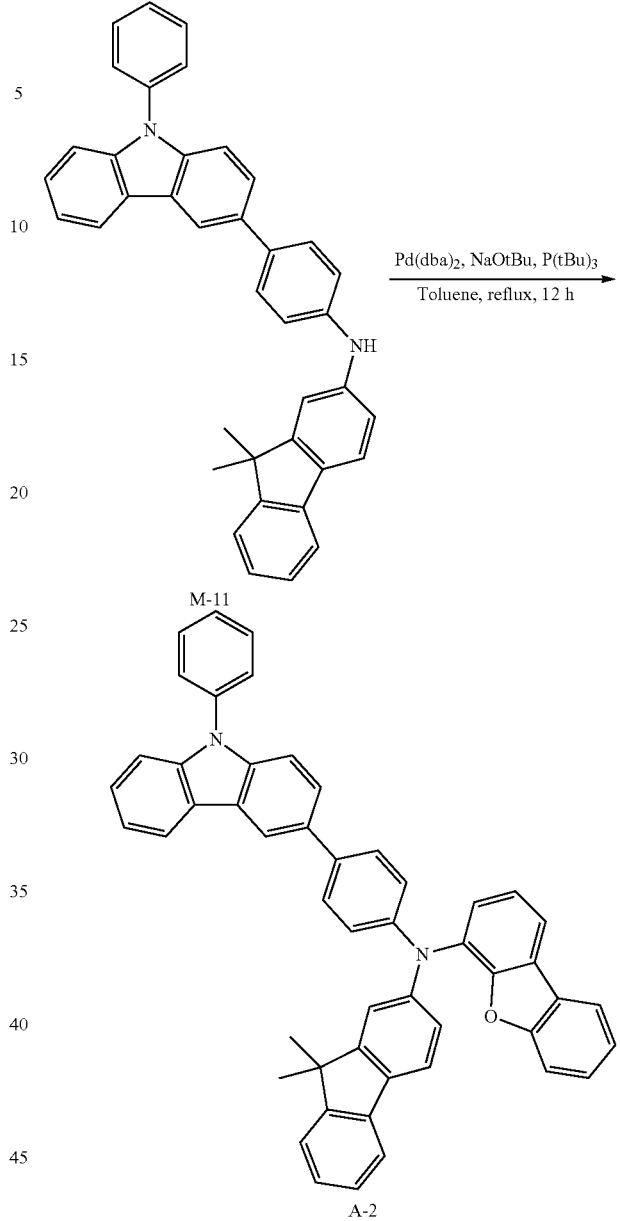

4.13 g (16.71 mmol) of 4-bromo dibenzofuran (intermediate M-3), 8.0 g (15.19 mmol) of the intermediate M-11, 4.82 g (50.13 mmol) of sodium t-butoxide, and 0.09 g (0.46 mmol) of tris(tert-butyl)phosphine were dissolved in 200 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The obtained product was purified through silica gel column chromatography with n-hexane/dichloromethane mixed in a volume ratio of 1:1, obtaining a desired compound A-2, as 9.0 g of a white solid (yield: 85.5%).

LC-Mass (theoretical value: 692.28 g/mol, measured value: M+1=693.28 g/mol)

Example 3

Preparation of Compound A-3

[Reaction Scheme 15]

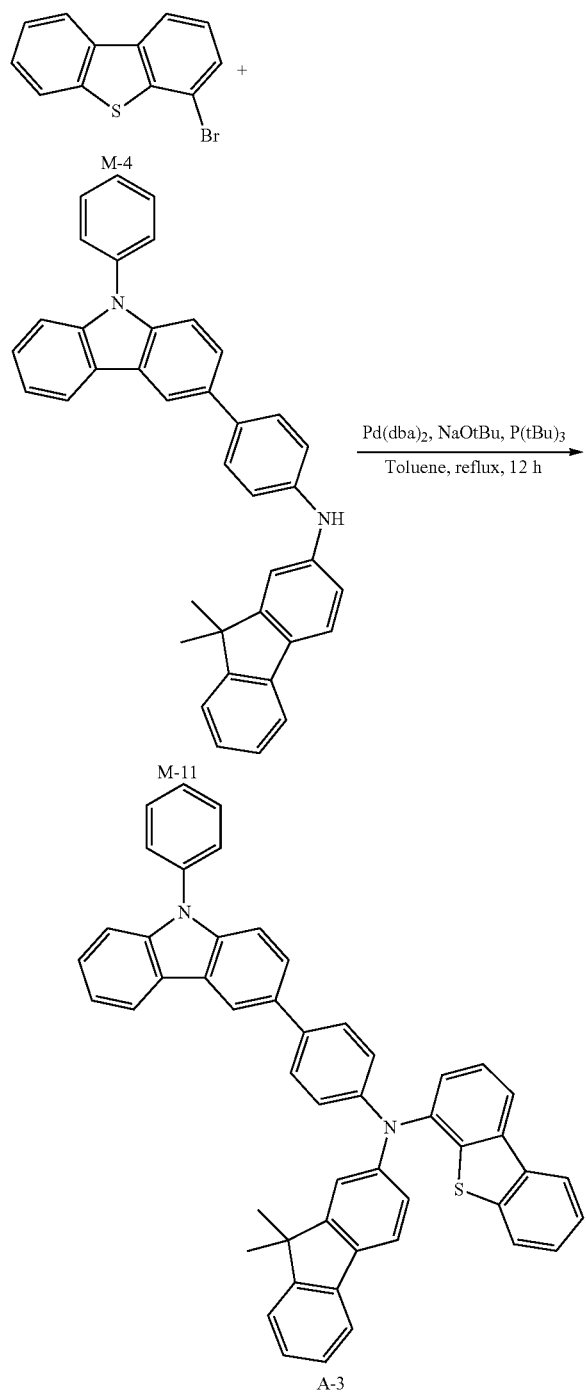

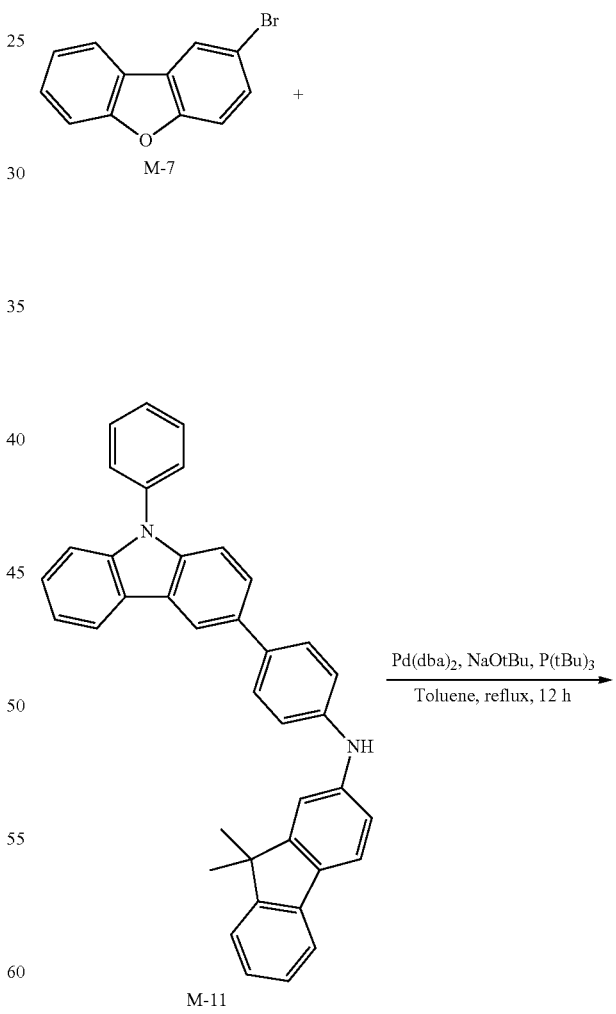

thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The obtained product was purified through silica gel column chromatography by using n-hexane/dichloromethane mixed in a volume ratio of 1:1, obtaining a desired compound A-3 as 9.0 g of a white solid (yield: 83.58%).

LC-Mass (theoretical value: 708.91 g/mol, measured value: M+1=709.91 g/mol)

Example 4

Preparation of Compound A-4

[Reaction Scheme 16]

4.4 g (16.71 mmol) of 4-bromo dibenzothiophene (intermediate M-4), 8.0 g (15.19 mmol) of the intermediate M-11, 4.82 g (50.13 mmol) of sodium t-butoxide, and 0.09 g (0.46 mmol) of tris(tert-butyl)phosphine was dissolved in 200 ml of toluene, and 0.26 g (0.46 mmol) of Pd(dba)$_2$ was added -continued

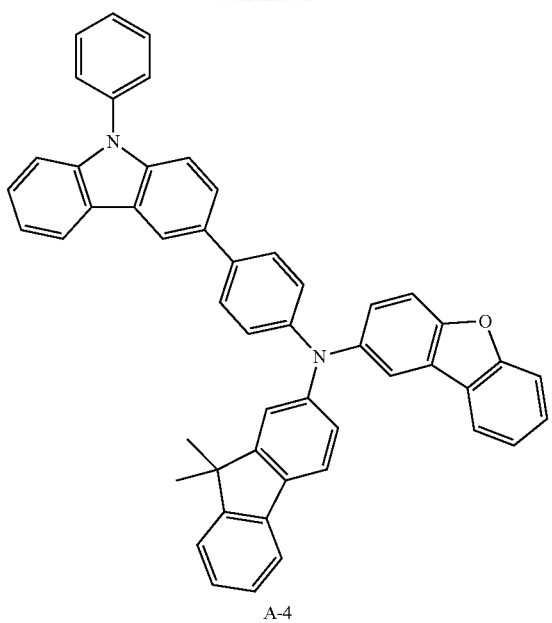

A-4

4.13 g (16.71 mmol) of 2-bromo dibenzofuran (intermediate M-7), 8.0 g (15.19 mmol) of the intermediate M-11, 4.82 g (50.13 mmol) of sodium t-butoxide, and 0.09 g (0.46 mmol) of tris(tert-butyl)phosphine were dissolved in 200 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The obtained product was purified through a silica gel column chromatography by using n-hexane/dichloromethane mixed in a volume ratio of 1:1, preparing a desired compound A-4 as 8.7 g of a white solid (yield: 82.6%).

LC-Mass (theoretical value: 692.28 g/mol, measured value: M+1=693.28 g/mol)

Example 5

Preparation of Compound A-5

[Reaction Scheme 17]

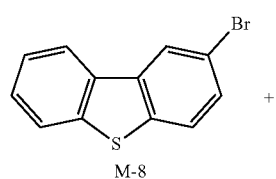

M-8

+

-continued

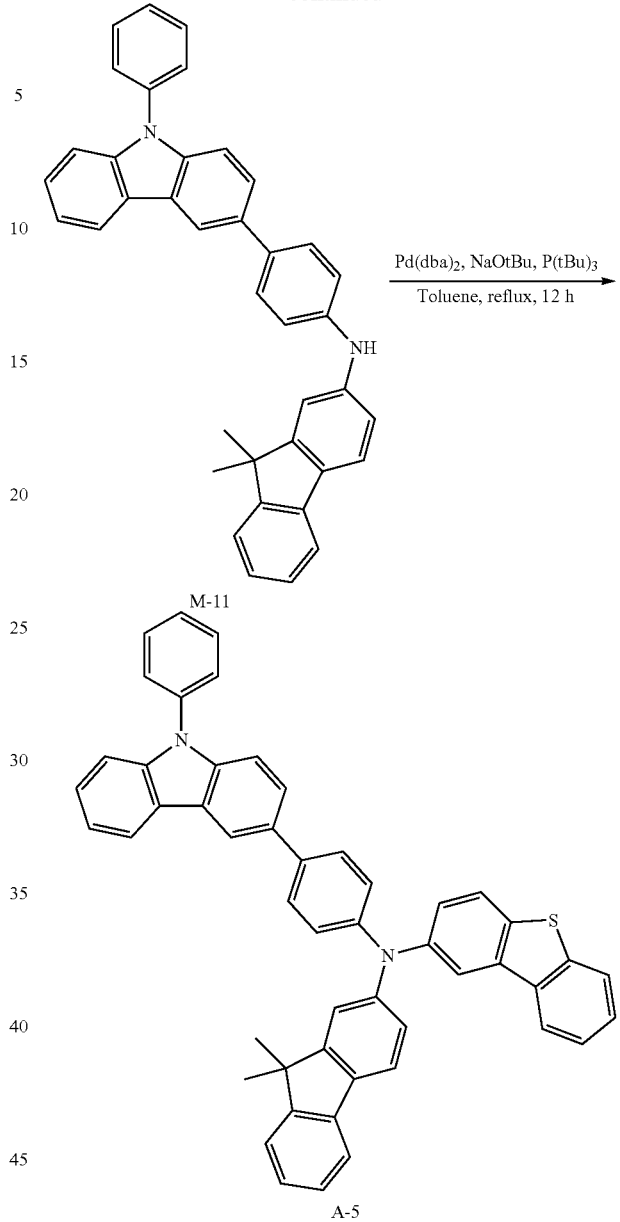

4.4 g (16.71 mmol) of 2-bromo dibenzothiophene (intermediate M-8), 8.0 g (15.19 mmol) of the intermediate M-11, 4.82 g (50.13 mmol) of sodium t-butoxide, and 0.09 g (0.46 mmol) of tris(tert-butyl)phosphine were dissolved in 200 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The prepared product was purified through silica gel column chromatography by using n-hexane/dichloromethane mixed in a volume ratio of 1:1, obtaining a desired compound A-5 as 8.4 g of a white solid (yield: 78%).

LC-Mass (theoretical value: 708.91 g/mol, measured value: M+1=709.91 g/mol)

Example 6

Preparation of Compound A-6

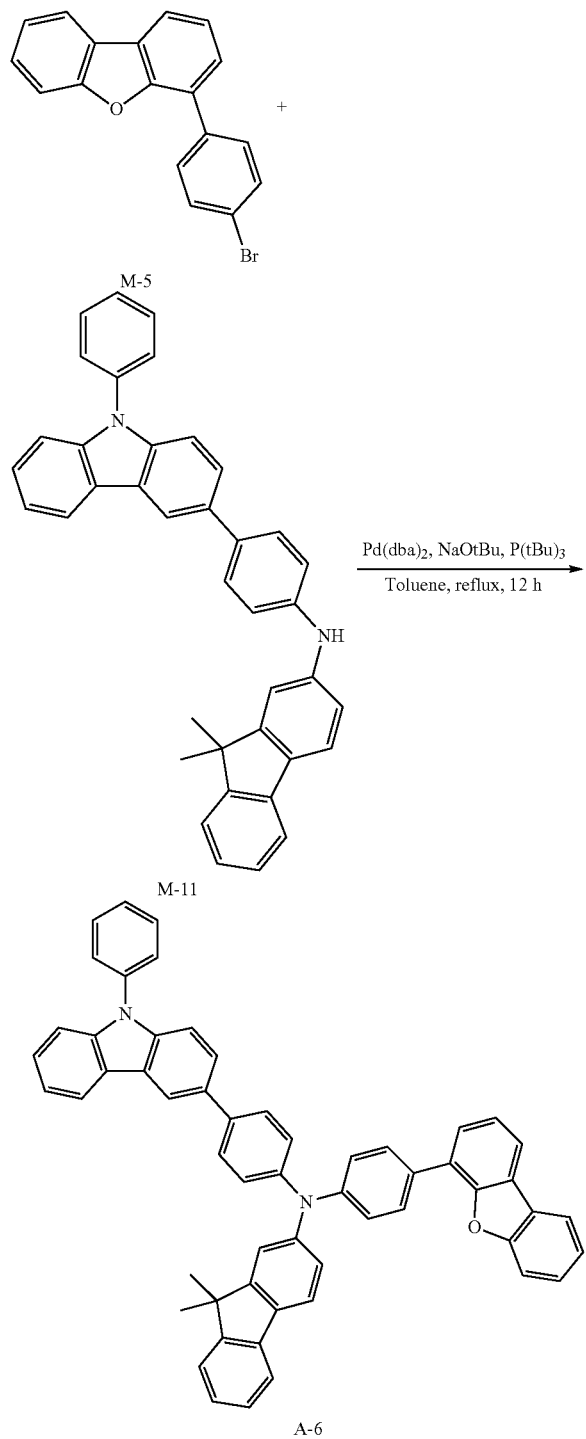

A-6

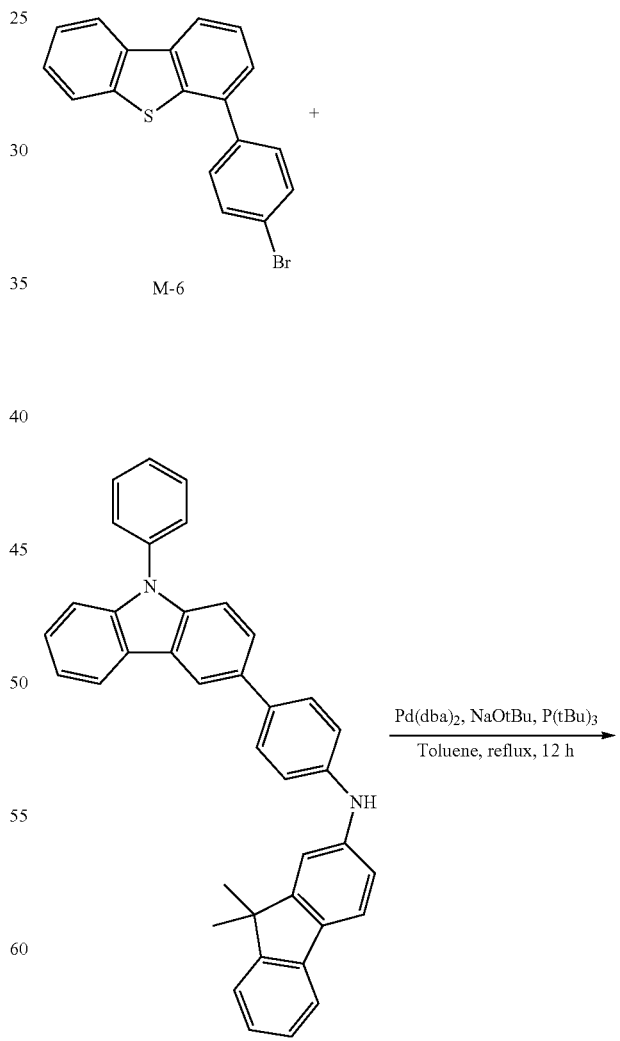

5.4 g (16.71 mmol) of the intermediate M-5, 8.0 g (15.19 mmol) of the intermediate M-11, 4.82 g (50.13 mmol) of sodium t-butoxide, and 0.09 g (0.46 mmol) of tris(tert-butyl)phosphine were dissolved in 300 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The prepared product was purified through silica gel column chromatography by using n-hexane/dichloromethane mixed in a volume ratio of 4:1, obtaining a desired compound A-6 as 9.2 g of a white solid (yield: 78.7%).

LC-Mass (theoretical value: 768.31 g/mol, measured value: M+1=769.31 g/mol)

Example 7

Preparation of Compound A-7

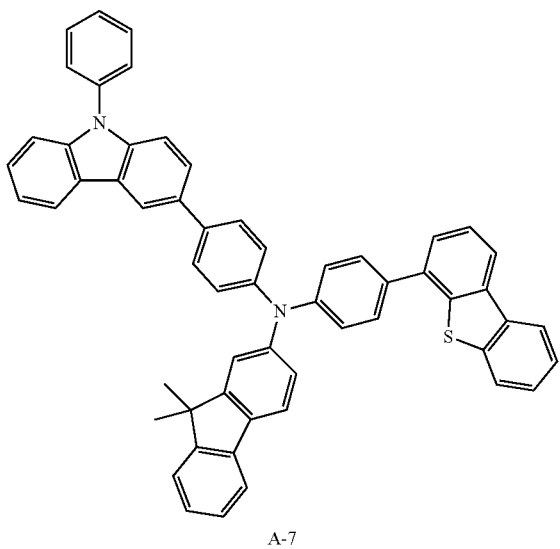

A-7

5.67 g (16.71 mmol) of the intermediate M-6, 8.0 g (15.19 mmol) of the intermediate M-11, 4.82 g (50.13 mmol) of sodium t-butoxide, and 0.09 g (0.46 mmol) of tris(tert-butyl) phosphine was dissolved in 300 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The prepared product was purified through silica gel column chromatography by using n-hexane/dichloromethane mixed in a volume ratio of 4:1, obtaining a desired compound A-7 as 9.5 g of a white solid (yield: 79.6%).

LC-Mass (theoretical value: 784.29 g/mol, measured value: M+1=785.29 g/mol)

Example 8

Preparation of Compound A-8

[Reaction Scheme 20]

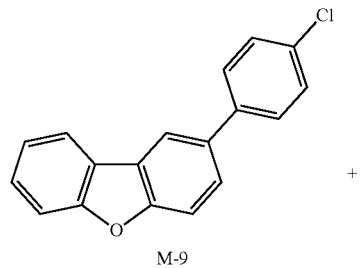

M-9

+

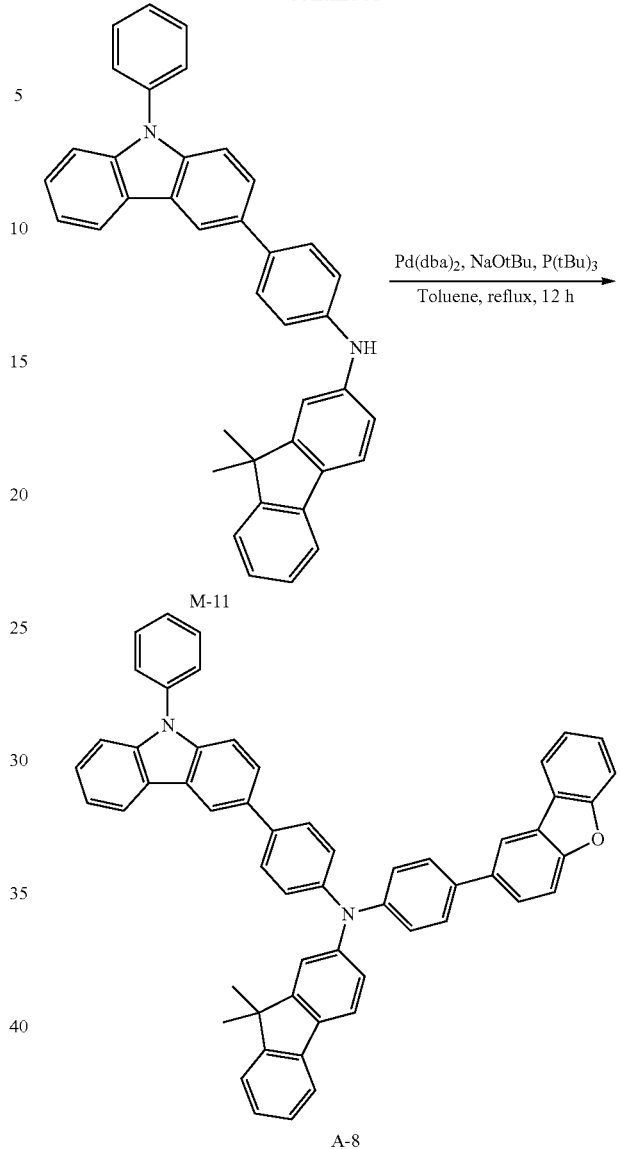

M-11

A-8

4.66 g (16.71 mmol) of the intermediate M-9, 8.0 g (15.19 mmol) of the intermediate M-11, 4.82 g (50.13 mmol) of sodium t-butoxide, and 0.09 g (0.46 mmol) of tris(tert-butyl) phosphine were dissolved in 300 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The prepared product was purified through silica gel column chromatography by using n-hexane/dichloromethane mixed in a volume ratio of 4:1, obtaining a desired compound A-8 as 9.0 g of a white solid (yield: 77%).

LC-Mass (theoretical value: 768.31 g/mol, measured value: M+1=769.31 g/mol)

Example 9

Preparation of Compound A-9

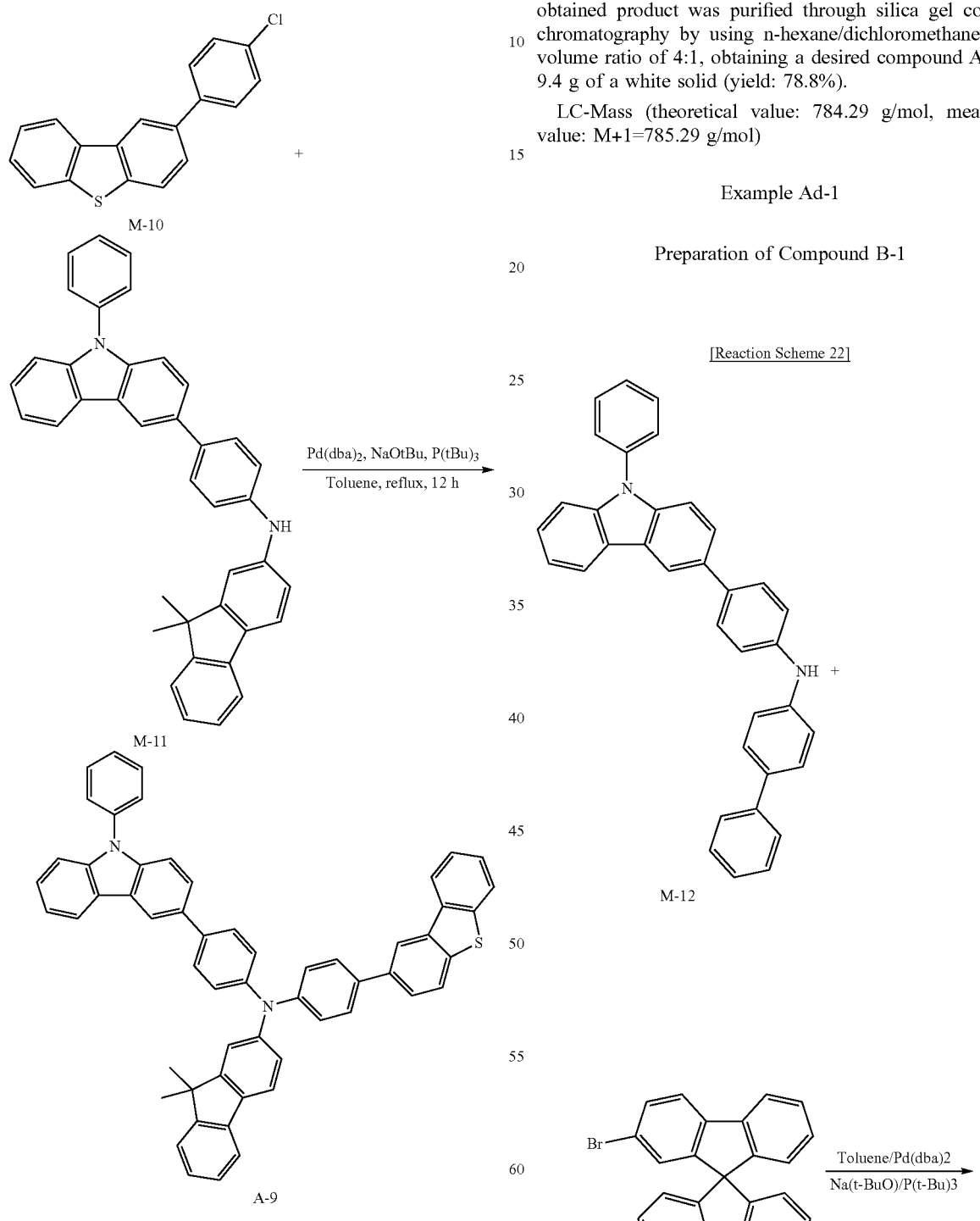

4.93 g (16.71 mmol) of the intermediate M-10, 8.0 g (15.19 mmol) of the intermediate M-11, 4.82 g (50.13 mmol) of sodium t-butoxide, and 0.09 g (0.46 mmol) of tris(tert-butyl)phosphine were dissolved in 300 ml of toluene, and 0.26 g (0.46 mmol) of Pd(dba)₂ was added thereto. The mixture was refluxed and agitated under a nitrogen atmosphere for 12 hours.

When the reaction was complete, the resulting mixture was extracted with toluene and distilled water. The obtained organic layer was dried with anhydrous magnesium sulfate, filtered, and then concentrated under a reduced pressure. The obtained product was purified through silica gel column chromatography by using n-hexane/dichloromethane in a volume ratio of 4:1, obtaining a desired compound A-9 as 9.4 g of a white solid (yield: 78.8%).

LC-Mass (theoretical value: 784.29 g/mol, measured value: M+1=785.29 g/mol)

Example Ad-1

Preparation of Compound B-1

-continued

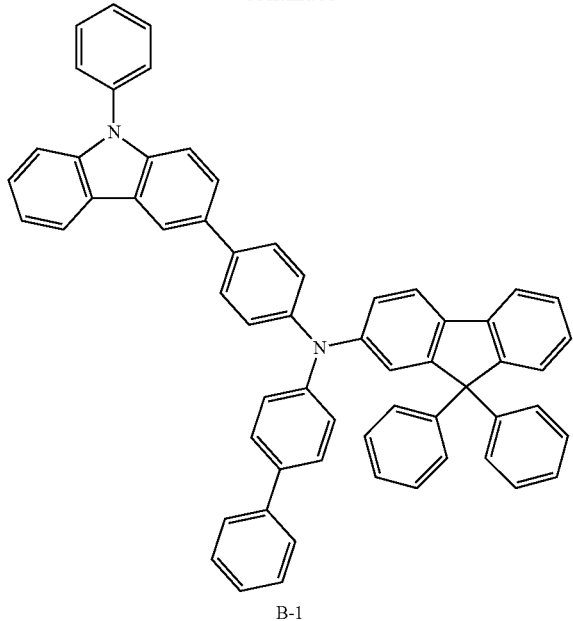

B-1

6 g (15.1 mmol) of 2-bromo-9,9'-diphenyl fluorene, 6.52 g (13.4 mmol) of the intermediate M-12, 4.82 g (50.13 mmol) of sodium t-butoxide, and 0.09 g (0.46 mmol) of tris(tert-butyl)phosphine were dissolved in 300 ml of toluene, and 0.26 g (0.46 mmol) of Pd(dba)$_2$ was added thereto. The mixture was refluxed and agitated under a nitrogen atmosphere for 12 hours.

When the reaction was complete, the resulting product was extracted with toluene and distilled water. The obtained organic layer was dried with anhydrous magnesium sulfate, filtered, and then concentrated under a reduced pressure. The prepared product was twice recrystallized in a mixed solvent of dichloromethane/acetone, obtaining a desired compound B-1, as 9.5 g of a white solid (yield: 88.7%).

LC-Mass (theoretical value: 802.33 g/mol, measured value: M+1=803.33 g/mol)

Fabrication of Organic Light Emitting Diode

Example 10

A glass substrate coated with a 1,500 Å-thick ITO (Indium tin oxide) thin film was cleaned with a distilled water ultrasonic wave. Next, the glass substrate was ultrasonic wave-cleaned with a solvent including one of isopropyl alcohol, acetone, methanol, and the like, and then, cleaned in a plasma cleaner by using oxygen plasma for 5 minutes and moved with a vacuum evaporator. The ITO transparent electrode was used as a positive electrode; and 4,4'-bis[N-[4-{N,N-bis(3-methylphenyl)amino}-phenyl]-N-phenylamino]biphenyl (DNTPD) was vacuum-deposited to form a 600 Å-thick hole injection layer (HIL) thereon. Then, the compound A-1 of Example 1 was vacuum-deposited to form a 300 Å-thick hole transport layer (HTL) on the hole injection layer (HIL). On the hole transport layer (HTL), a 250 Å-thick emission layer was vacuum deposited by using 9,10-di-(2-naphthyl)anthracene (ADN) as a host and 3 wt % of 2,5,8,11-tetra(tert-butyl)perylene (TBPe) as a dopant.

On the emission layer, Alq3 was vacuum-deposited to form a 250 Å-thick electron transport layer (ETL). On the electron transport layer (ETL), LiF was vacuum-deposited to be 10 Å thick, and then an Al layer was formed to be 1,000 Å thick to fabricate a cathode. Then, the cathode was used to fabricate an organic light emitting diode.

Accordingly, the organic light emitting diode had a structure of five organic thin layers: Al 1,000 Å/LiF 10 Å/Alq3 250 Å/EML[ADN:TBPe=97:3] 250 Å/A-1 300 Å/DNTPD 600 Å/ITO 1,500 Å.

Example 11

An organic light emitting diode was fabricated according to the same method as Example 10, except for using compound A-6 according to Example 6 instead of compound A-1 according to Example 1.

Example 12

An organic light emitting diode was fabricated according to the same method as Example 10 except for using compound A-7 according to Example 7 instead of compound A-1 according to Example 1.

Example Ad-2

An organic light emitting diode was fabricated according to the same method as Example 10 except for using compound B-1 according to Example Ad-1 instead of compound A-1 according to Example 1.

Comparative Example 1

An organic light emitting diode was fabricated according to the same method as Example 10 except for using NPB instead of the compound A-1 of Example 1.

Comparative Example 2

An organic light emitting diode was fabricated according to the same method as Example 10 except for using HT1 instead of the compound A-1 of Example 1.

The compounds used in Examples and Comparative Examples are provided as follows.

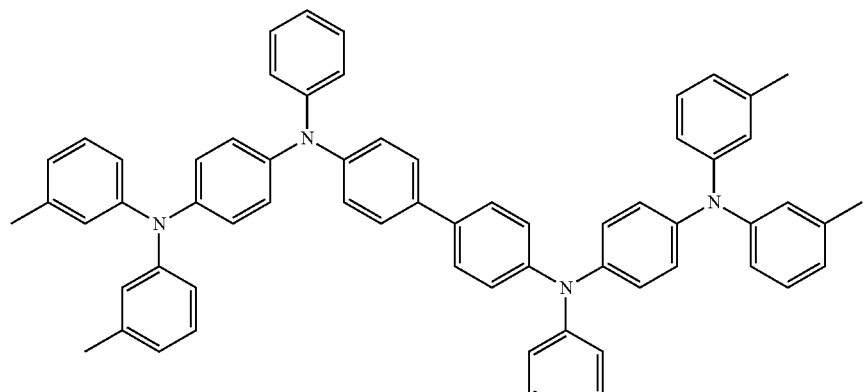
[DNTPD]

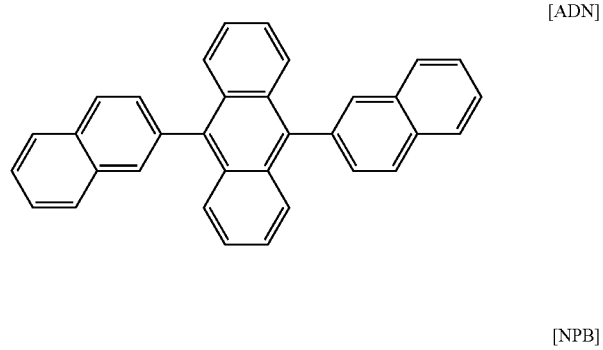
[ADN]

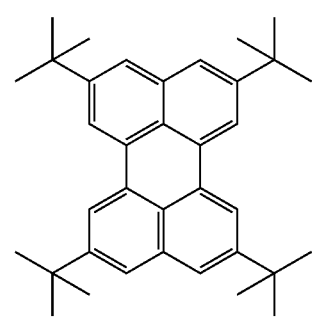
[TBPe]

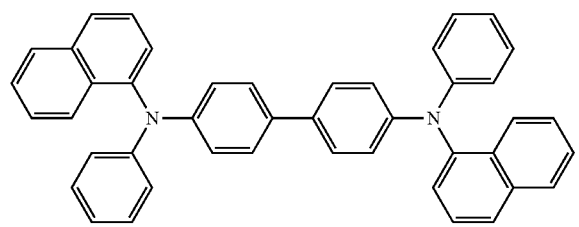
[NPB]

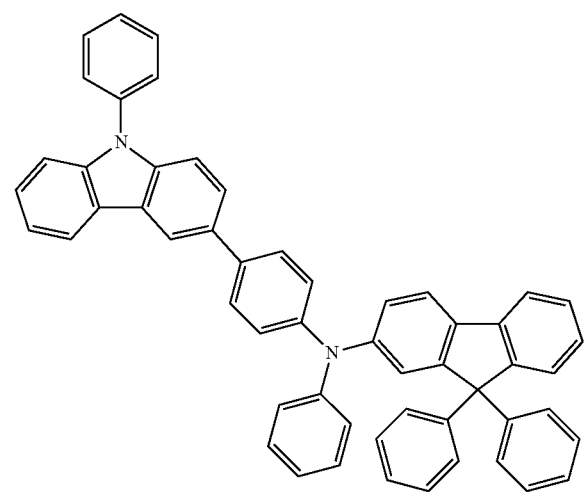
[HT1]

(Thermal Stability Evaluation of Material)

Each specimen was measured regarding glass transition temperature and decomposition temperature by measuring differential scanning calorimetry (DSC) and thermogravimetric analysis (TGA). The results are provided in the following Table 1.

TABLE 1

| Materials | Tg (° C.) | Td (° C.) |
| --- | --- | --- |
| Example 1 (A-1) | 161 | 483 |
| Example 6 (A-6) | 142 | 487 |

TABLE 1-continued

| Materials | Tg (° C.) | Td (° C.) |
| --- | --- | --- |
| Example 7 (A-7) | 142 | 513 |
| Example Ad-1 (B-1) | 150 | 507 |

Tg: glass transition temperature
Td: decomposition temperature

As may be seen in Table 1, the compounds according to Examples 1, 6, 7, and Ad-1 had a decomposition temperature close to about 500° C. and thus, very high thermal stability, compared with a Td of 392° C. of carbazole biphenyl (CBP).

In addition, the compounds according to Examples 1, 6, 7, and Ad-1 had remarkably high glass transition temperatures, compared with a Tg of 90° C. of typically-used compounds for an organic optoelectronic device.

(Performance Evaluation of Organic light emitting diode)

Each organic light emitting diode according to Examples 10 to 12 and Ad-2 and Comparative Examples 1 and 2 were measured regarding current density change and luminance change depending voltage change and luminous efficiency. In particular, the measurements were made in the following method; and the results are provided in the following Table 2.

(1) Current Density Change Depending on Voltage Change

The organic light emitting diodes were measured regarding current per unit device by using a current-voltage system (Keithley 2400) while voltage was increased from 0 V to 10 V and current density by dividing the current value by an area.

(2) Luminance Change Depending on Voltage Change

The organic light emitting diodes was measured regarding luminance by using a luminance meter (Minolta Cs-1000A) while voltage was increased from 0 V to 10 V.

(3) Luminous Efficiency

The luminance and current density obtained in (1) and (2), above, and voltage were used to calculate current efficiency (cd/A) of the same current density (10 mA/cm$^2$).

TABLE 2

| Devices | HTL | Voltage (V) | EL color | Efficiency (cd/A) | half life-span (h) @1000 cd/m$^2$ |
|---|---|---|---|---|---|
| Example 10 | A-1 | 6.2 | Blue | 6.0 | 1,500 |
| Example 11 | A-6 | 6.2 | Blue | 5.7 | 1,700 |
| Example 12 | A-7 | 6.1 | Blue | 5.9 | 2,000 |
| Example Ad-2 | Ad-1 | 6.0 | Blue | 5.6 | 2,000 |
| Comparative Example 1 | NPB | 7.1 | Blue | 4.9 | 1,250 |
| Comparative Example 2 | HT1 | 6.2 | Blue | 5.5 | 1,500 |

As may be seen in Table 2, the organic light emitting diodes according to Examples 10 to 12 and Ad-2 had remarkably excellent efficiency and half life-span, compared with those of Comparative Examples 1 and 2.

In addition, the organic light emitting diodes according to Examples 10 to 12 and Ad-2 had remarkably improved half life-span compared with those of Comparative Examples 1 and 2. In particular, the organic light emitting diodes according to Examples 12 and Ad-2 had 2,000 hours (h) of half life-span compared with 1250 hours and, thus, more than about 1.6 times improved half life-span. Considering life-span of a device is an important factor in terms of actual commercialization of a device, the organic light emitting diodes according to the Examples turned out to have a satisfactory life-span.

By way of summation and review, the organic light emitting diode transforms electrical energy into light by applying a current to an organic light emitting material. The OLED may have a structure in which a functional organic material layer is interposed between an anode and a cathode. The organic material layer may include a multi-layer including different materials, for example, a hole injection layer (HIL), a hole transport layer (HTL), an emission layer, an electron transport layer (ETL), and an electron injection layer (EIL) in order to improve efficiency and stability of an organic light emitting diode.

In such an organic light emitting diode, when a voltage is applied between an anode and a cathode, holes from the anode and electrons from the cathode are injected to an organic material layer. The holes and electrons are recombined to generate excitons having high energy. The generated excitons generate light of a certain wavelength while shifting to a ground state.

A phosphorescent light emitting material, as well as a fluorescent light emitting material, may be used as a light emitting material for an organic light emitting diode. Such a phosphorescent material emits light by transiting the electrons from a ground state to an exited state, transiting a singlet exciton to a triplet exciton without radiance through intersystem crossing, and transiting the triplet exciton to a ground state.

As described above, an organic material layer for an organic light emitting diode may include a light emitting material and a charge transport material, e.g., a hole injection material, a hole transport material, an electron transport material, an electron injection material, or the like.

The light emitting material may be classified as blue, green, and red light emitting materials according to emitted colors, and yellow and orange light emitting materials to emit colors near to natural colors.

When one material is used as a light emitting material, a device may exhibit deteriorated efficiency because interactions among molecules may shift a maximum light emitting wavelength to a long wavelength, may decrease color purity, or may quench light emitting effects. Therefore, a host/dopant system may be used as a light emitting material in order to improve color purity and increase luminous efficiency and stability through energy transfer.

In order to implement excellent performance of an organic light emitting diode, a material forming an organic material layer, e.g., a hole injection material, a hole transport material, a light emitting material, an electron transport material, an electron injection material, and a light emitting material such as a host and/or a dopant should be stable and have good efficiency.

In general, an organic light emitting diode may be classified into a low molecular weight organic light emitting diode and a polymer organic light emitting diode. The low molecular weight organic light emitting diode may be fabricated in a form of a thin film using a vacuum deposit method and thus, may have excellent efficiency and life-span performance. On the other hand, the polymer organic light emitting diode may be fabricated using an inkjet method or a spin coating method and thus, may have a low cost in the initial step while having a large area.

Both the low molecular weight organic light emitting diode and the polymer organic light emitting diode exhibit self-light emission, fast response speed, wide photviewing angle, ultra thin film, high image quality, durability, broad operation temperature range, and the like, and thus, draw attention as a next generation display. In particular, the low molecular weight organic light emitting diode and the polymer organic light emitting diode self-emit light and thus, have good visibility in a dark place or against an external light, with no need of a backlight. Accordingly, they may be fabricated to have about ⅓ less thickness and weight than a conventional liquid crystal display (LCD).

In addition, the low molecular weight organic light emitting diode and the polymer organic light emitting diode may have more than 1,000 times faster response speed than LCD (by a micro second) and thus, may realize a perfect motion picture without an after-image. Accordingly, the low molecular weight organic light emitting diode and the polymer organic light emitting diode may be an optimum display in a multimedia era, since they have 80 times improved efficiency and more than 100 times improved life-span due to remarkable technological development since the first model was developed in the late 1980s. Organic light emitting diodes are finding bigger applications, e.g., a 40 inch organic light emitting diode panel and the like have been developed.

Improved luminous efficiency and improved life-span are desirable. Luminous efficiency of a device may require smooth combination of a hole with an electron in an emission layer. However, an organic material may exhibit slower electron mobility than hole mobility. Thus, an electron transport layer (ETL) may be used to increase electron injection and mobility from a cathode and simultaneously block hole mobility, so that a hole may be efficiently combined with an electron in an emission layer.

In addition, to improve life-span of a device, crystallization of the organic material due to Joule heat generated during operation should be prevented. Therefore, an organic compound with excellent electron injection and mobility and high electrochemical stability is desired.

The embodiments provide a compound capable of providing an organic optoelectronic device having good life span, efficiency, electrochemical stability, and thermal stability.

The compound has high hole or electron transporting properties, film stability, thermal stability and high triplet excitation energy.

The compound may be used in an emission layer as a hole injection/transport material, a host material, or an electron injection/transport material. The organic photoelectric device including the compound may provide excellent life-span and luminous efficiency while having low driving voltages due to excellent electrochemical and thermal stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, the compound being represented by the following Chemical Formula 1:

[Chemical Formula 1]

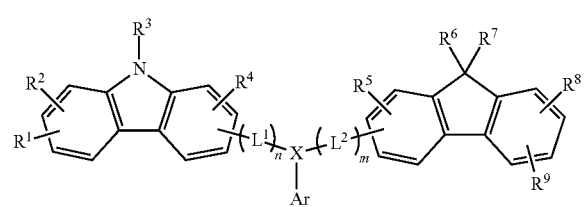

wherein, in Chemical Formula 1,
Ar is a substituted or unsubstituted dibenzofuranyl group or a substituted or unsubstituted dibenzothiophenyl group,
X is N or P,
$L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group or a substituted or unsubstituted C2 to C30 heteroarylene group,
n and m are each independently integers of 0 to about 3, and
$R^1$ to $R^9$ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

2. The compound for an organic optoelectronic device as claimed in claim 1, wherein the compound represented by Chemical Formula 1 is represented by the following Chemical Formula 2:

[Chemical Formula 2]

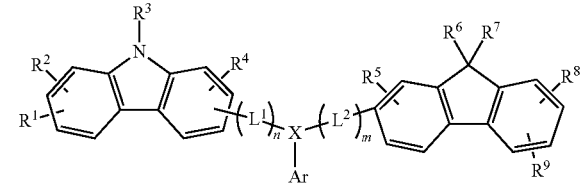

wherein, in Chemical Formula 2,
Ar is a substituted or unsubstituted dibenzofuranyl group or a substituted or unsubstituted dibenzothiophenyl group,
X is N or P,
$L^1$ and $L^2$ are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m are each independently integers of 0 to about 3, and R¹ to R⁹ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

3. The compound for an organic optoelectronic device as claimed in claim 2, wherein X is N.

4. The compound for an organic optoelectronic device as claimed in claim 1, wherein the compound represented by Chemical Formula 1 is represented by the following Chemical Formula 3:

[Chemical Formula 3]

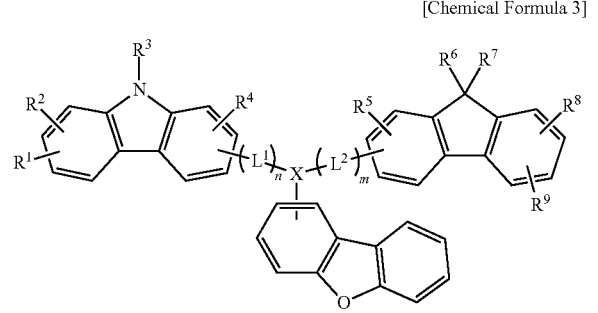

wherein, in Chemical Formula 3,

X is N or P,

L¹ and L² are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m each independently integers of 0 to about 3, and R¹ to R⁹ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

5. The compound for an organic optoelectronic device as claimed in claim 1, wherein the compound represented by Chemical Formula 1 is represented by the following Chemical Formula 4:

[Chemical Formula 4]

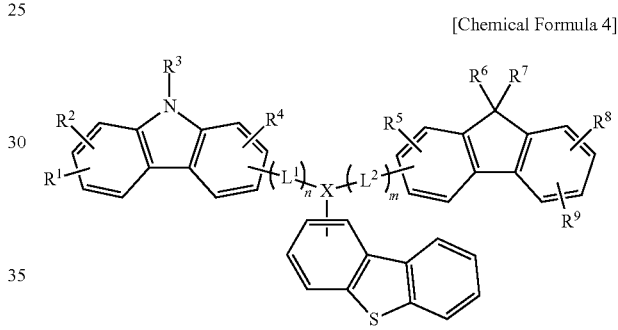

wherein, in Chemical Formula 4,

X is N or P,

L¹ and L² are each independently a single bond, a substituted or unsubstituted C2 to C10 alkenylene group, a substituted or unsubstituted C2 to C10 alkynylene group, a substituted or unsubstituted C6 to C30 arylene group, or a substituted or unsubstituted C2 to C30 heteroarylene group, n and m are each independently integers of 0 to about 3, and R¹ to R⁹ are each independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthiol group, a substituted or unsubstituted C6 to C20 arylthiol group, a substituted or unsubstituted C1 to C20 heterocyclothiol group, a substituted or unsubstituted C1 to C20 ureide group, a substituted or unsubstituted C3 to C40 silyl group, or a combination thereof.

6. The compound for an organic optoelectronic device as claimed in claim 1, wherein the compound represented by Chemical Formula 1 is represented by the following Chemical Formula A-2, A-4, A-6, A-8, A-11, A-13, A-15, A-17, A-20, A-22, A-24, A-26, A-29, A-31, A-33, A-35, A-38, A-40, A-42, A-44, A-47, A-49, A-51, A-53, A-57, A-59, A-62, A-64, A-69, A-71, A-72, A-74, A-79, A-81, A-82, A-84, A-89, A-91, A-92, or A-94

A-2
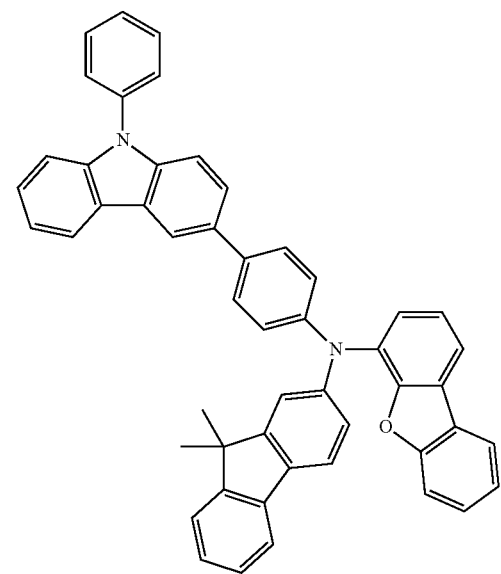

A-6
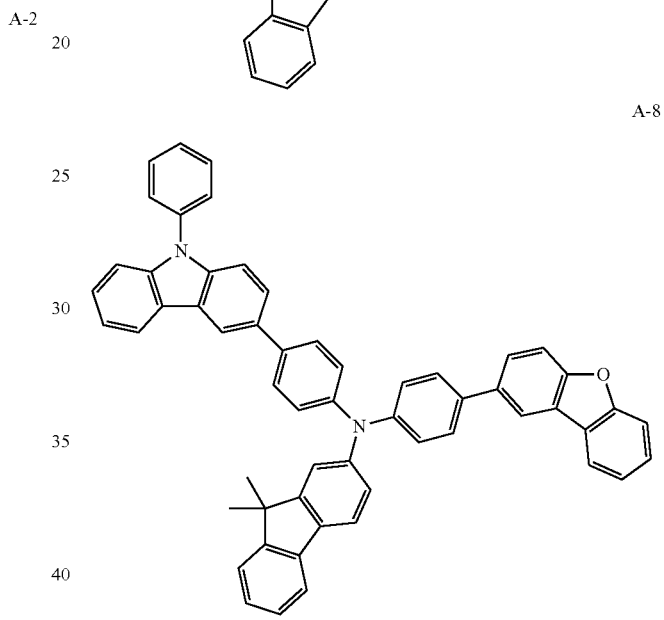

A-4
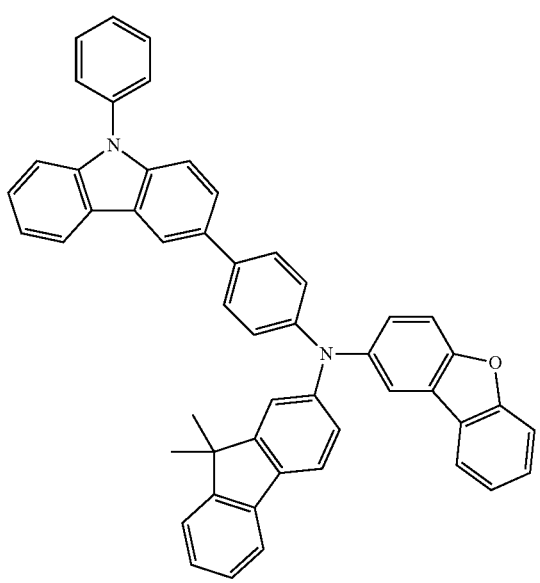

A-8

A-11
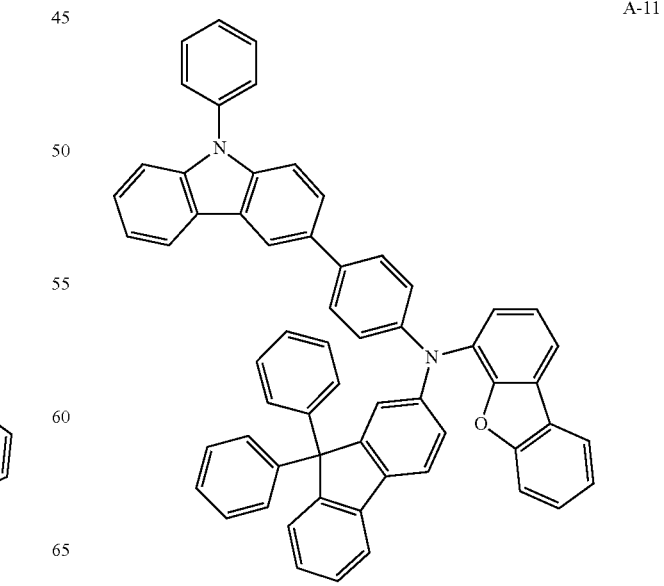

-continued
A-13
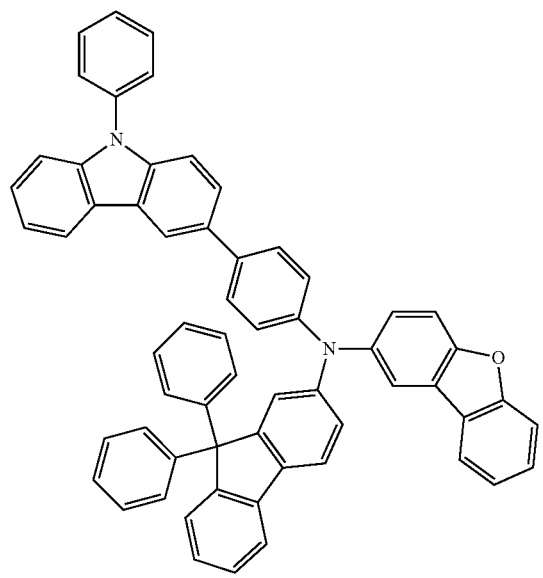
A-15
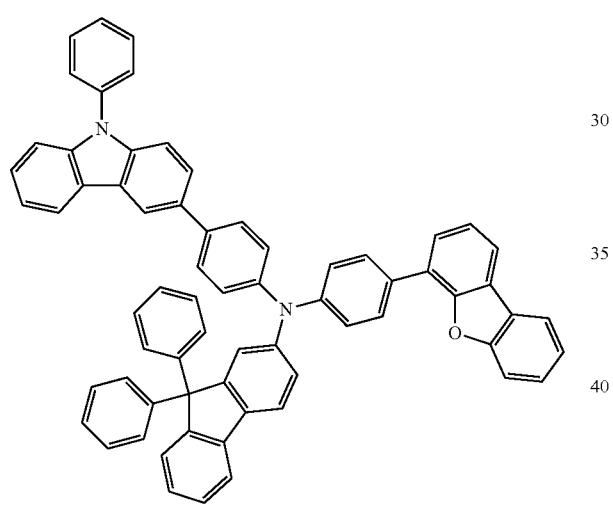
A-17
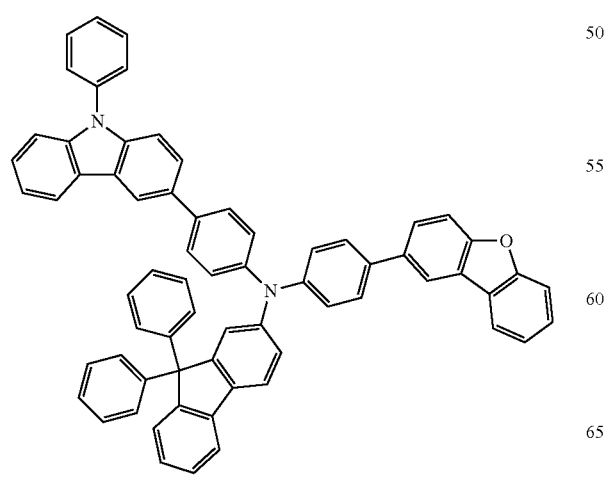
-continued
A-20
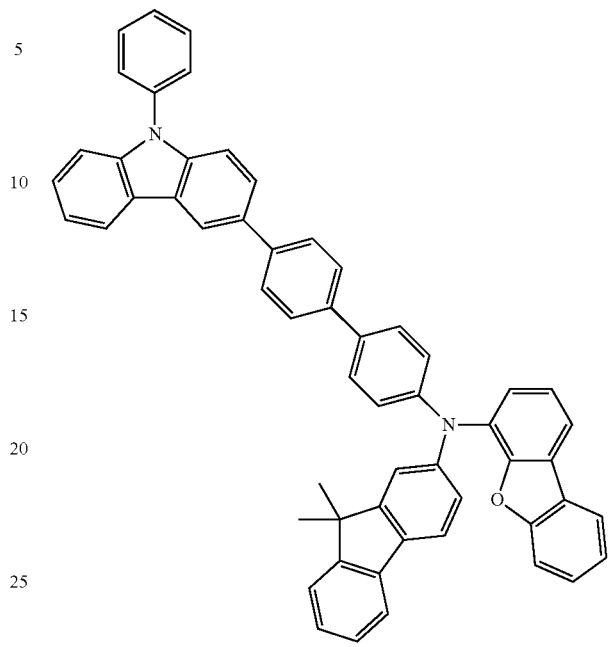
A-22
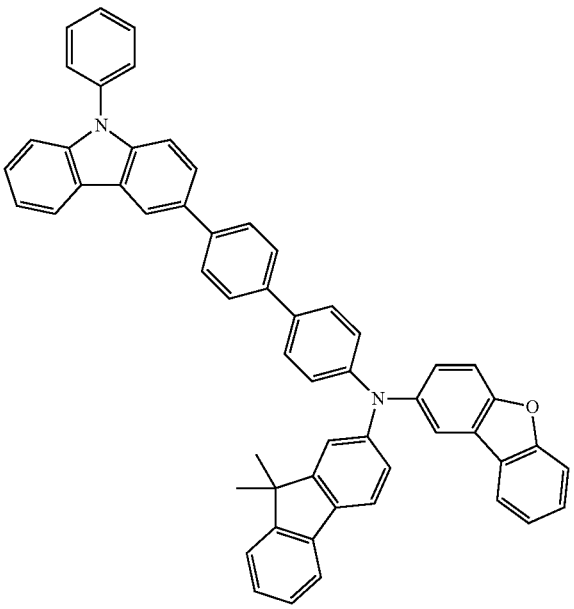

A-24
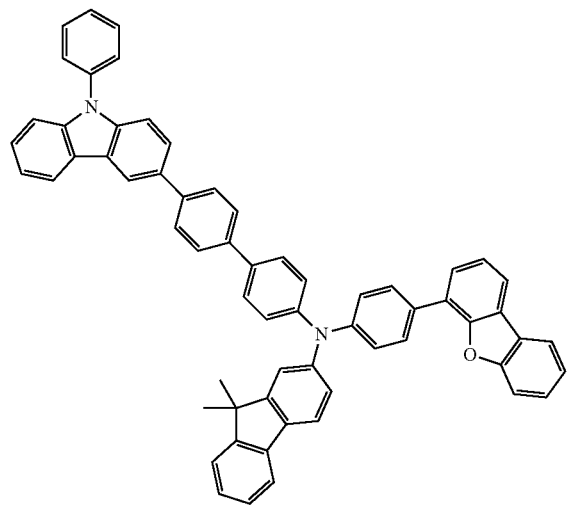
A-26
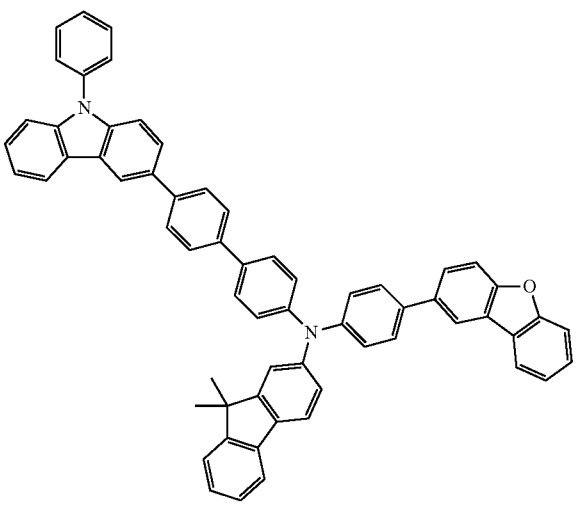
A-29
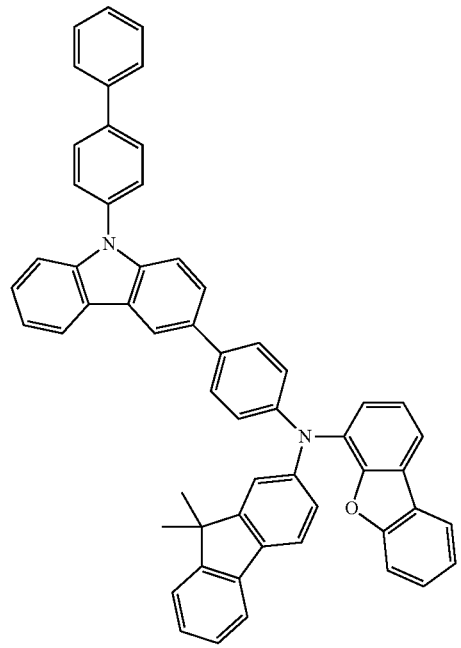
A-31
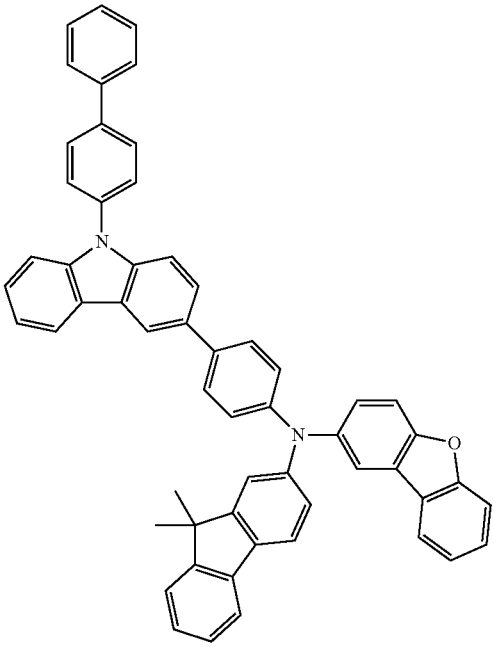
A-33
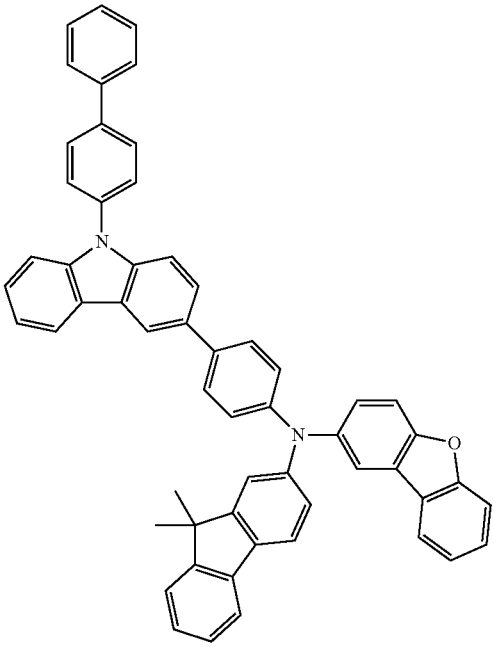

A-35
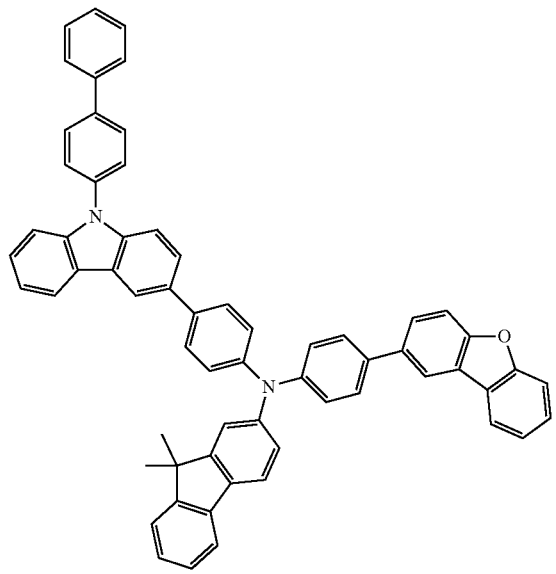
A-40
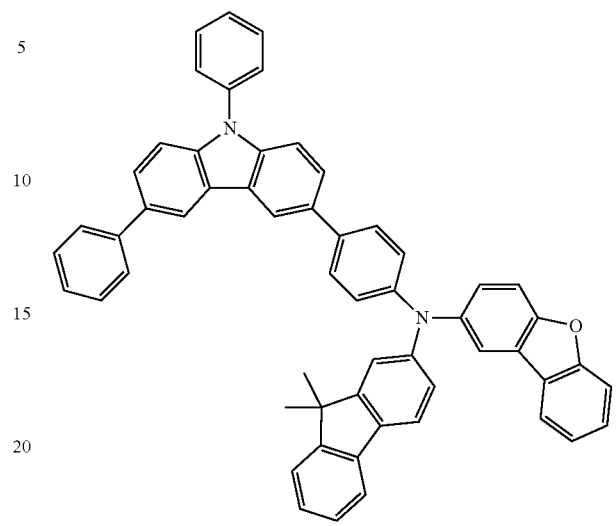
A-38
A-42
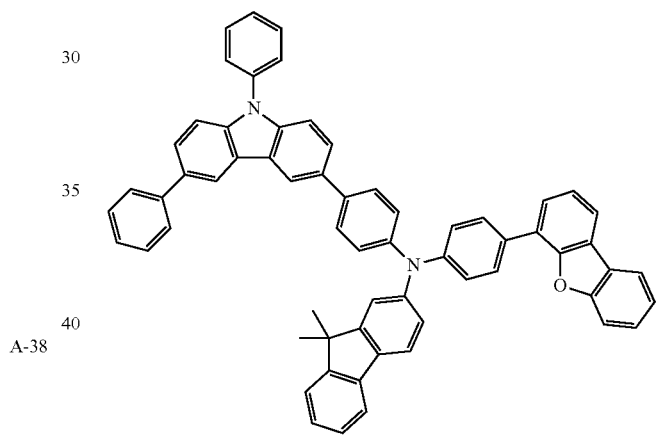
A-44
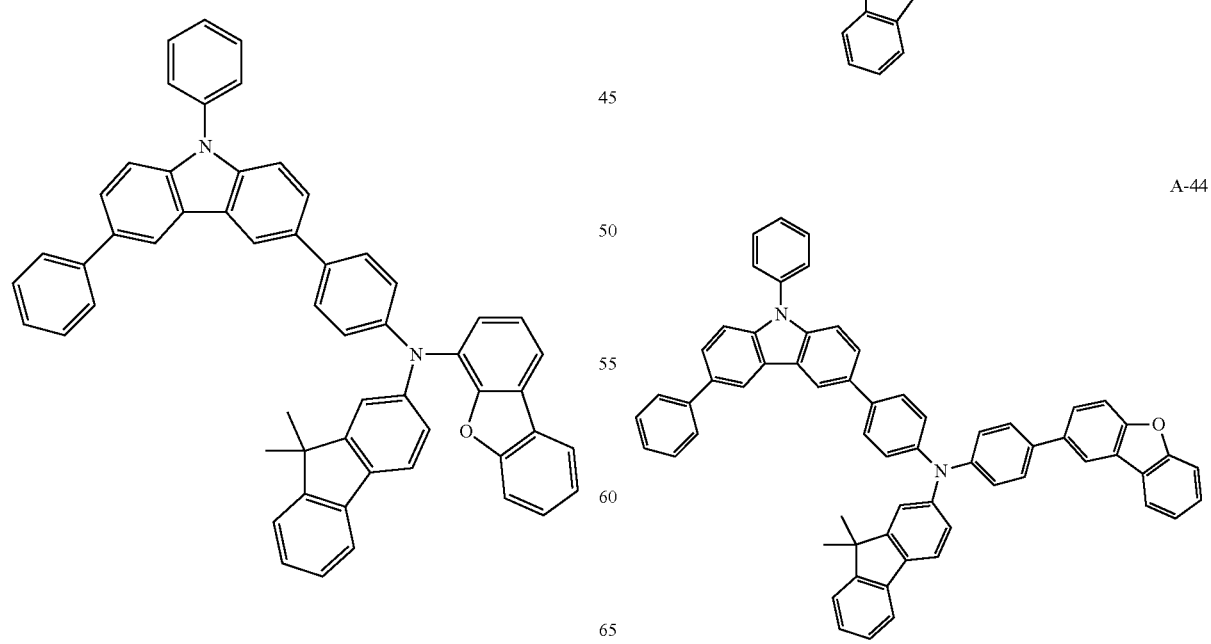

A-47
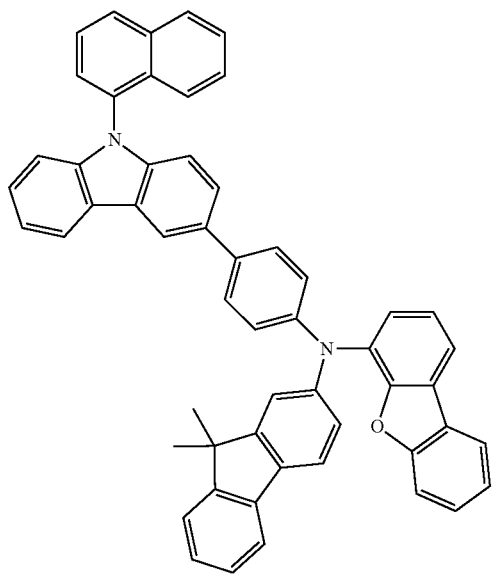
A-49
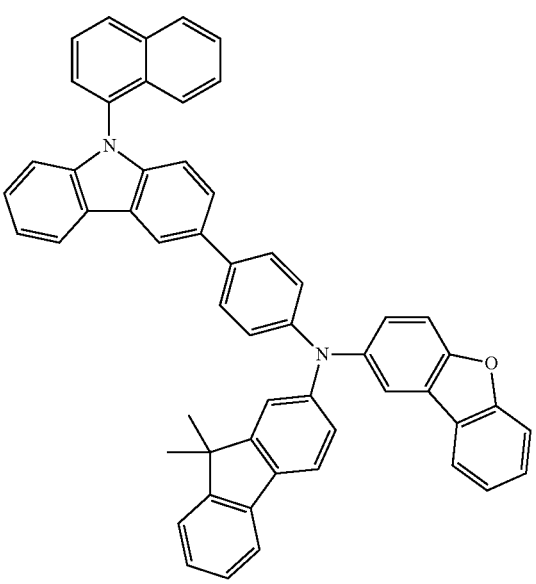
A-51
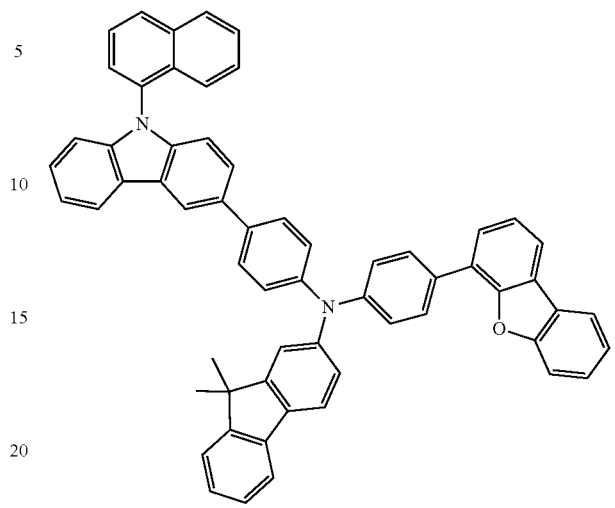
A-53
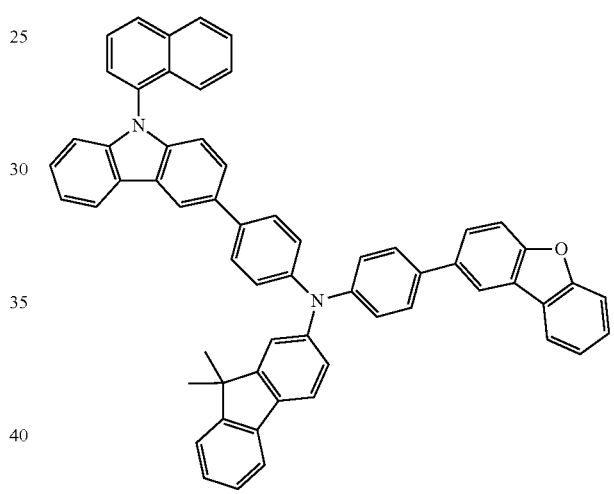
A-57
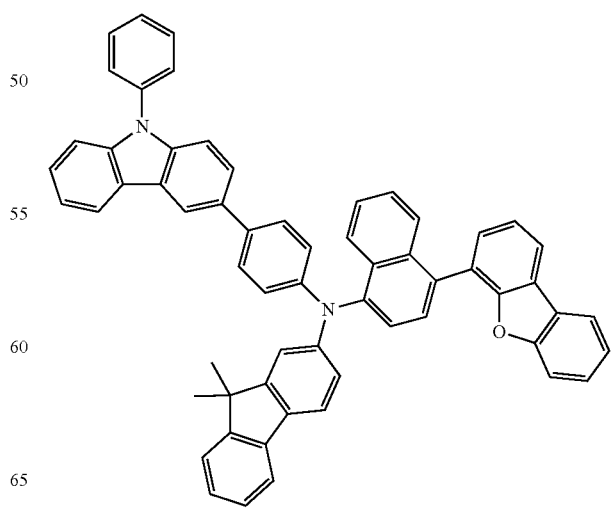

A-59
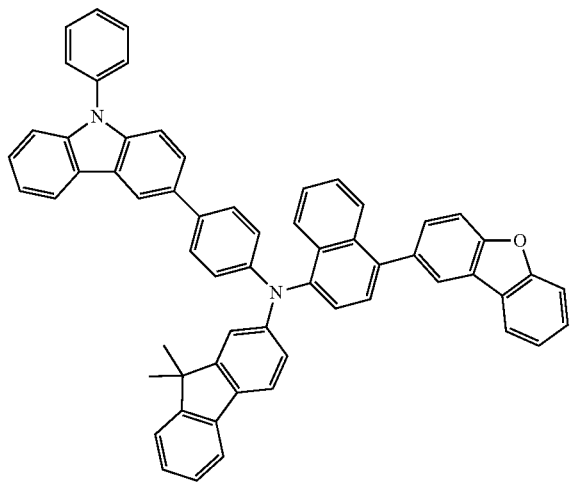
A-62
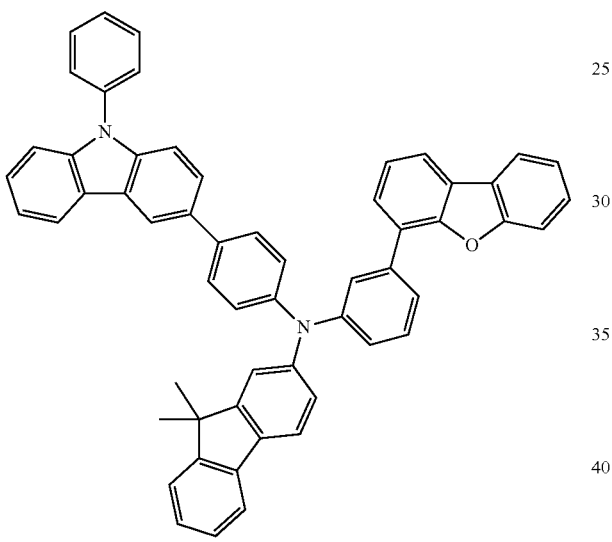
A-64
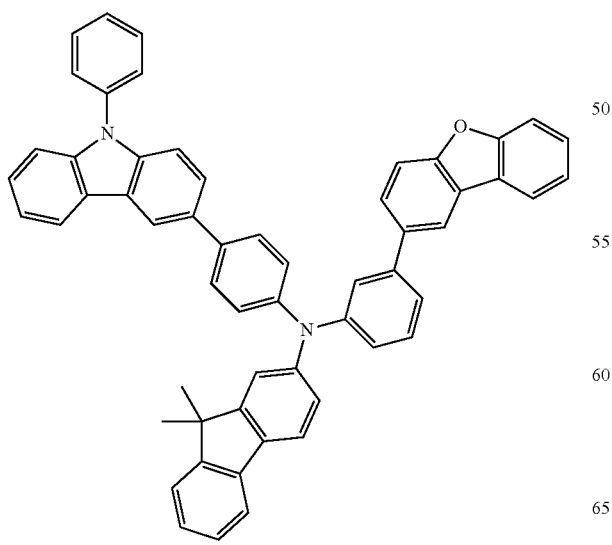
A-69
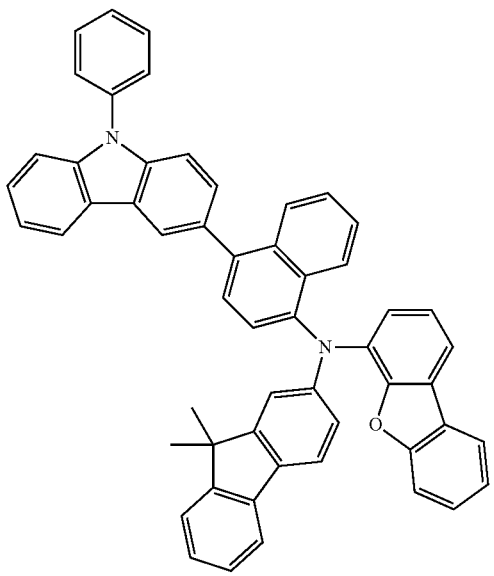
A-71
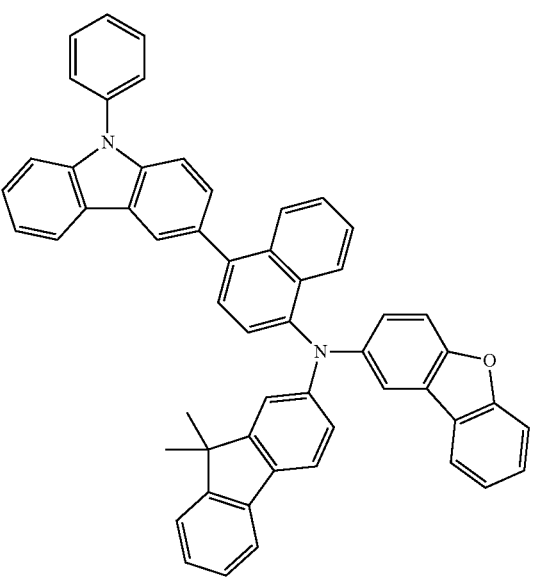

A-72
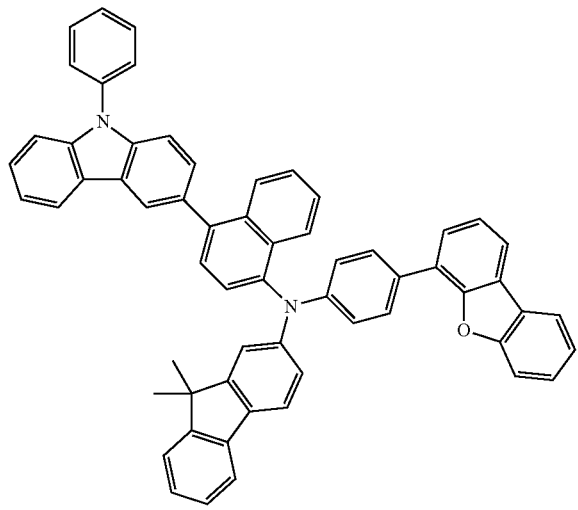
A-74
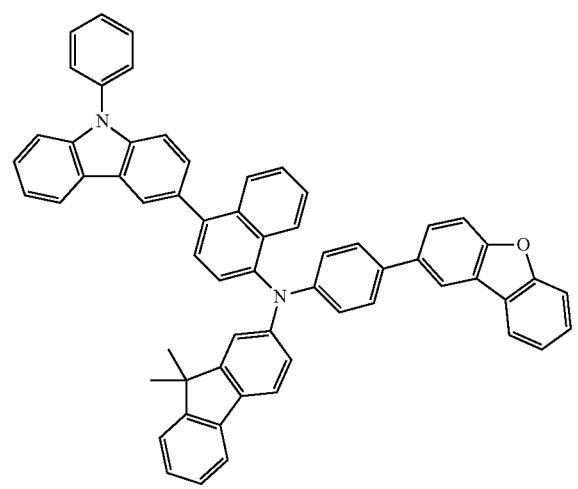
A-79
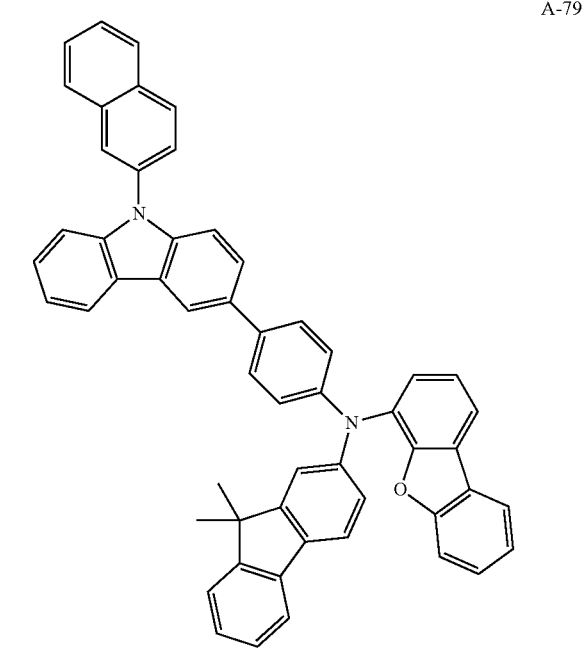
A-81
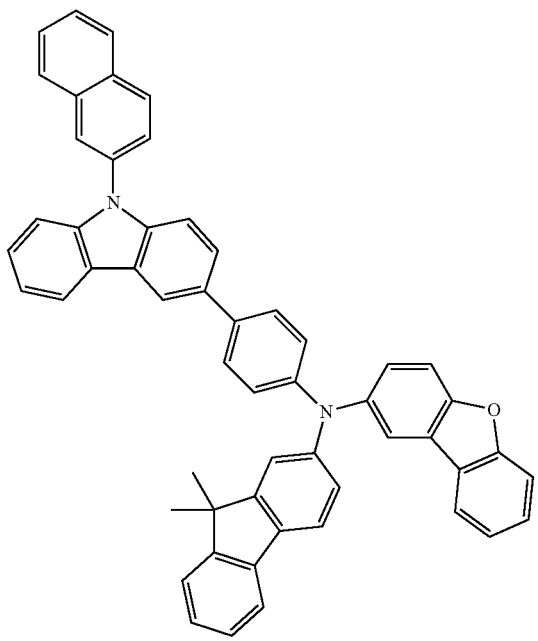
A-82
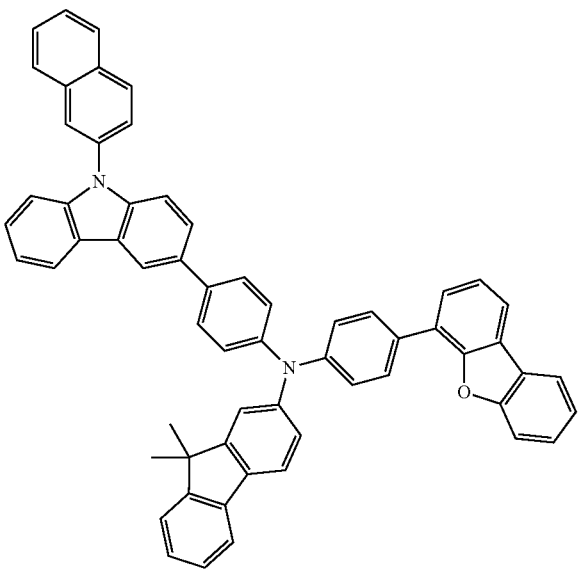

-continued
A-84
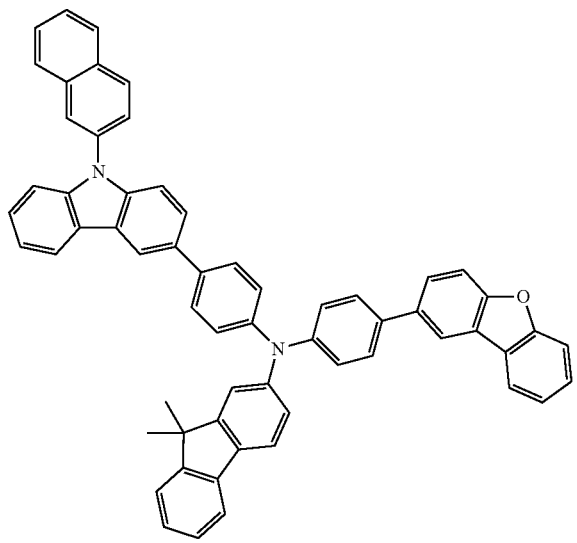
A-89
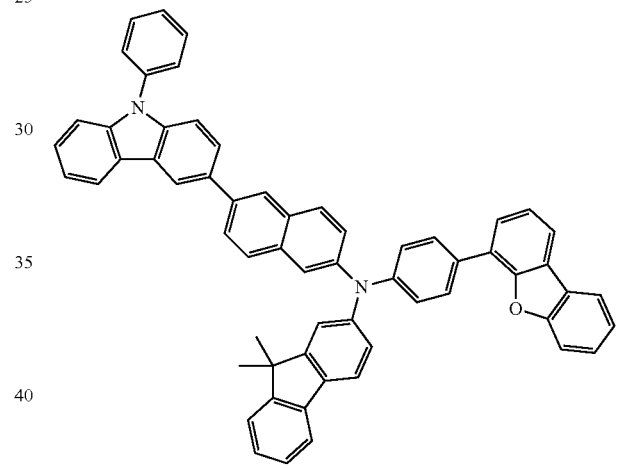
-continued
A-91
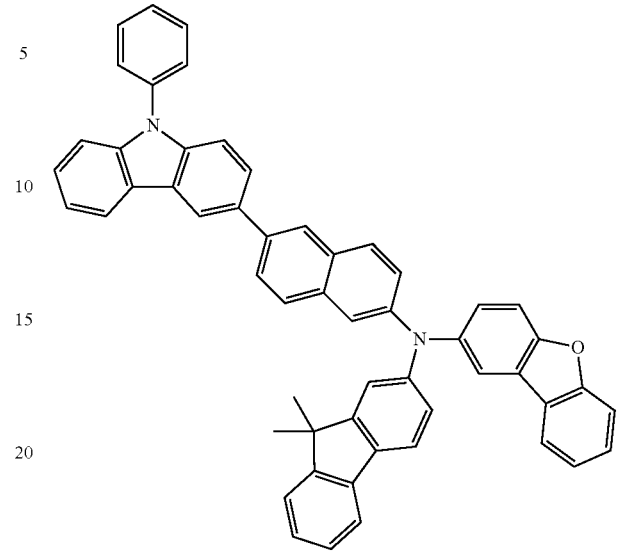
A-92
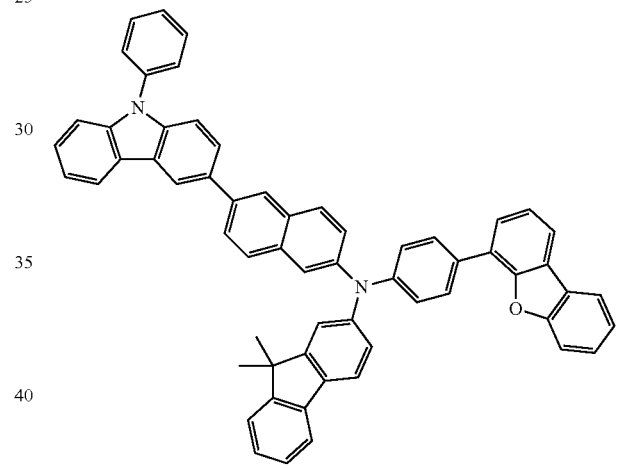
A-94
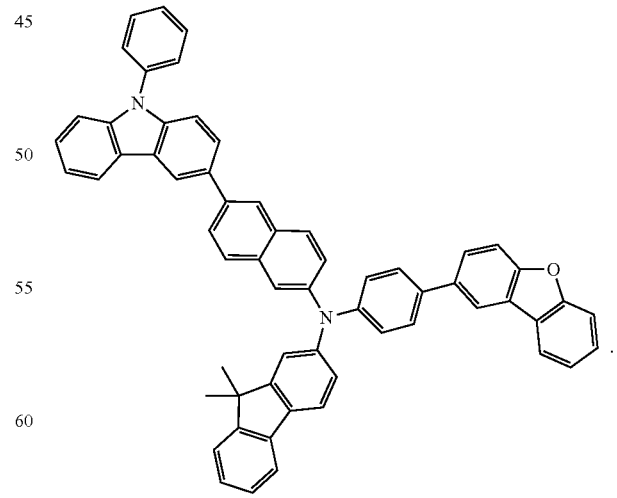
7. The compound for an organic optoelectronic device as claimed in claim 1, wherein the compound represented by Chemical Formula 1 is represented by the following Chemical Formula A-3, A-5, A-7, A-9, A-12, A-14, A-16, A-18, A-21, A-23, A-25, A-27, A-30, A-32, A-34, A-36, A-39, A-41, A-43, A-45, A-48, A-50, A-52, A-54, A-58, A-60, A-63, A-65, A-68, A-70, A-73, A-75, A-78, A-80, A-83, A-85, A-88, A-90, A-93, or A-95
A-3
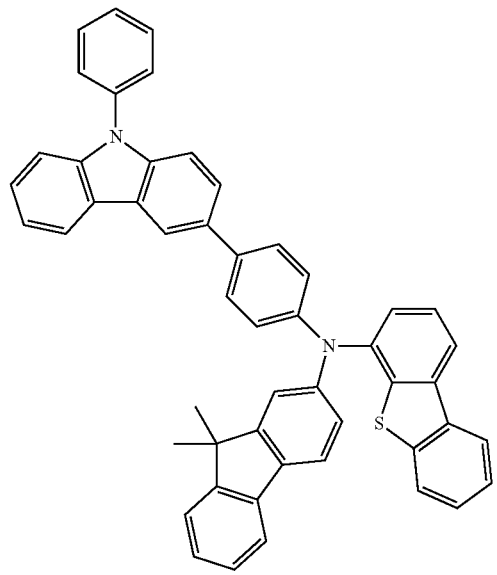
A-5
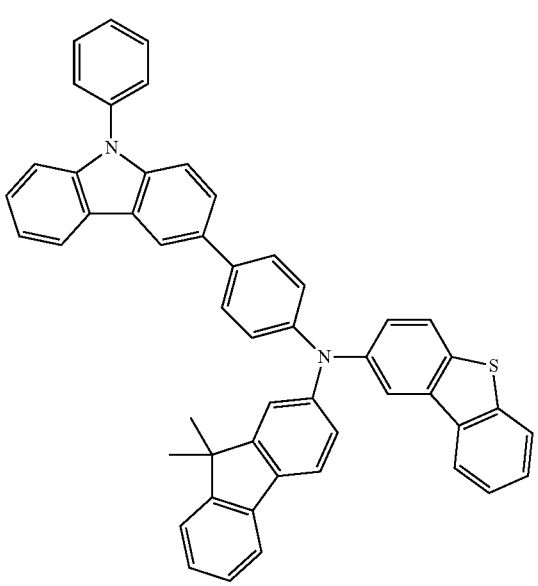
-continued
A-7
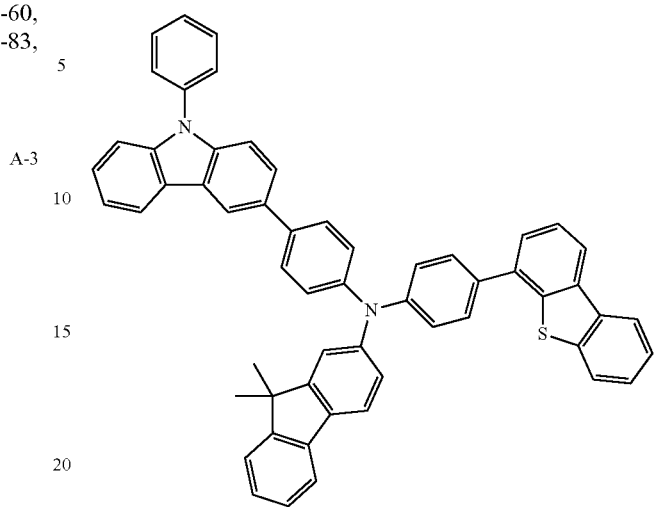
A-9
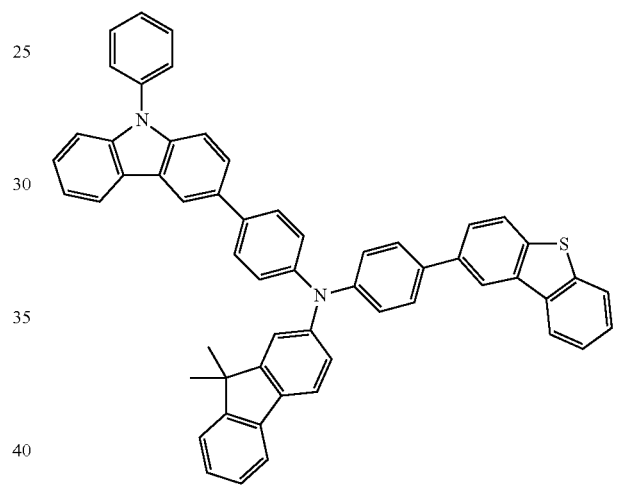
A-12
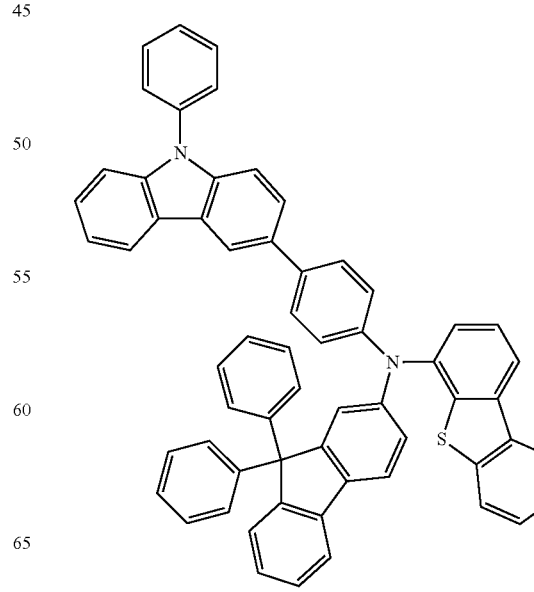

A-14
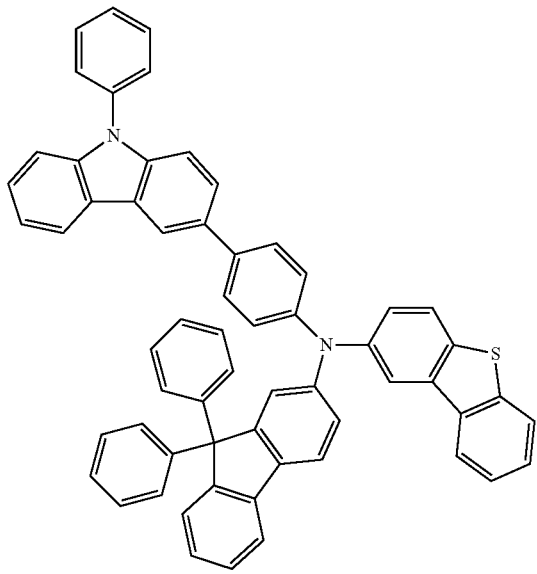
A-16
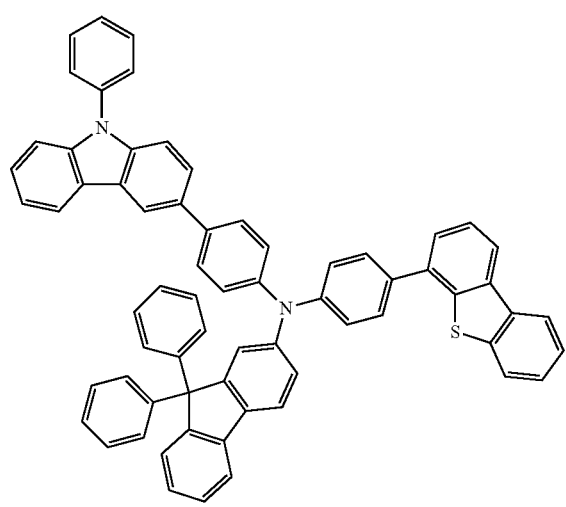
A-18
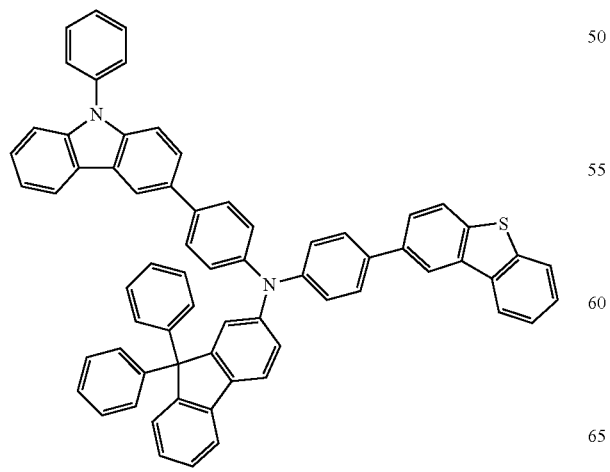
A-21
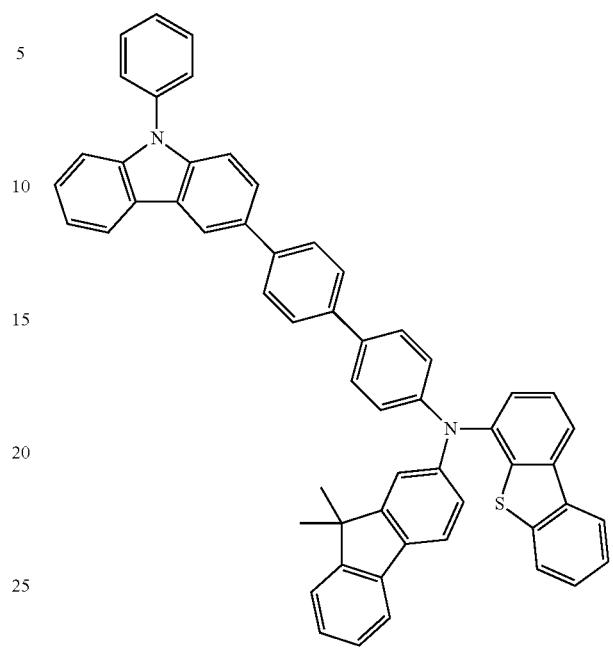
A-23
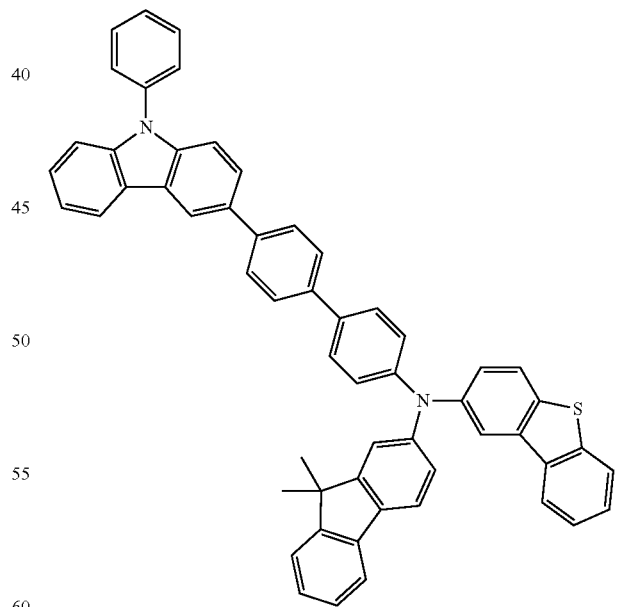

A-25
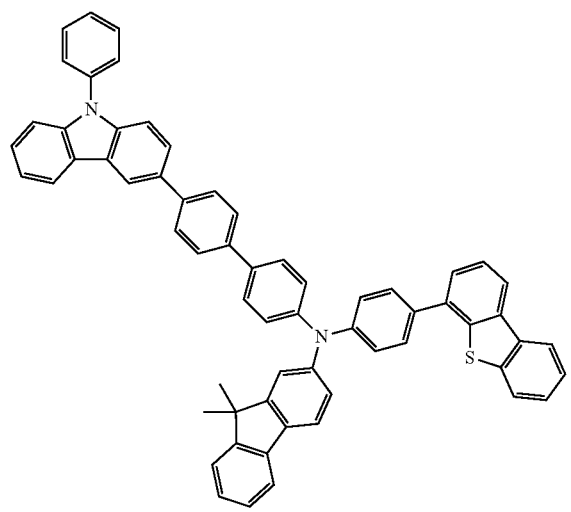
A-30
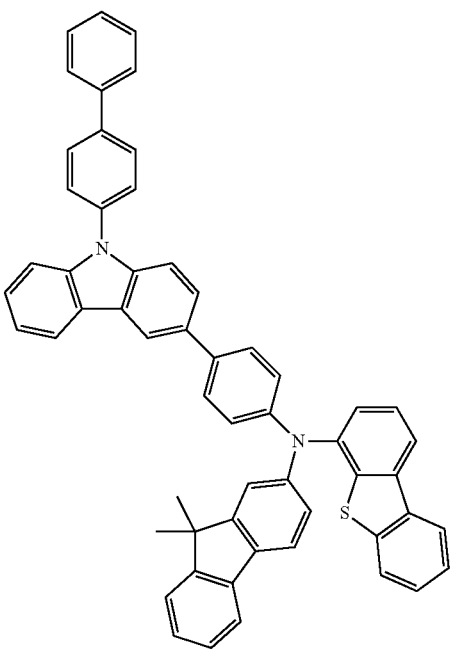
A-27
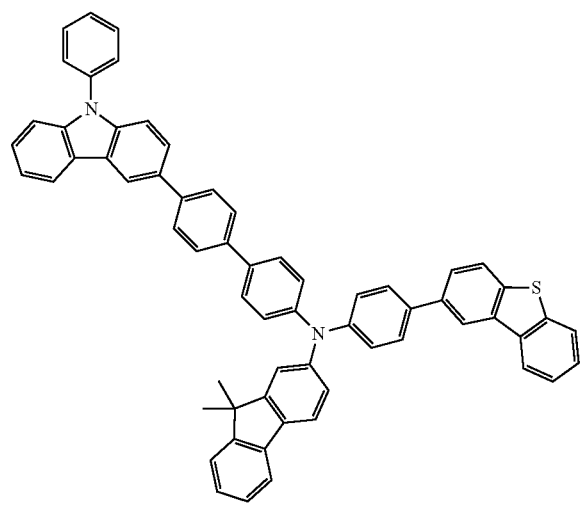
A-32
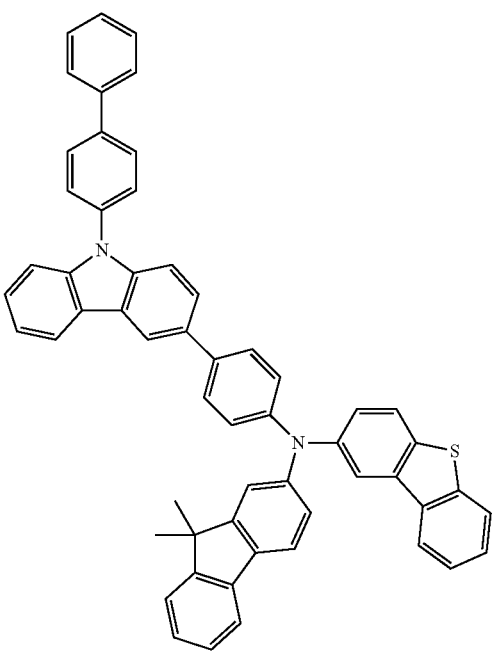

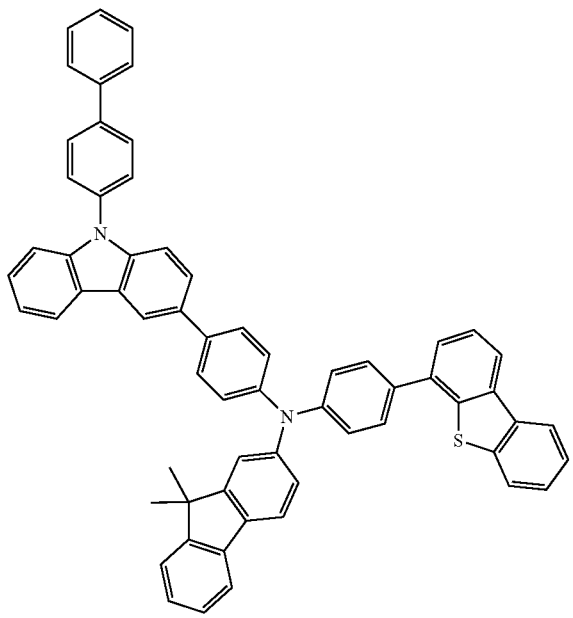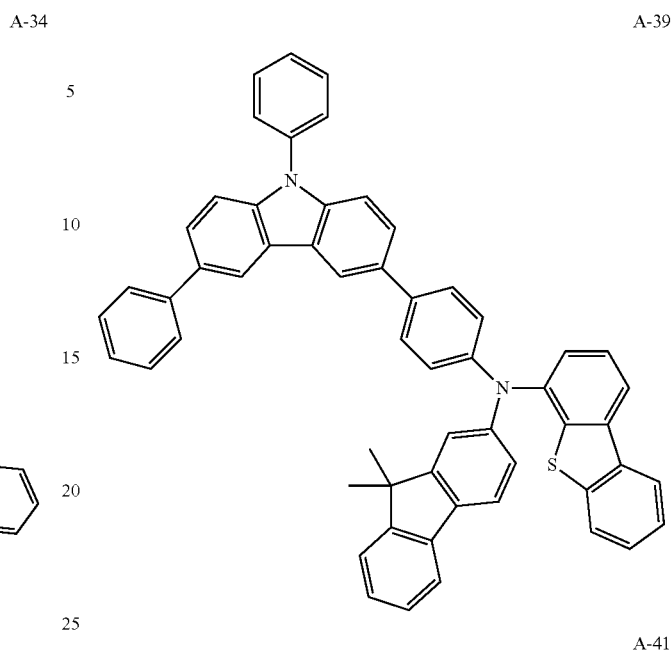

A-45
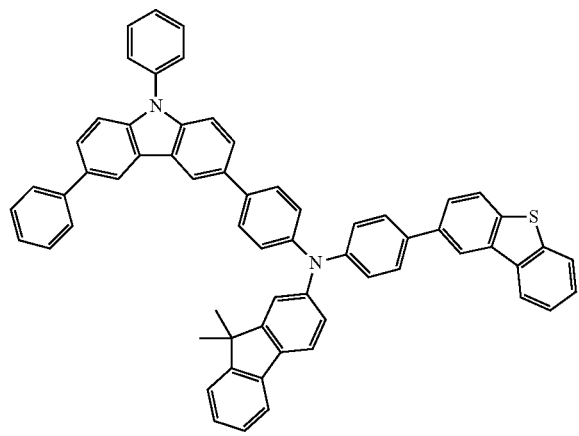
A-52
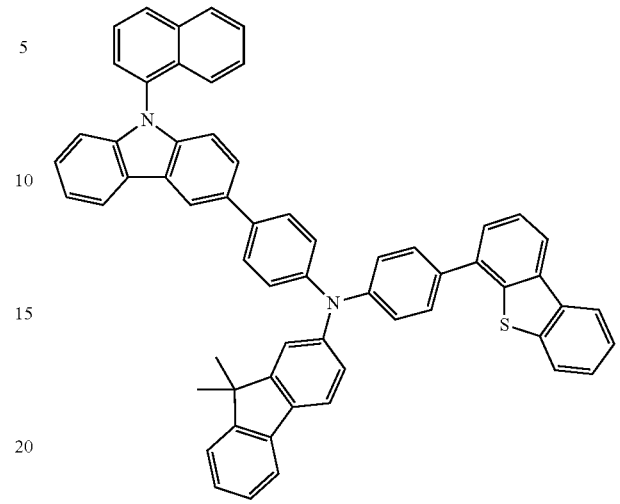
A-48
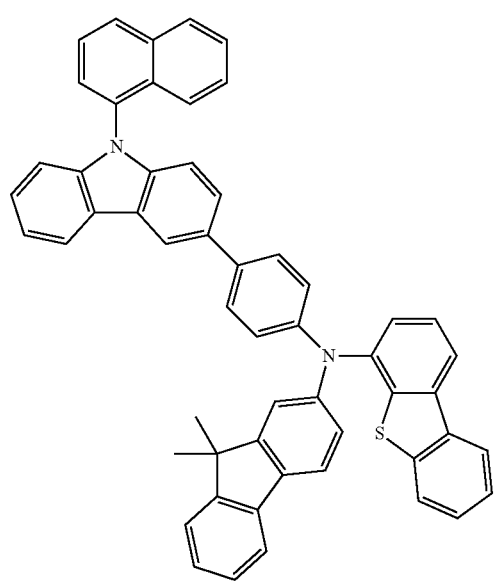
A-54
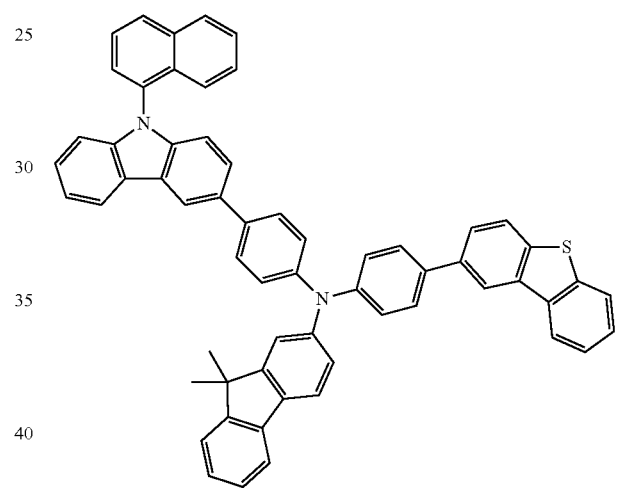
A-50
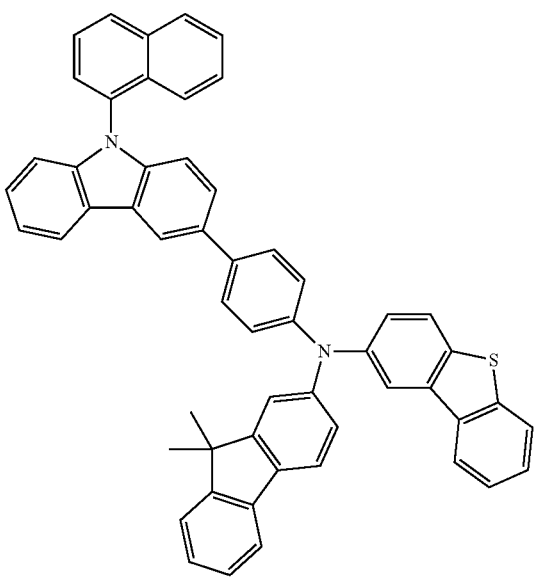
A-58
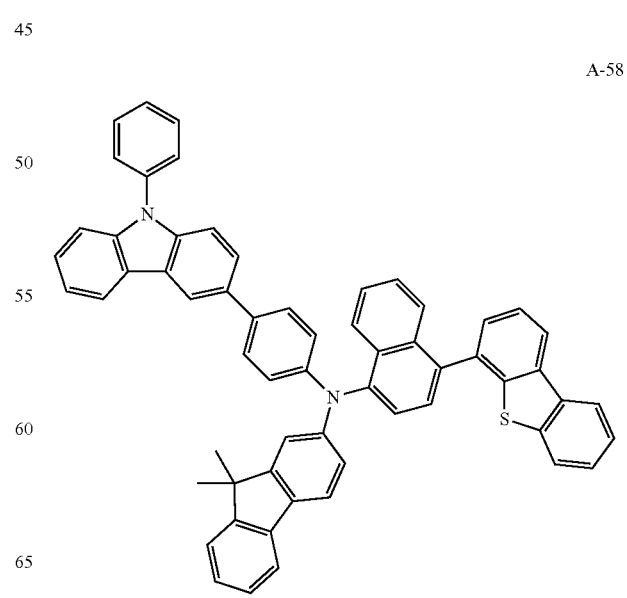

A-60
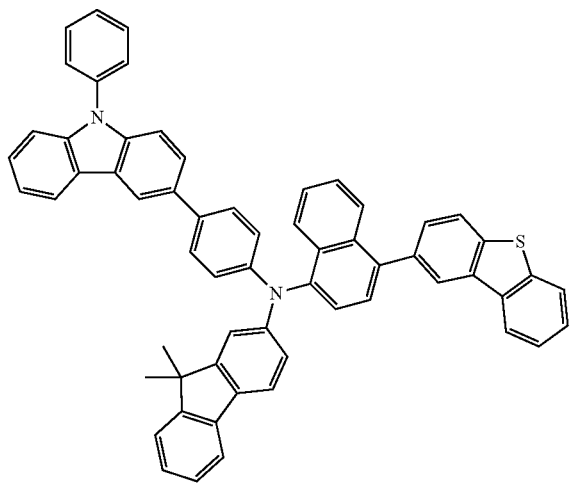
A-63
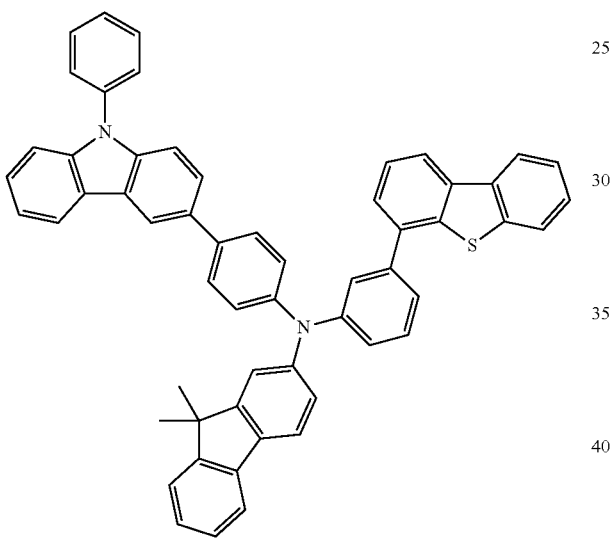
A-65
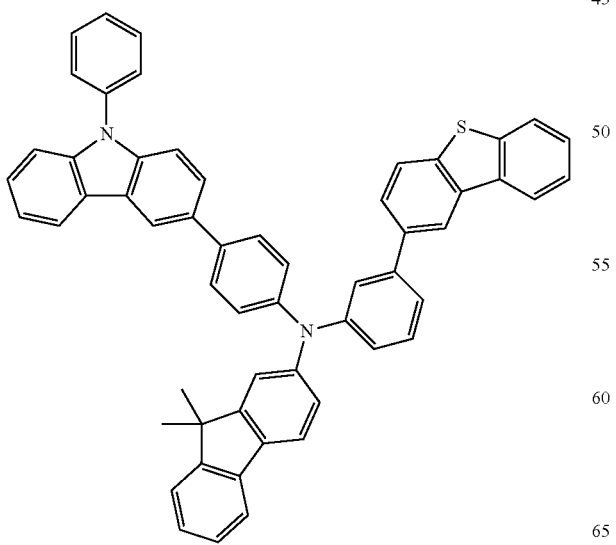
A-68
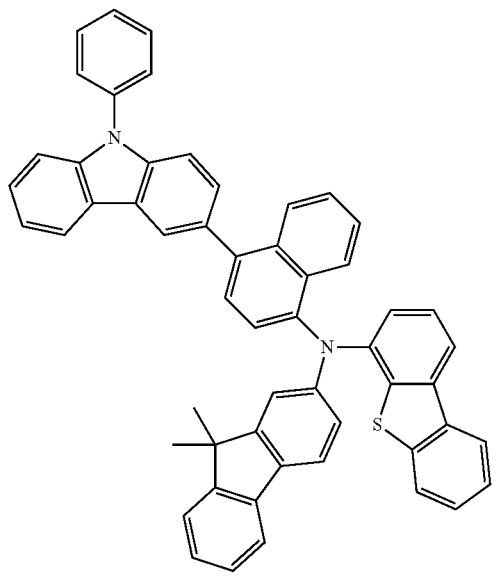
A-70
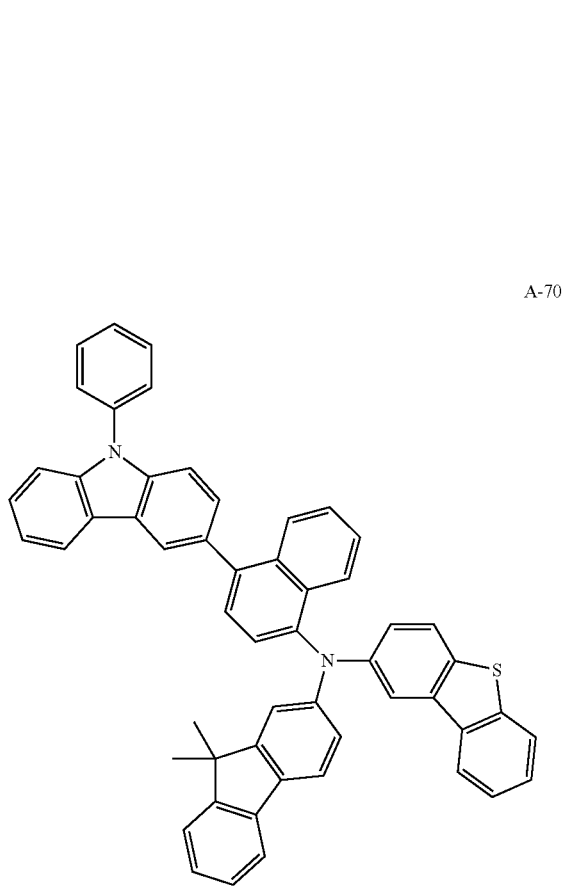

A-73
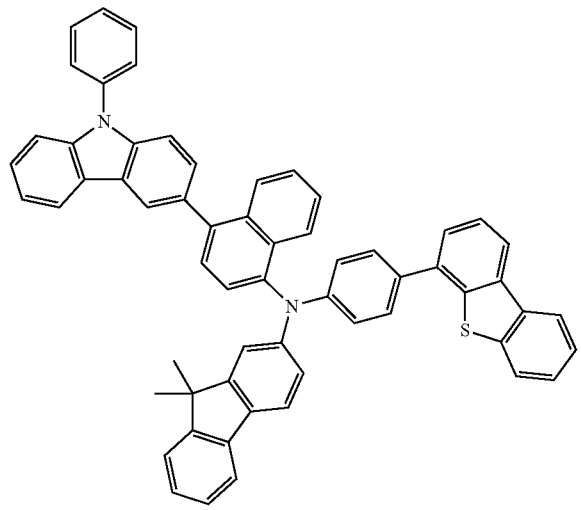
A-75
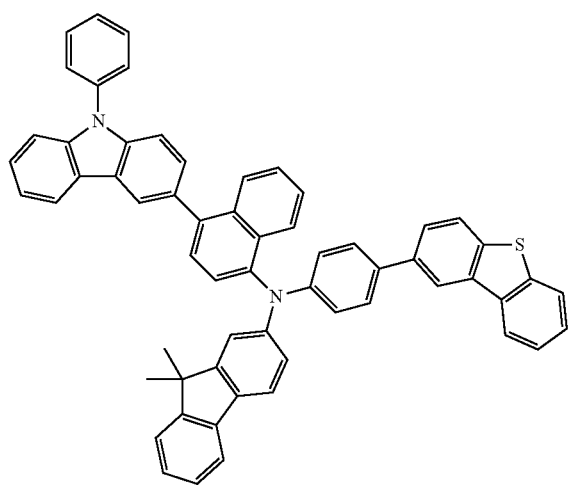
A-78
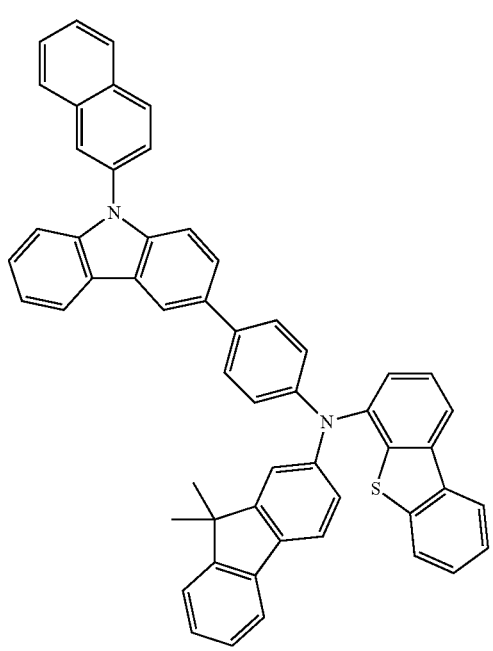
A-80
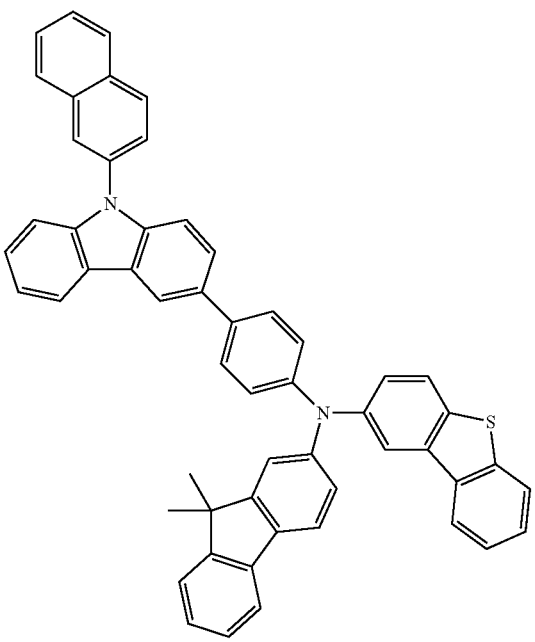
A-83
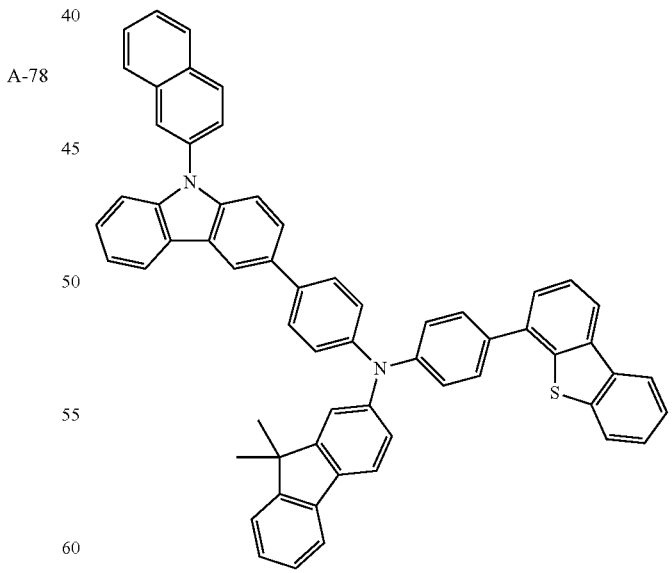

A-85
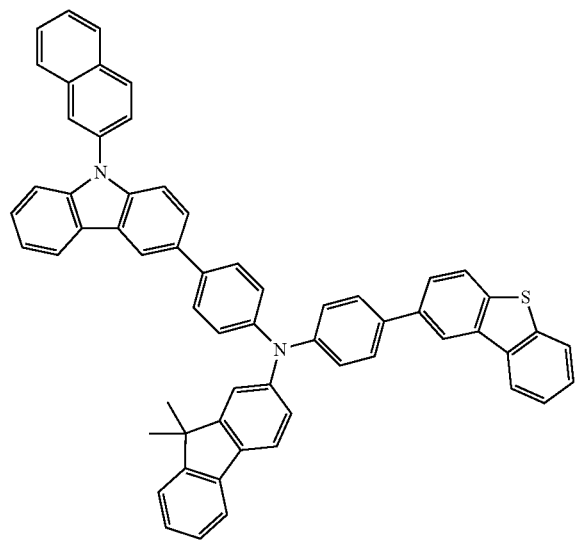
A-90
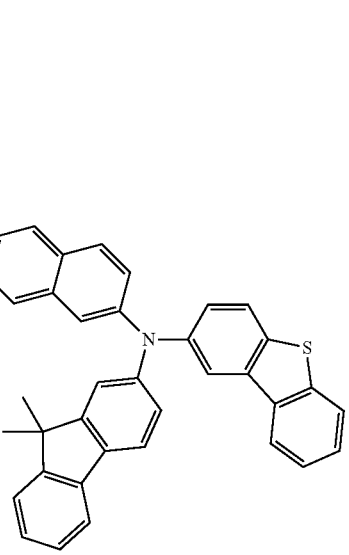
A-88
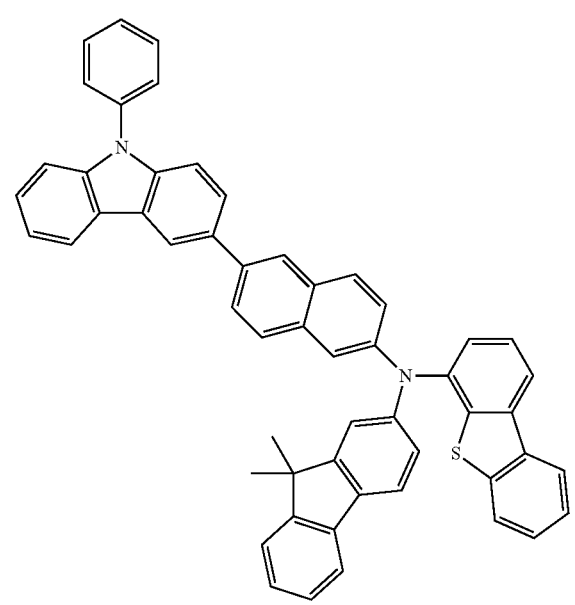
A-93
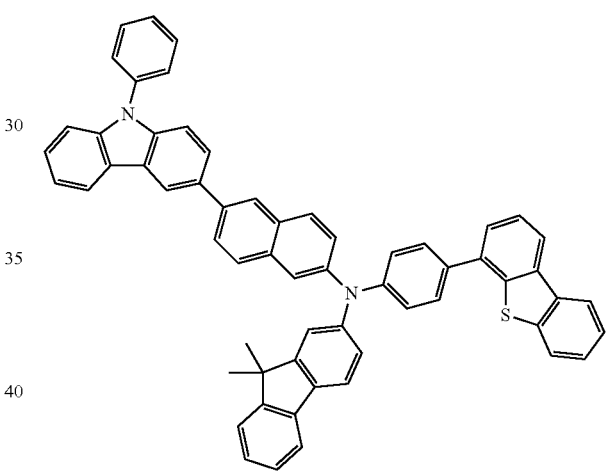
A-95
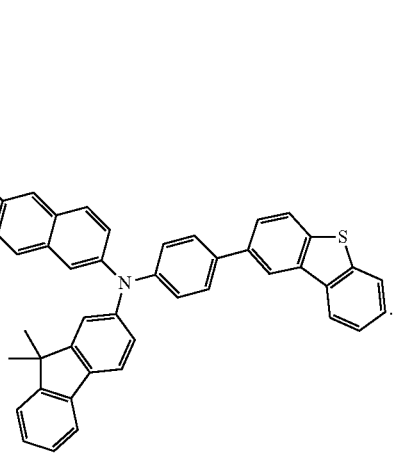
8. The compound for an organic optoelectronic device as claimed in claim 1, wherein the compound is a hole transport material or hole injection material of an organic light emitting diode.

9. The compound for an organic optoelectronic device as claimed in claim 1, wherein the compound has a triplet excitation energy (T1) of about 2.0 eV or greater.

10. The compound for an organic optoelectronic device as claimed in claim 1, wherein the organic optoelectronic device includes one selected from an organic photoelectronic device, an organic light emitting diode, an organic solar cell, an organic transistor, an organic photosensitive drum, and an organic memory device.

11. An organic light emitting diode, comprising:
an anode,
a cathode, and
at least one organic thin layer between the anode and cathode,
wherein the at least one organic thin layer includes the compound for an organic optoelectronic device as claimed in claim 1.

12. The organic light emitting diode as claimed in claim 11, wherein the at least one organic thin layer is selected from an emission layer, a hole transport layer (HTL), a hole injection layer (HIL), an electron transport layer (ETL), an electron injection layer (EIL), a hole blocking layer, and a combination thereof.

13. The organic light emitting diode as claimed in claim 11, wherein the at least one organic thin layer includes a hole transport layer (HTL) or a hole injection layer (HIL), and the compound for an organic optoelectronic device is included in the hole transport layer (HTL) or the hole injection layer (HIL).

14. The organic light emitting diode as claimed in claim 11, wherein the at least one organic thin layer includes an emission layer, and the compound for an organic optoelectronic device is included in the emission layer.

15. The organic light emitting diode as claimed in claim 11, wherein the at least one organic thin layer includes an emission layer, and the compound for an organic optoelectronic device is a phosphorescent host material or fluorescent host material in the emission layer.

16. A display device comprising the organic light emitting diode as claimed in claim 11.

* * * * *